(12) United States Patent
Song et al.

(10) Patent No.: US 12,520,529 B2
(45) Date of Patent: Jan. 6, 2026

(54) SEMICONDUCTOR DEVICE AND METHOD OF FABRICATING THE SAME

(71) Applicant: Samsung Electronics Co., Ltd., Suwon-si (KR)

(72) Inventors: Seunghyun Song, Suwon-si (KR); Pilkwang Kim, Seoul (KR); Joohyung You, Seoul (KR); Sungmin Kim, Incheon (KR); Yonghee Park, Hwaseong-si (KR); Young-Seok Song, Hwaseong-si (KR); Takeshi Okagaki, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 561 days.

(21) Appl. No.: 17/987,126

(22) Filed: Nov. 15, 2022

(65) Prior Publication Data

US 2023/0261079 A1     Aug. 17, 2023

(30) Foreign Application Priority Data

Feb. 15, 2022    (KR) ........................ 10-2022-0019539

(51) Int. Cl.
    *H01L 29/423*      (2006.01)
    *H01L 29/08*       (2006.01)
    (Continued)

(52) U.S. Cl.
    CPC ..... *H10D 30/6735* (2025.01); *H10D 30/6757* (2025.01); *H10D 62/151* (2025.01); *H10D 64/021* (2025.01)

(58) Field of Classification Search
CPC .... H10D 30/014; H10D 30/024; H10D 30/62; H10D 30/6211; H10D 30/6212;
(Continued)

(56) References Cited

U.S. PATENT DOCUMENTS 9,947,804 B1    4/2018   Frougier et al.
10,032,867 B1   7/2018   Yeung et al.
(Continued)

FOREIGN PATENT DOCUMENTS

CN      111952371 A    11/2020
CN      111987160 A    11/2020

*Primary Examiner* — David C Spalla
(74) *Attorney, Agent, or Firm* — Fish & Richardson P.C.

(57) ABSTRACT

Disclosed are semiconductor devices and fabrication methods thereof. The semiconductor device includes a substrate including first and second regions, a device isolation pattern in the substrate, a lower separation dielectric pattern on the first region of the substrate, first channel patterns on the lower separation dielectric pattern, a first gate electrode on the first channel patterns and including a first gate part between the lower separation dielectric pattern and a lowermost first channel pattern, and first source/drain patterns on opposite sides of the first gate electrode and in contact with lateral surfaces of the first channel patterns. A bottom surface of the lower separation dielectric pattern is at a level higher than or equal to that of a bottom surface of the device isolation pattern. A top end of the lower separation dielectric pattern is at a level higher than that of a bottom surface of the first gate part.

18 Claims, 58 Drawing Sheets

(51) Int. Cl.
*H01L 29/66* (2006.01)
*H01L 29/786* (2006.01)
*H10D 30/67* (2025.01)
*H10D 62/13* (2025.01)
*H10D 64/01* (2025.01)

(58) Field of Classification Search
CPC .......... H10D 30/6213; H10D 30/6735; H10D 30/6757; H10D 30/792; H10D 62/115; H10D 62/118; H10D 62/119; H10D 62/121; H10D 62/151; H10D 64/015; H10D 64/018; H10D 64/021; H10D 84/0158; H10D 84/0193; H10D 84/834; H10D 84/853
See application file for complete search history.

(56) References Cited

U.S. PATENT DOCUMENTS

| | | | |
|---|---|---|---|
| 10,103,238 B1* | 10/2018 | Zang | H10D 64/017 |
| 10,263,100 B1 | 4/2019 | Bi et al. | |
| 10,297,664 B2 | 5/2019 | Xie | |
| 10,833,191 B2 | 11/2020 | Frougier et al. | |
| 10,840,329 B1 | 11/2020 | Xie et al. | |
| 11,088,288 B2 | 8/2021 | Xie et al. | |
| 11,101,166 B2 | 8/2021 | Suk et al. | |
| 11,456,182 B1* | 9/2022 | Lin | H10D 64/254 |
| 2017/0162453 A1 | 6/2017 | Pillarisetty et al. | |
| 2020/0006151 A1 | 1/2020 | Kao et al. | |
| 2020/0044087 A1 | 2/2020 | Guha et al. | |
| 2020/0051869 A1 | 2/2020 | Chiang et al. | |
| 2020/0052131 A1 | 2/2020 | Chen et al. | |
| 2020/0083219 A1* | 3/2020 | Kang | B82Y 10/00 |
| 2020/0303500 A1* | 9/2020 | Loubet | H01L 21/02532 |
| 2020/0365692 A1 | 11/2020 | Jung et al. | |
| 2020/0373391 A1 | 11/2020 | Yi et al. | |
| 2021/0036119 A1* | 2/2021 | Cheng | H10D 64/017 |
| 2021/0134721 A1 | 5/2021 | Chiang et al. | |
| 2021/0193797 A1 | 6/2021 | Xie et al. | |
| 2021/0210489 A1* | 7/2021 | Zhang | H10D 84/0188 |
| 2021/0217654 A1* | 7/2021 | Xie | H10D 62/118 |
| 2021/0226034 A1 | 7/2021 | Xie et al. | |
| 2021/0249506 A1 | 8/2021 | Yeh et al. | |
| 2021/0305420 A1 | 9/2021 | Frougier et al. | |
| 2021/0305430 A1 | 9/2021 | Guler et al. | |
| 2022/0336453 A1* | 10/2022 | Ju | H01L 21/76224 |
| 2023/0143041 A1* | 5/2023 | Xie | H10D 84/038 257/365 |

* cited by examiner

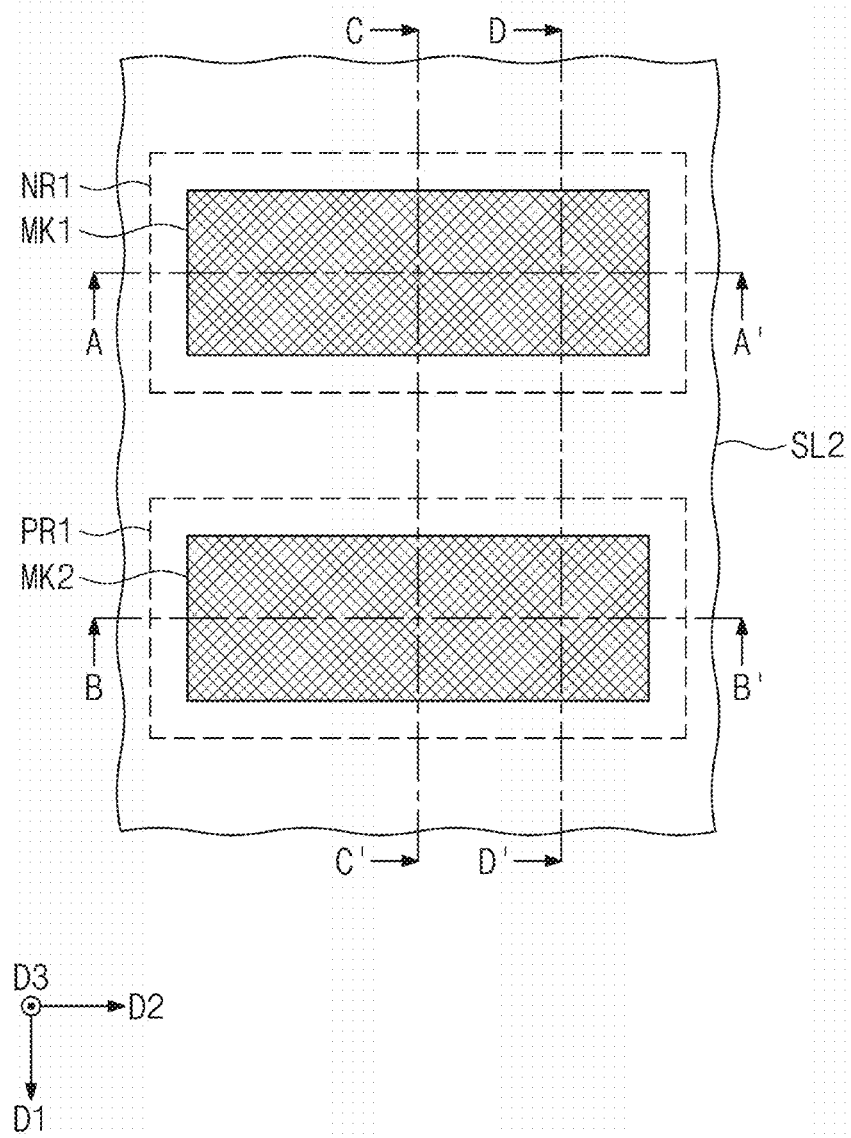

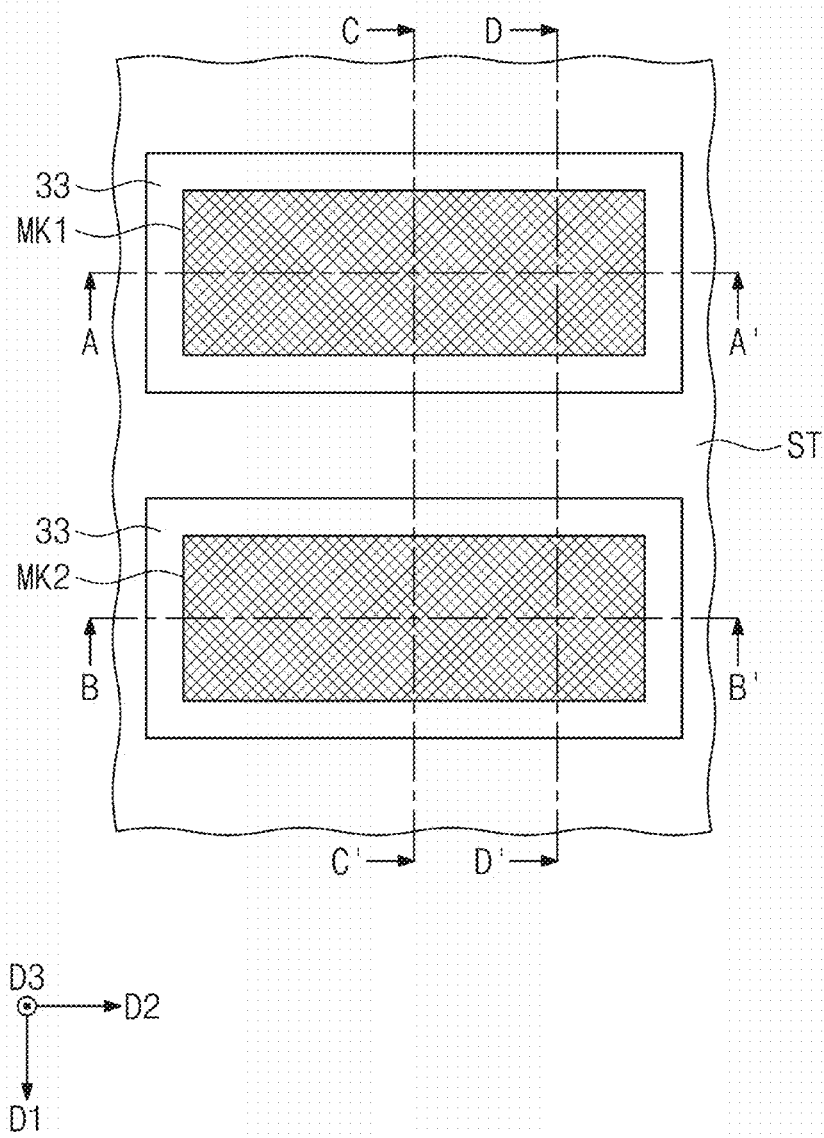

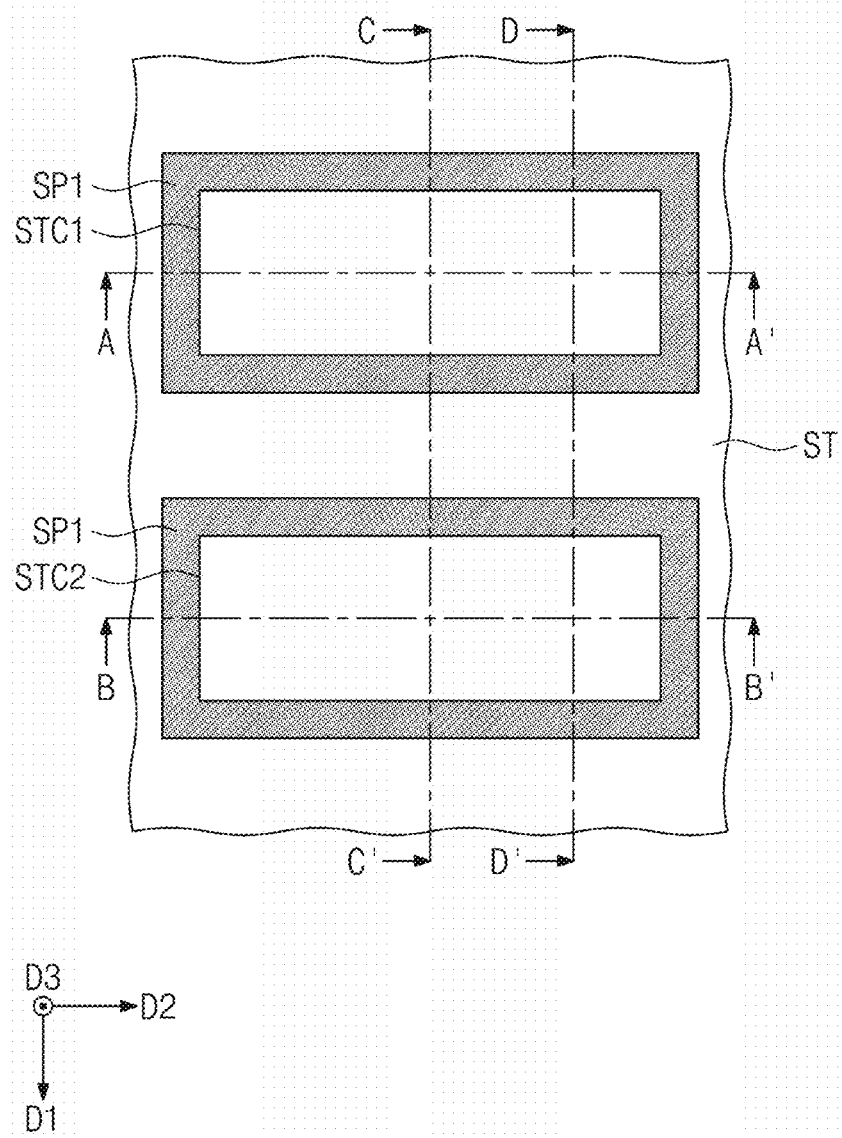

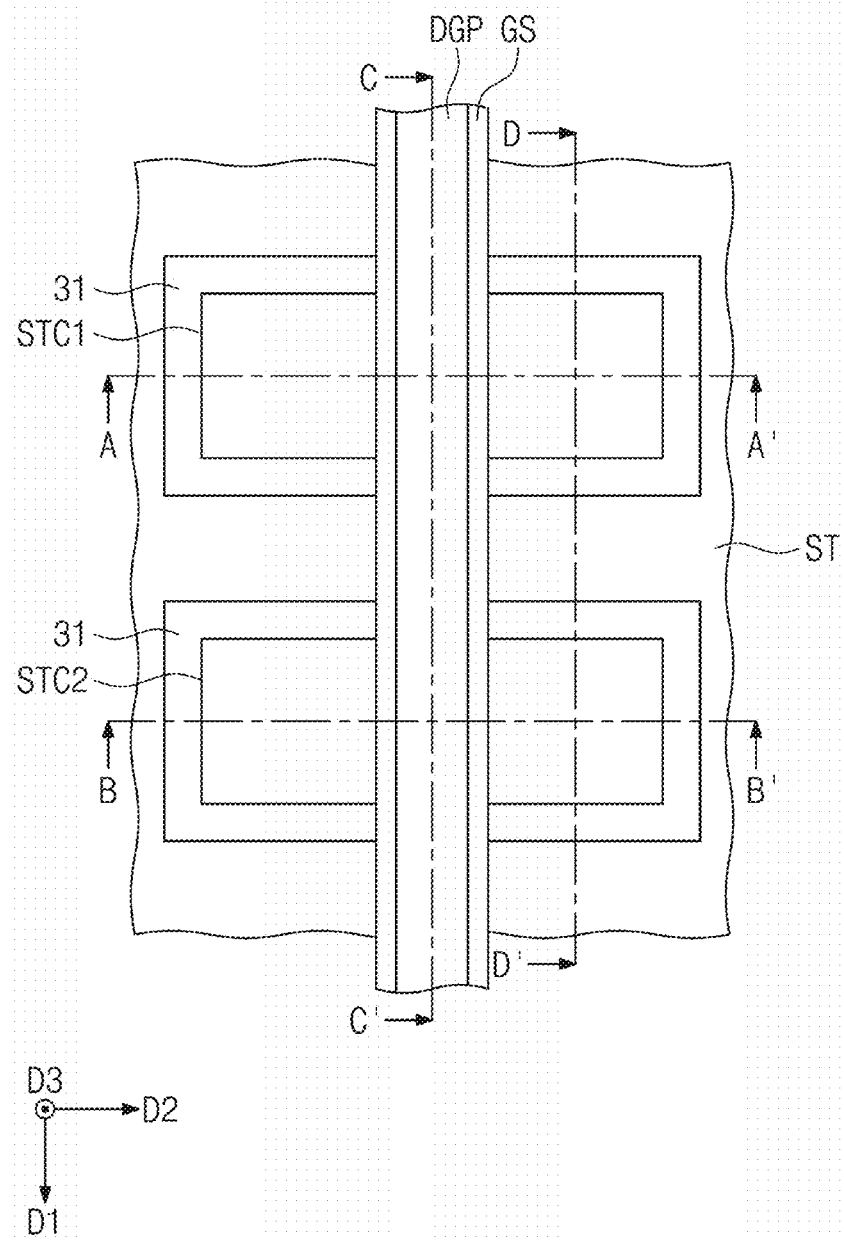

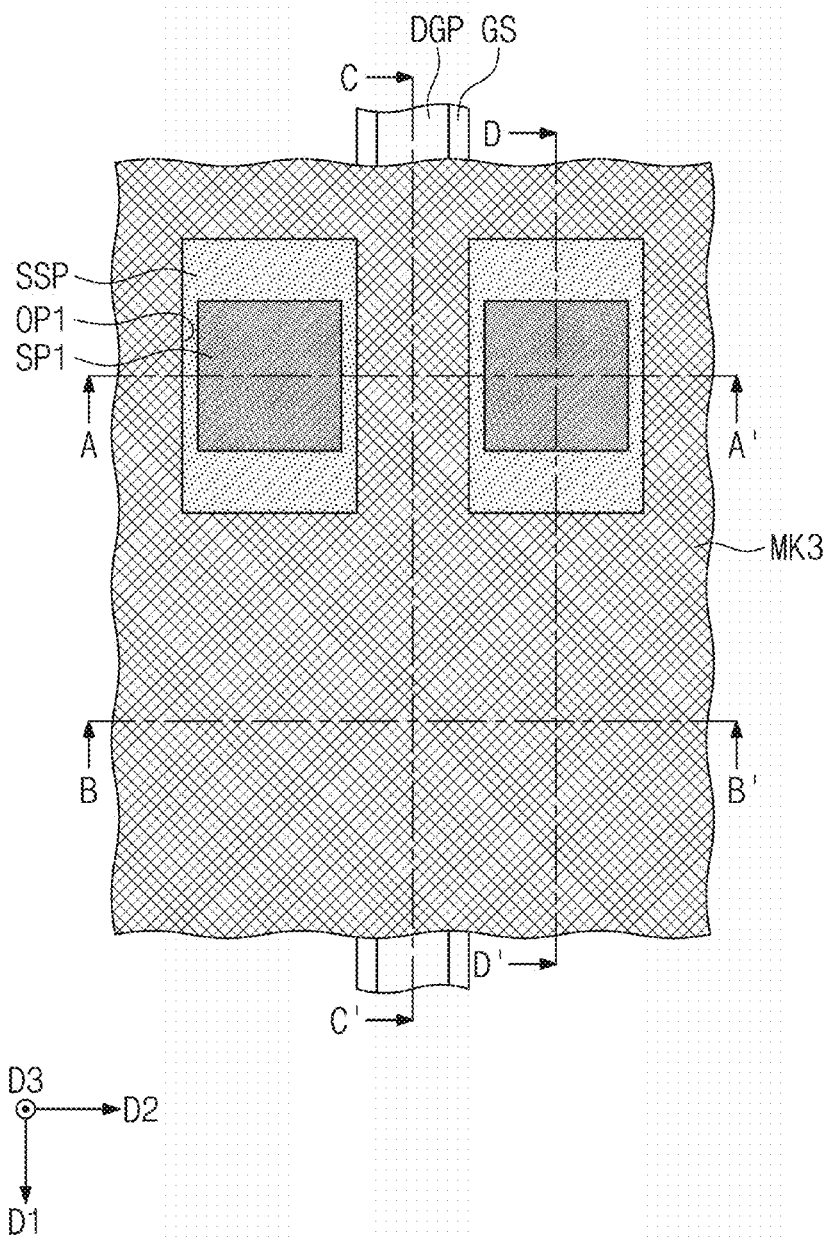

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0019539 filed on Feb. 15, 2022 in the Korean Intellectual Property Office, the disclosure of which is hereby incorporated by reference in its entirety.

BACKGROUND

The present inventive concepts relate to semiconductor devices and/or methods of fabricating the same, and more particularly, to semiconductor devices including a field effect transistor and/or methods of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having comparable or improved performances while overcoming limitations caused by high integration of the semiconductor devices.

SUMMARY

Some example embodiments of the present inventive concepts provide a semiconductor devices having improved reliability and increased electrical properties.

Some example embodiments of the present inventive concepts provide a method for fabricating a semiconductor device capable of increasing a manufacturing yield.

According to some example embodiments of the present inventive concepts, a semiconductor device may include a substrate including a first region and a second region, a device isolation pattern in the substrate, the device isolation pattern defining the first region and the second region, a lower separation dielectric pattern on the first region of the substrate, a plurality of first channel patterns stacked on the lower separation dielectric pattern, a first gate electrode on the first channel patterns, the first gate electrode including a first gate part between the lower separation dielectric pattern and a lowermost one of the first channel patterns, and a plurality of first source/drain patterns on opposite sides of the first gate electrode and in contact with lateral surfaces of the first channel patterns. A bottom surface of the lower separation dielectric pattern may be at a level higher than or equal to a level of a bottom surface of the device isolation pattern. A top end of the lower separation dielectric pattern may be at a level higher than a level of a bottom surface of the first gate part.

According to some example embodiments of the present inventive concepts, a semiconductor device may include a substrate including a first region and a second region, a device isolation pattern in the substrate, the device isolation pattern defining the first region and the second region, a lower separation dielectric pattern on the first region of the substrate and in contact with the device isolation pattern, a first semiconductor pattern on the second region of the substrate and in contact with the device isolation pattern, the first semiconductor pattern including a material different from a material of the substrate, a plurality of first channel patterns stacked on the lower separation dielectric pattern, a plurality of second channel patterns stacked on the first semiconductor pattern, a first gate electrode on the first channel patterns, a portion of the first gate electrode being between the first channel patterns, a second gate electrode on the second channel patterns, a portion of the second gate electrode being between the second channel patterns, a plurality of first source/drain patterns on opposite sides of the first gate electrode and in contact with lateral surfaces of the first channel patterns, and a plurality of second source/drain patterns on opposite sides of the second gate electrode and in contact with lateral surfaces of the second channel patterns. A bottom surface of the lower separation dielectric pattern may be at a level the same as or higher than a level of a bottom surface of the device isolation pattern and the same as or lower than a level of a bottom surface of the first semiconductor pattern.

According to some example embodiments of the present inventive concepts, a semiconductor device may include a substrate including an NMOS region and a PMOS region, a device isolation pattern in the substrate, the device isolation pattern defining the NMOS region and the PMOS region, a lower separation dielectric pattern on the NMOS region of the substrate and in contact with the device isolation pattern, a silicon-germanium pattern on the PMOS region of the substrate and in contact with the device isolation pattern, the silicon-germanium pattern including a material different from a material of the substrate, a plurality of first channel patterns stacked on the lower separation dielectric pattern, a plurality of second channel patterns stacked on the silicon-germanium pattern, a first gate electrode on the first channel patterns, a portion of the first gate electrode being between the first channel patterns, a second gate electrode on the second channel patterns, a portion of the second gate electrode being between the second channel patterns, a plurality of first source/drain patterns on opposite sides of the first gate electrode and in contact with lateral surfaces of the first channel patterns, and a plurality of second source/drain patterns on opposite sides of the second gate electrode and in contact with lateral surfaces of the second channel patterns. The first source/drain patterns may be spaced apart from the substrate across the lower separation dielectric pattern. The lower separation dielectric pattern may include a first dielectric part in contact with the device isolation pattern, and a second dielectric part on the first dielectric part and spaced apart from the device isolation pattern. A thickness of the first dielectric part may be the same as or greater than a thickness of the silicon-germanium pattern.

According to some example embodiments of the present inventive concepts, a method of fabricating a semiconductor device may include forming a first semiconductor layer on a substrate, the substrate including a first region and a second region that are spaced apart from each other in a first direction, alternately stacking a plurality of second semiconductor layers and a plurality of sacrificial layers on the first semiconductor layer, etching the second semiconductor layers and the sacrificial layers to form a first stack structure and a second stack structure on the first region and the second region, respectively, and to expose the first semiconductor layer between the first and second stack structures, forming a plurality of first spacers that correspondingly cover sidewalls of the first and second stack structures and partially expose the first semiconductor layer, etching the first semiconductor layer exposed between the first spacers and the substrate below the first semiconductor layer to form a device isolation trench and to form a first semiconductor pattern on each of the first and second regions, forming a device isolation pattern that fills the device isolation trench, forming a dummy gate pattern that runs in the first direction across the first and second stack structures, etching the first stack structure on opposite sides of the dummy gate pattern to form a plurality of first trenches that expose the first semiconductor pattern on the first region, and replacing the first semiconductor pattern with a lower separation dielectric pattern through the first trenches on the first region.

BRIEF DESCRIPTION OF THE DRAWINGS

FIGS. 4A to 11A and 14A to 16A illustrate plan views showing a method of fabricating a semiconductor device having the plan view of FIG. 1, according to some example embodiments of the present inventive concepts.

FIGS. 4B to 11B, 12A, 13A, 14B to 16B, and 17A illustrate cross-sectional view showing a method of fabricating a semiconductor device having the cross-sectional view of FIG. 2A, according to some example embodiments of the present inventive concepts.

FIGS. 4C to 8C, 11C, 12B, 14C, and 17B illustrate cross-sectional views showing a method of fabricating a semiconductor device having the cross-sectional view of FIG. 2B, according to some example embodiments of the present inventive concepts.

DETAIL DESCRIPTION

Some example embodiments of the present inventive concepts will now be described in detail with reference to the accompanying drawings to aid in clearly explaining the present inventive concepts.

Figure 1:
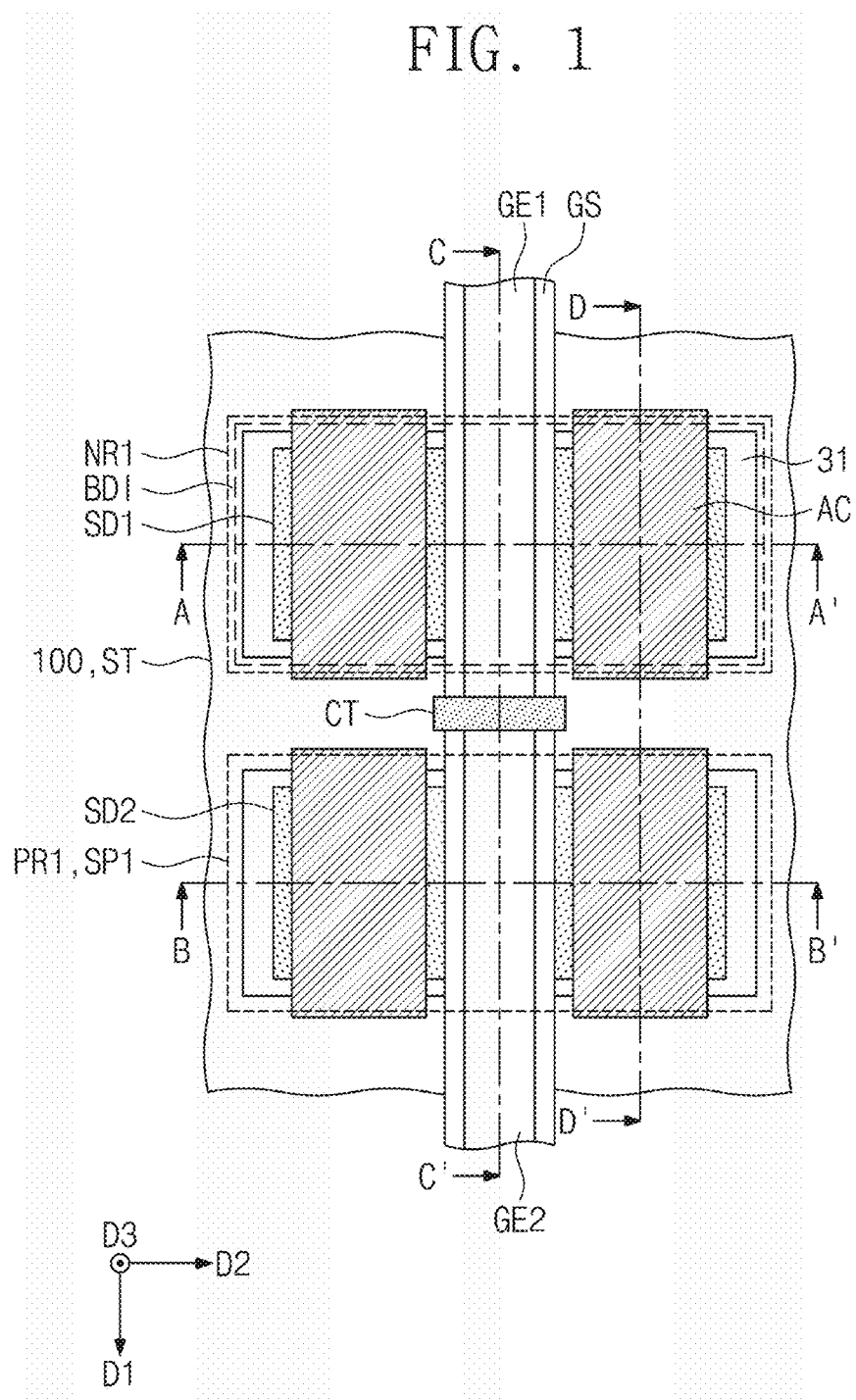
FIG. 1 illustrates a plan view showing a semiconductor device according to some example embodiments of the present inventive concepts.
Figure 2A:
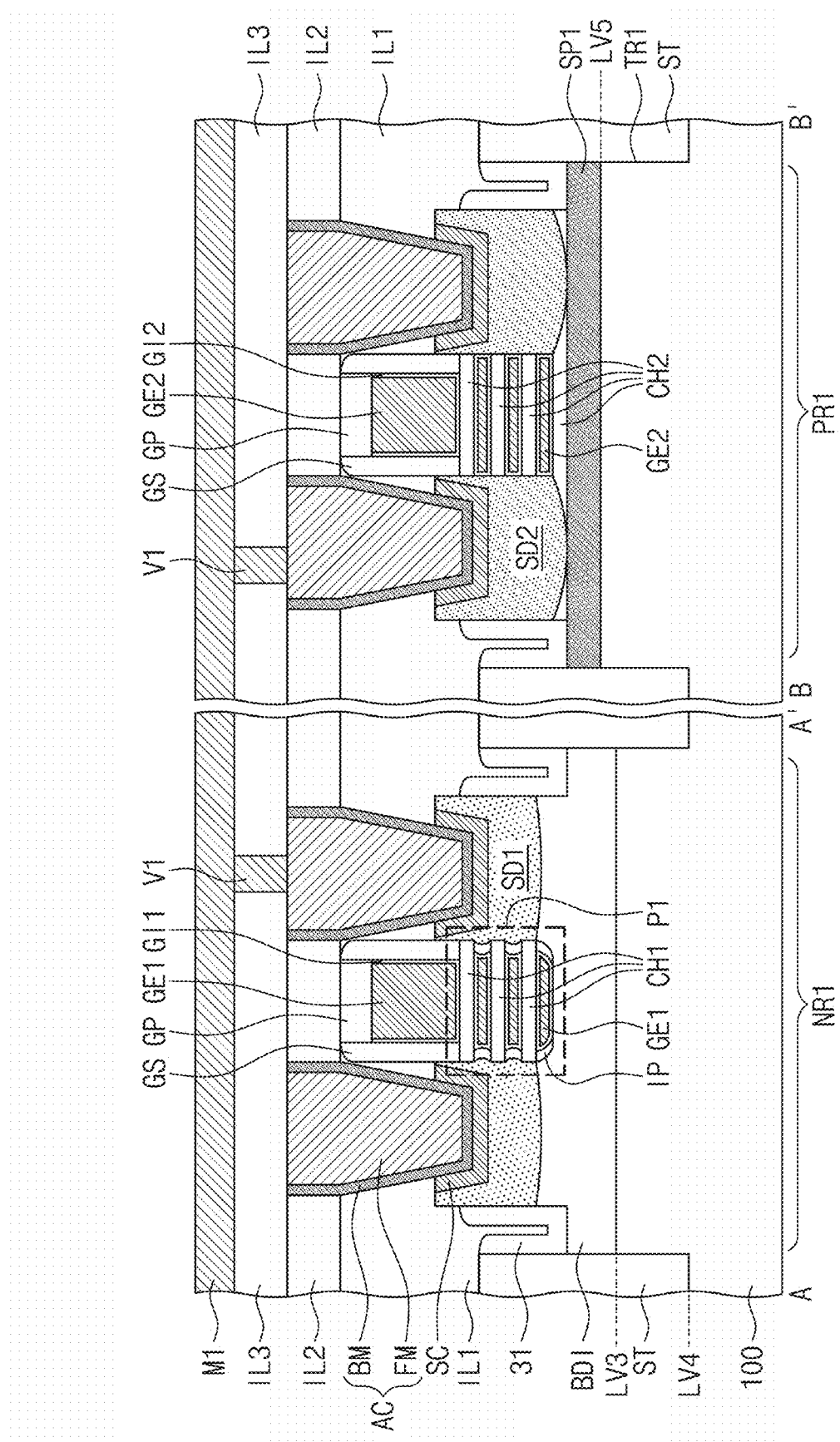
FIG. 2A illustrates a cross-sectional view taken along lines A-A' and B-B' of FIG. 1, according to some example embodiments of the present inventive concepts.
Figure 2B:
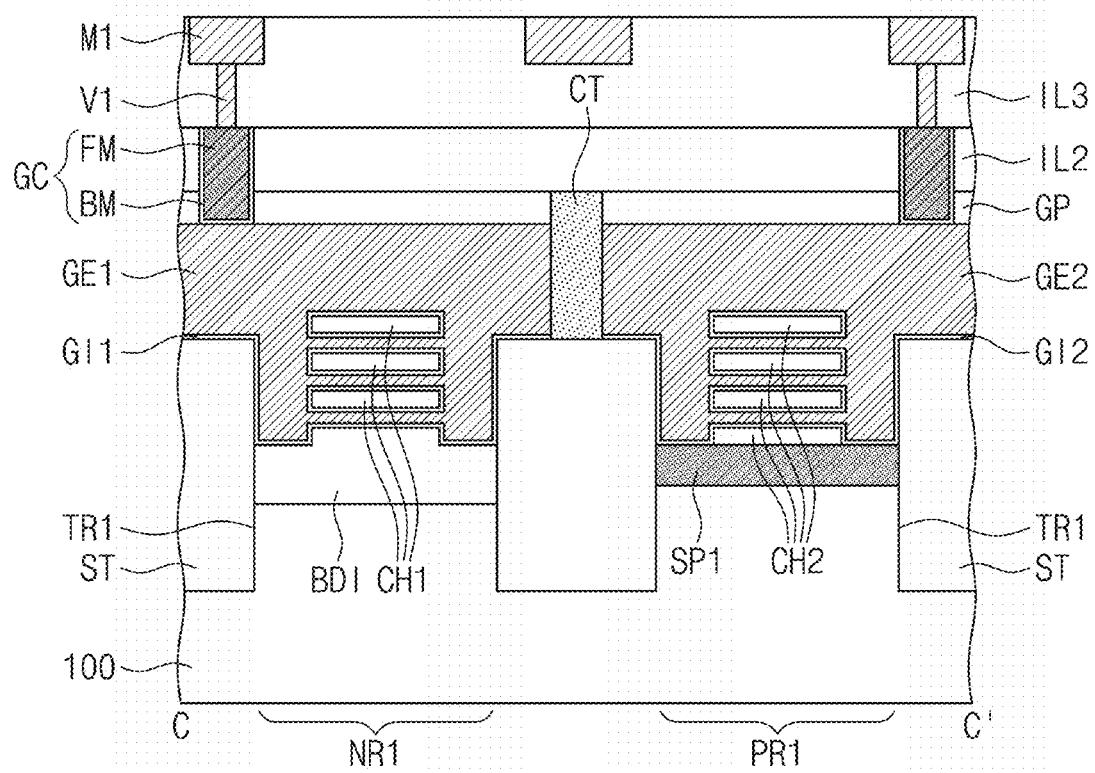
FIG. 2B illustrates a cross-sectional view taken along line C-C' of FIG. 1, according to some example embodiments of the present inventive concepts.
Figure 2C:
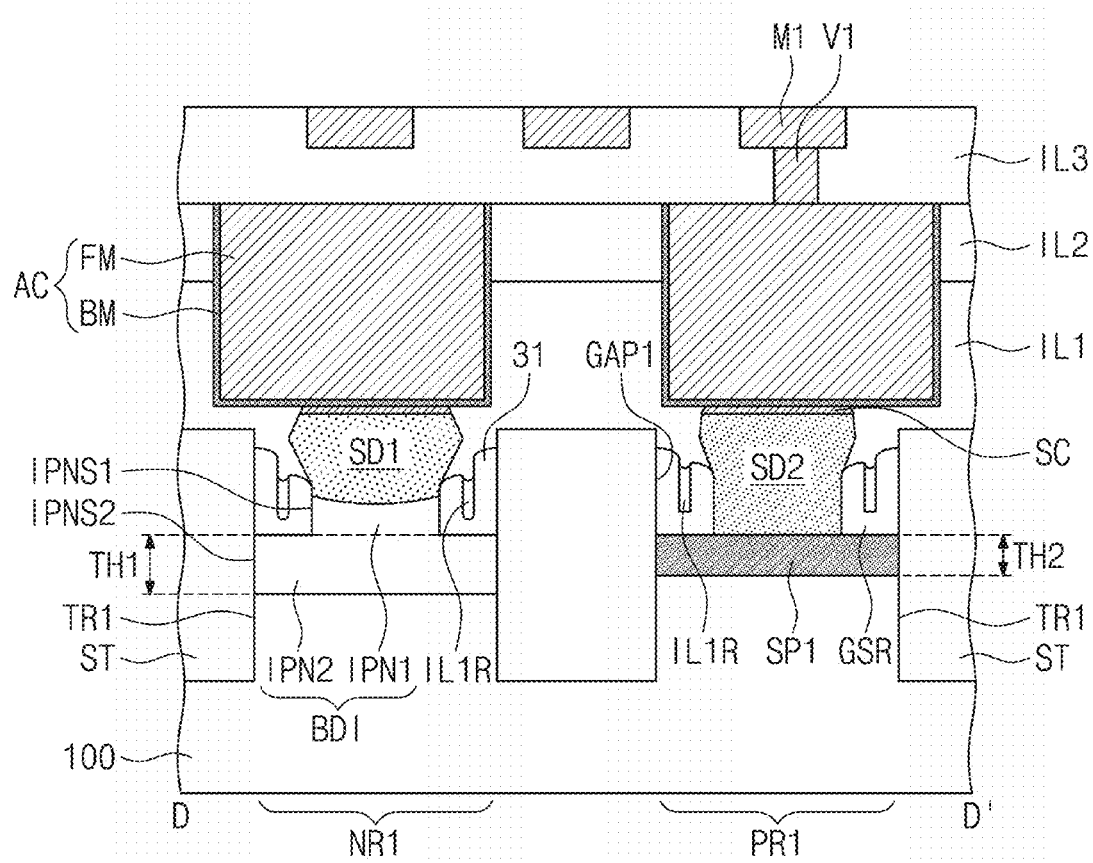
FIG. 2C illustrates a cross-sectional view taken along line D-D' of FIG. 1, according to some example embodiments of the present inventive concepts.
Figure 3:
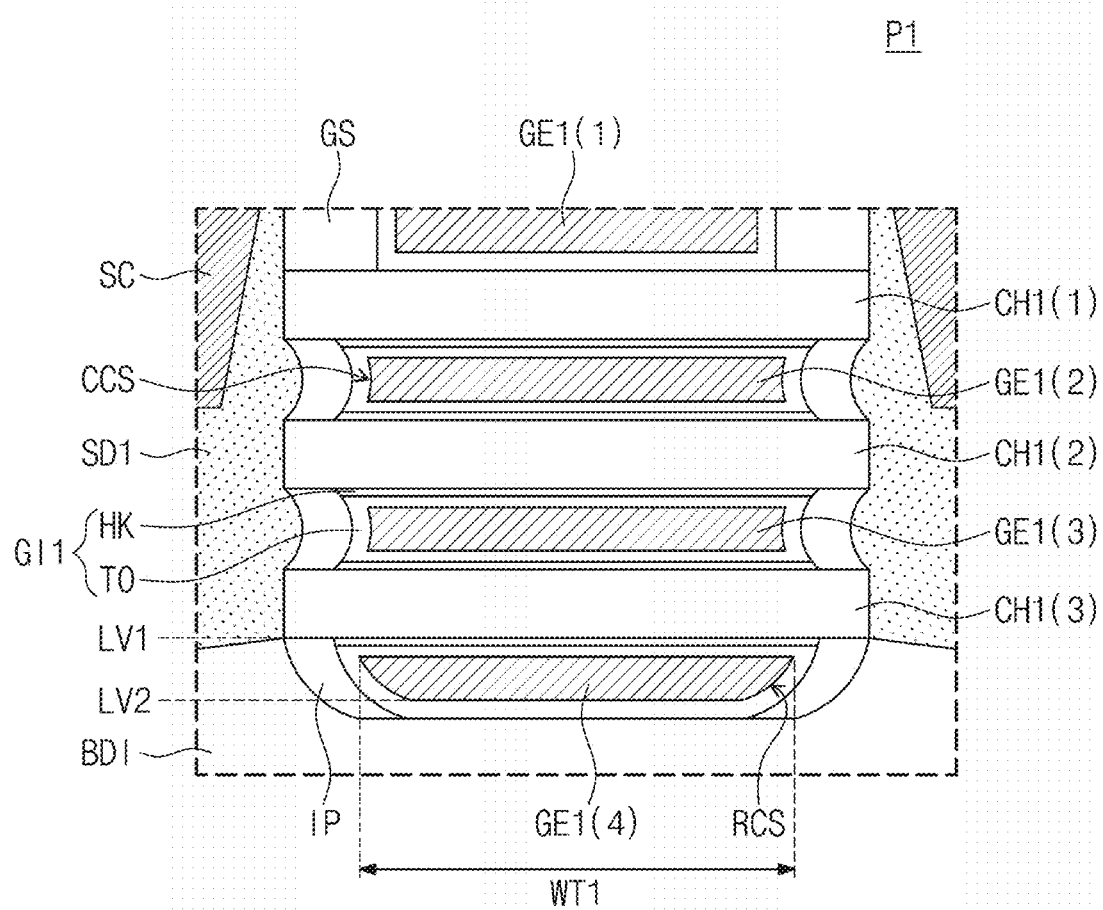
FIG. 3 illustrates an enlarged view showing section P1 of FIG. 2A.

FIG. 1 illustrates a plan view showing a semiconductor device according to some example embodiments of the present inventive concepts. FIG. 2A illustrates a cross-sectional view taken along lines A-A' and B-B' of FIG. 1, according to some example embodiments of the present inventive concepts. FIG. 2B illustrates a cross-sectional view taken along line C-C' of FIG. 1, according to some example embodiments of the present inventive concepts. FIG. 2C illustrates a cross-sectional view taken along line D-D' of FIG. 1, according to some example embodiments of the present inventive concepts. FIG. 3 illustrates an enlarged view showing section P1 of FIG. 2A.

Referring to FIGS. 1 to 3, a semiconductor device according to the present embodiment may include a substrate 100 including a first region NR1 and a second region PR1. The substrate 100 may be a compound semiconductor substrate or a semiconductor substrate including silicon, germanium, or silicon-germanium. For example, the substrate 100 may be a silicon substrate.

The first region NR1 may correspond to an NMOSFET region. The second region PR1 may correspond to a PMOSFET region. The first region NR1 and the second region PR1 may be spaced apart from each other in a first direction D1.

A trench TR may be formed on an upper portion of the substrate 100. A device isolation pattern ST may fill the trench TR. The device isolation pattern ST may define the first region NR1 and the second region PR1. The device isolation pattern ST may include silicon oxide.

On the first region NR1, a lower separation dielectric pattern BDI may be disposed on the substrate 100. The lower separation dielectric pattern BDI may include, for example, silicon oxide. As illustrated in FIG. 2C, the lower separation dielectric pattern BDI may include a first dielectric part IPN1 and a second dielectric part IPN2. The second dielectric part IPN2 may be in contact with the substrate 100, while being positioned below the first dielectric part IPN1. The first dielectric part IPN1 may have a first dielectric sidewall IPNS1 that is spaced apart from the device isolation pattern ST to form a first gap GAP1. The second dielectric part IPN2 may have a second dielectric sidewall IPN2 in contact with the device isolation pattern ST. The second dielectric part IPN2 may have a first thickness TH1. The first dielectric part IPN1 may have a top surface that is rounded and recessed. The lower separation dielectric pattern BDI may not extend to the second region PR1.

First channel patterns CH1 may be stacked on the lower separation dielectric pattern BDI. The first channel patterns CH1 may be spaced apart from each other. Each of the first channel patterns CH1 may include silicon (Si), germanium (Ge), or silicon-germanium (SiGe). For example, each of the first channel patterns CH1 may include crystalline silicon.

A first gate electrode GE1 may be provided on the first channel patterns CH1. As illustrated in FIG. 2B, a portion of the gate electrode GE1 may extend between the first channel patterns CH1. The first gate electrode GE1 may include a conductive material.

As illustrated in FIG. 3, the first channel patterns CH1 may include three first channel patterns CH1(1), CH1(2), and CH1(3) in a sequence from top to bottom. The first gate electrode GE1 may include an uppermost first gate electrode part GE1(1) positioned on the uppermost first channel pattern CH1(1), intermediate first gate electrode parts GE1(2) and GE1(3) between the first channel patterns CH1(1) to CH1(3), and a lowermost first gate electrode part GE1(4) positioned between the lowermost first channel pattern CH1(3) and the lower separation dielectric pattern BDI. The intermediate first gate electrode parts GE1(2) and GE1(3) may each have concave or vertical sidewalls CCS. The lowermost first gate electrode part GE1(4) may have a rounded or inclined sidewall RCS. The lowermost first gate electrode part GE1(4) may have a width WT1 that decreases in a downward direction.

A top end of the lower separation dielectric pattern BDI may be located at a first level LV1 higher than a second level LV2 of a bottom surface of the lowermost first gate electrode part GE1(4). The lower separation dielectric pattern BDI may cover a lateral surface of the lowermost first gate electrode part GE1(4).

A first gate dielectric layer GI1 may be interposed between the first gate electrode GE1 and the first channel patterns CH1. The first gate dielectric layer GI1 may also be interposed between the lowermost first gate electrode part GE1(4) and the lower separation dielectric pattern BDI. The first gate dielectric layer GI1 may include a thermal oxide layer TO and a high-k dielectric layer HK. The thermal oxide layer TO may be in contact with the first channel patterns CH1 and may be spaced apart from the lower separation dielectric pattern BDI. The thermal oxide layer TO may be formed of silicon oxide. The high-k dielectric layer HK may include a dielectric material whose dielectric constant is greater than that of silicon oxide. For example, the high-k dielectric layer HK may include at least one selected from hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

First source/drain patterns SD1 may be disposed on the lower separation dielectric pattern BDI and on opposite sides of the first gate electrode GE1. The first source/drain patterns SD1 may be formed of either a single layer doped with impurities having a first conductivity type or multiple silicon epitaxial layers. In the preset example embodiment, the first conductivity impurities may include phosphorus or arsenic. When the first source/drain patterns SD1 are formed of multiple silicon epitaxial layers, the multiple silicon epitaxial layers may have different concentrations of first conductivity impurities.

The lower separation dielectric pattern BDI may insulate the first source/drain patterns SD1 from the substrate 100. Therefore, a short-channel effect may be mitigated or prohibited.

Side dielectric patterns IP may be interposed between the first gate electrode GE1 and the first source/drain patterns SD1. The side dielectric patterns IP may include, for example, silicon oxide or silicon nitride. The side dielectric patterns IP may be in contact with the high-k dielectric layer HK. A portion of the side dielectric patterns IP may be in contact with the lower separation dielectric pattern BDI. The side dielectric patterns IP positioned between the first channel patterns CH1 may have concave lateral surfaces. Lowermost side dielectric patterns IP may be in contact with the lower separation dielectric pattern BDI. The lowermost side dielectric patterns IP may have rounded lateral surfaces.

The first source/drain patterns SD1 may have outer lateral surfaces aligned with sidewalls of the first dielectric part IPN1. The first source/drain patterns SD1 may be spaced apart from the device isolation pattern ST, and thus the first gap GAP1 may be provided. A residual spacer pattern 31 may be disposed in the first gap GAP1. The residual spacer pattern 31 may be simultaneously in contact with the device isolation pattern ST, the lower separation dielectric pattern BDI, and the first source/drain patterns SD1. The residual spacer pattern 31 may have a hollow cup shape.

The first gate electrode GE1 may run across the first region NR1. A top surface of the first gate electrode GE1 may be covered with a gate capping pattern GP, and a lateral surface of the first gate electrode GE1 may be covered with a gate spacer GS. The gate spacer GS may include the same material as that of the residual spacer pattern 31. The gate capping pattern GP, the gate spacer GS, and the residual spacer pattern 31 may be formed of, for example, a single or multiple layer including at least one selected from SiCN, SiCON, and SiN.

On the second region PR1, a first semiconductor pattern SP1 may be disposed on the substrate 100. The first semiconductor pattern SP1 may include a different material from that of the substrate 100. The first semiconductor pattern SP1 may include, for example, silicon-germanium. As illustrated in FIG. 2C, the first semiconductor pattern SP1 may have a second thickness TH2. The second thickness TH2 may be the same as or less than the first thickness TH1 of the second dielectric part IPN2 of the lower separation dielectric pattern BDI. For example, the first thickness TH1 of the second dielectric part IPN2 of the lower separation dielectric pattern BDI may be the same as or greater than the second thickness TH2 of the first semiconductor pattern SP1.

As illustrated in FIG. 2A, a bottom surface of the lower separation dielectric pattern BDI may be located at a third level LV3, which is the same as or higher than a fourth level LV4 of a bottom surface of the device isolation pattern ST. The third level LV3 of the bottom surface of the lower separation dielectric pattern BDI may be the same as or lower than a fifth level LV5 of a bottom surface of the first semiconductor pattern SP1. A top surface of the second dielectric part IPN2 of the lower separation dielectric pattern BDI may be substantially the same as that of a top surface of the first semiconductor pattern SP1.

Second channel patterns CH2 may be stacked on the first semiconductor pattern SP1. The second channel patterns CH2 may be spaced apart from each other. Each of the second channel patterns CH2 may include silicon (Si), germanium (Ge), or silicon-germanium (SiGe). For example, each of the second channel patterns CH2 may include crystalline silicon.

A second gate electrode GE2 may be provided on the second channel patterns CH2. As illustrated in FIG. 2B, a portion of the second gate electrode GE2 may extend between the second channel patterns CH2. The second gate electrode GE2 may include a conductive material.

As illustrated in FIG. 2A, four second channel patterns CH2 may be provided in a sequence from top to bottom. A portion of the second gate electrode GE2 may be interposed between the second channel patterns CH2. A second gate dielectric layer GI2 may be interposed between the second gate electrode GE2 and the second channel patterns CH2. The second gate dielectric layer GI2 may include a thermal oxide layer TO and the high-k dielectric layer HK.

Second source/drain patterns SD2 may be disposed on opposite sides of the second gate electrode GE2. The second source/drain patterns SD2 may include a semiconductor element (e.g., Ge) whose lattice constant is greater than that of a semiconductor element of the substrate 100. For example, the second source/drain patterns SD2 may be formed of SiGe. Therefore, a pair of second source/drain patterns SD2 may provide a compressive stress to the second channel pattern CH2 therebetween. Accordingly, a PMOSFET may have increased hole mobility and a device may increase in operating speed.

The second source/drain patterns SD2 may be formed of either a single layer doped with impurities having a second conductivity type or multiple silicon-germanium epitaxial layers. The second conductivity type may be opposite to the first conductivity type. In the present example embodiment, the second conductivity impurities may include boron. When the second source/drain patterns SD2 are formed of multiple silicon-germanium epitaxial layers, the multiple silicon-germanium epitaxial layers may have different concentrations of second conductivity impurities.

In some example embodiments, a lowermost one of the second channel patterns CH2 may laterally extend to intervene between the first semiconductor pattern SP1 and the second source/drain patterns SD2. The second source/drain patterns SD2 may penetrate the lowermost second channel patterns CH2 to contact the first semiconductor pattern SP1.

The second source/drain patterns SD2 may be spaced apart from the device isolation pattern ST to provide the first gap GAP1. A residual spacer pattern 31 may be disposed in the first gap GAP1. On the second region PR1, the residual spacer pattern 31 may be simultaneously in contact with the device isolation pattern ST, the first semiconductor pattern SP1, and the second source/drain pattern SD2. The residual spacer pattern 31 may have a hollow cup shape.

The second gate electrode GE2 may run across the second region PR1. A top surface of the second gate electrode GE2 may be covered with a gate capping pattern GP, and a lateral surface of the second gate electrode GE2 may be covered with a gate spacer GS.

The second gate electrode GE2 may be spaced apart in the first direction D1 from the first gate electrode GE1. A gate separation dielectric pattern CT may be interposed between the second gate electrode GE2 and the first gate electrode GE1. The gate separation dielectric pattern CT may be interposed between the first gate dielectric layer GI1 and the second gate dielectric layer GI2 to contact the device isolation pattern ST. The gate separation dielectric pattern CT may penetrate the gate capping pattern GP.

A first transistor may be constituted by the first gate electrode GE1, the first source/drain patterns SD1, the first gate dielectric layer GI1, and the first channel patterns CH1. The first transistor may be, for example, an NMOS field effect transistor (NMOSFET). A second transistor may be constituted by the second gate electrode GE2, the second source/drain patterns SD2, the second gate dielectric layer GI2, and the second channel patterns CH2. The second transistor may be, for example, a PMOS field effect transistor (PMOSFET). The first and second transistors according to the present example embodiment may be three-dimensional field effect transistors (e.g., MBCFET or GAAFET) in which the gate electrodes GE1 and GE2 three-dimensionally surround the channel patterns CH1 and CH2, respectively.

In some example embodiments, a semiconductor device according to the present inventive concepts may include a negative capacitance field effect transistor that uses a negative capacitor. For example, each of the first and second gate dielectric layers GI1 and GI2 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing (SS) of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities (or dopants) doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities (or dopants) such as gadolinium (Gd), silicon (Si), zirconium (Zr), aluminum (Al), and yttrium (Y).

When the impurities (or dopants) are aluminum (Al), the ferroelectric material layer may include about 3 to 8 atomic percent aluminum. In this description, the ratio of impurities may be a ratio of aluminum to the sum of hafnium and aluminum.

When the impurities (or dopants) are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but the present inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but the present inventive concepts are not limited thereto. Because ferroelectric materials have their own critical thickness that exhibits ferroelectric properties, the thickness of the ferroelectric material layer may depend on ferroelectric material.

For example, each of the first and second gate dielectric layers GI1 and GI2 may include one ferroelectric material layer. For another example, each of the first and second gate dielectric layers GI1 and GI2 may include a plurality of ferroelectric material layers that are spaced apart from each other. Each of the first and second gate dielectric layers GI1 and GI2 may have a stack structure in which a plurality of ferroelectric material layers are alternately stacked with a plurality of paraelectric material layers.

Each of the first and second gate electrodes GE1 and GE2 may include a first metal pattern and a second metal pattern on the first metal pattern. The first and second gate dielectric layers GI1 and GI2 may be provided thereon with the first metal pattern adjacent to the first and second channel patterns CH1 and CH2. The first metal pattern may include a work-function metal that controls a threshold voltage of a transistor. A thickness and composition of the first metal pattern may be adjusted to achieve a desired threshold voltage of a transistor.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta).

The first region NR1 and the second region PR1 may be covered with a first interlayer dielectric layer IL1. A portion of the first interlayer dielectric layer IL1 may be inserted into the cup-shaped residual spacer pattern 31. As illustrated in FIG. 2C, a first residual interlayer dielectric pattern IL1R may be inserted into the residual spacer pattern 31. The first interlayer dielectric layer IL1 and the first residual interlayer dielectric pattern IL1R may include the same material. Second and third interlayer dielectric layers IL2 and IL3 may be sequentially stacked on the first interlayer dielectric layer IL1. The first, second, and third interlayer dielectric layers IL1, IL2, and IL3 each may have a single or multiple structure including at least one selected from a silicon oxide layer, a silicon nitride layer, a silicon oxynitride layer, and a porous dielectric layer.

Active contacts AC may be provided to penetrate the first and second interlayer dielectric layers IL1 and IL2 and to electrically connect to corresponding ones of the first and second source/drain patterns SD1 and SD2, respectively. A pair of active contacts AC may be provided on opposite sides of the first gate electrode GE1. When viewed in a plan view, the active contact AC may have a bar shape that extends in the first direction D1.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of a top surface of the gate capping pattern GP.

The active contact AC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

Silicide patterns SC may be interposed between the active contact AC and the first source/drain pattern SD1 and between the active contact AC and the second source/drain pattern SD2, respectively. The active contact AC may be electrically connected through the silicide pattern SC to a corresponding one of the first and second source/drain patterns SD1 and SD2. The silicide pattern SC may include metal silicide, for example, at least one selected from titanium silicide, tantalum silicide, tungsten silicide, nickel silicide, and cobalt silicide.

A first metal layer M1 may be provided in the third interlayer dielectric layer IL3. For example, the first metal layer M1 may include a plurality of power lines and a plurality of signal lines. The first metal layer M1 may further include first vias VI1. The first via VI1 may electrically connect the active contact AC to one of wiring lines of the first metal layer M1. Although not shown, metal layers (e.g., M2, M3, M4, M5, etc.) may be additionally stacked on the third interlayer dielectric layer IL3. Each of the stacked metal layers may include wiring lines for routing between cells.

According to some example embodiments of the present inventive concepts, a short-channel effect may be mitigated or prevented between the first source/drain patterns SD1 because the lower separation dielectric pattern BDI is disposed on the first region NR1 that corresponds to an NMOS region. In addition, the lower separation dielectric pattern BDI may mitigate or prevent leakage current that flows from a channel to the substrate when an NMOSFET is operated. Therefore, it may be possible to control punch-through leakage of the NMOSFET, and accordingly on-current may be increased to improve performance of semiconductor devices. In addition, the lower separation dielectric pattern BDI may reduce a parasitic capacitance between the NMOS- FET and structure adjacent thereto. Accordingly, the NMOSFET may increase in operating speed and may be free of signal error.

Moreover, in a semiconductor device according to some example embodiments, because the lower separation dielectric pattern BDI covers a sidewall of the lowermost first gate electrode part GE1(4), it may be possible to reduce a parasitic capacitance and to mitigate or prevent a short-channel effect between the first gate electrode GE1 and the first source/drain patterns SD1.

Further, in a semiconductor device according to some example embodiments of the present inventive concepts, as the first semiconductor pattern SP1 formed of silicon-germanium is disposed on the second region PR1 that corresponds to a PMOS region, the first semiconductor pattern SP1 may be used as a stress booster when the second source/drain patterns SD2 are formed. The second channel pattern CH2 may thus be provided with compressive stress. Accordingly, a PMOSFET may have increased hole mobility and the device may increase in operating speed.

When a PMOS region is provided with the lower separation dielectric pattern BDI instead of the first semiconductor pattern SP1, lattice continuity may be broken when the second source/drain patterns SD2 are formed and thus no compressive stress may be provided to the second channel pattern CH2. Thus, the PMOSFET may have reduced hole mobility, thereby causing severe performance degradation of the PMOSFET.

According to some example embodiments of the present inventive concepts, the lower separation dielectric pattern BDI and the first semiconductor pattern SP1 may be disposed appropriately for characteristics of device, and therefore it may be possible to improve or optimize performance of NMOSFET and PMOSFET.

In addition, as illustrated in FIG. 2B, between the first region NR1 and the second region PR1, an upper portion of the device isolation pattern ST may upwardly protrude from a top surface of the lower separation dielectric pattern BDI and a top surface of the first semiconductor pattern SP1. Therefore, as insulation is decreased between NMOSFET and PMOSFET, a parasitic capacitance may be reduced between NMOSFET and PMOSFET and in turn operating errors may be reduced or diminished. As shown in FIG. 2C, the protruding device isolation pattern ST may block or prevent the first and second source/drain patterns SD1 and SD2 from contacting each other or merging with each other. Thus, a semiconductor device may increase in reliability.

FIGS. 4A to 11A and 14A to 16A illustrate plan views showing a method of fabricating a semiconductor device having the plan view of FIG. 1, according to some example embodiments of the present inventive concepts. FIGS. 4B to 11B, 12A, 13A, 14B to 16B, and 17A illustrate cross-sectional view showing a method of fabricating a semiconductor device having the cross-sectional view of FIG. 2A, according to some example embodiments of the present inventive concepts. FIGS. 4C to 8C, 11C, 12B, 14C, and 17B illustrate cross-sectional views showing a method of fabricating a semiconductor device having the cross-sectional view of FIG. 2B, according to some example embodiments of the present inventive concepts. FIGS. 8D, 9C, 10C, 11D, 12C, 13B, 14D, 15C, and 16C illustrate cross-sectional views showing a method of fabricating a semiconductor device having the cross-sectional view of FIG. 2C, according to some example embodiments of the present inventive concepts. FIGS. 4B to 11B and 14B to 16B illustrate cross-sectional views taken along lines A-A' and B-B' of FIGS. 4A to 11A and 14A to 16A, respectively.

Figure 4B:
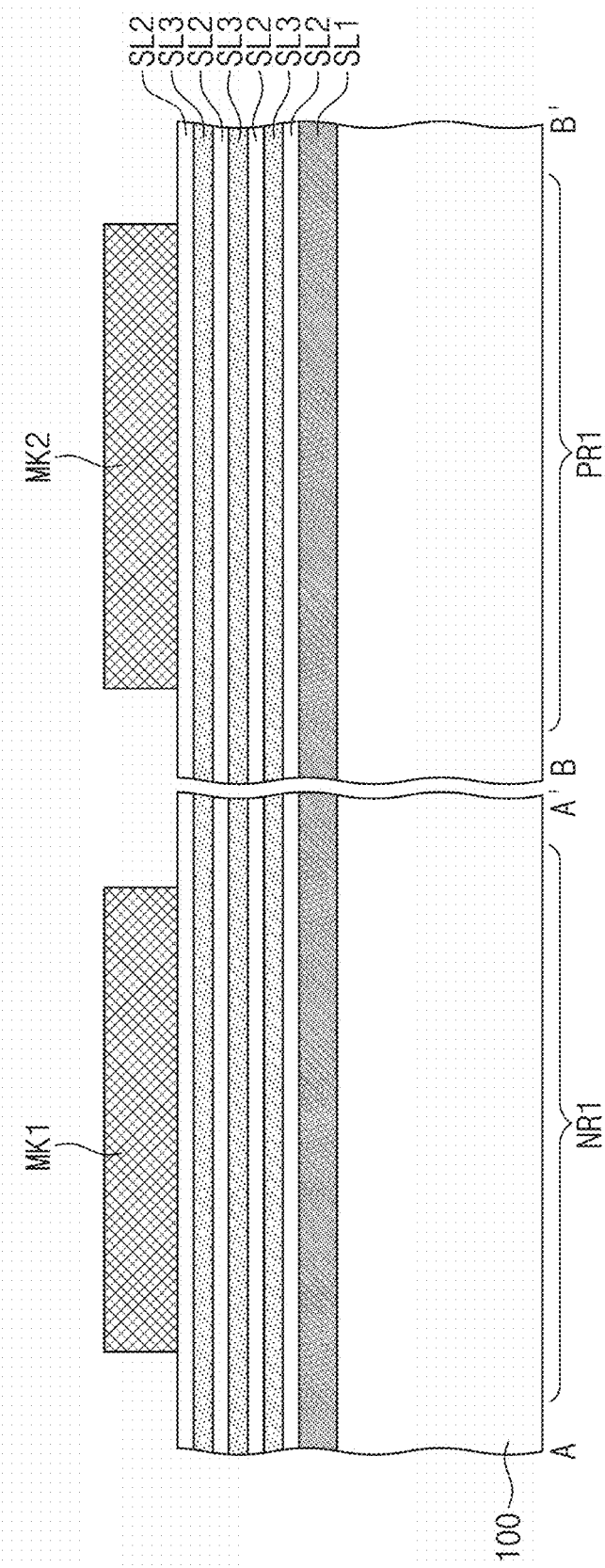
Figure 4C:
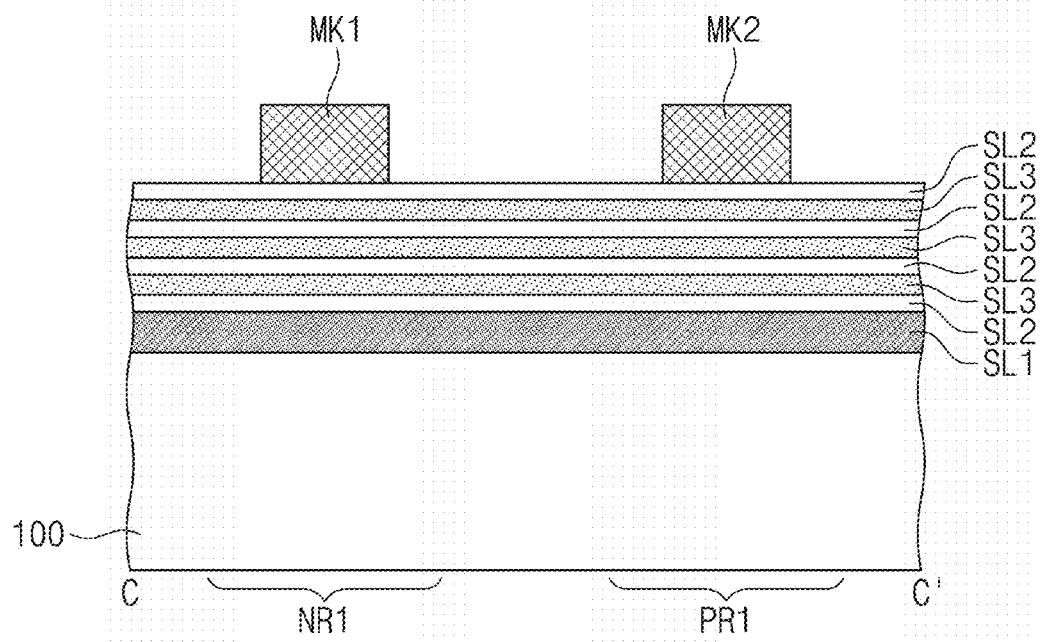

Referring to FIGS. 4A to 4C, a first semiconductor layer SL1 may be stacked on a substrate 100 that has a first region NR1 and a second region PR1. A cross-section taken along line C-C' of FIG. 4A may correspond to FIG. 4C. The first semiconductor layer SL1 may include a different material from that of the substrate 100. For example, the substrate 100 may include silicon. The first semiconductor layer SL1 may include a material (e.g., silicon-germanium) whose lattice constant is greater than that of silicon. Second semiconductor layers SL2 and first sacrificial layers SL3 may be alternately stacked on the first semiconductor layer SL1. The second semiconductor layers SL2 may include silicon that is the same material as that of the substrate 100. The first sacrificial layers SL3 may include a material having an etch selectivity with respect to the second semiconductor layers SL2. For example, the first sacrificial layers SL3 may include silicon-germanium. A composition of silicon and germanium in the first sacrificial layer SL3 may be the same as or different from that of silicon and germanium in the first semiconductor layer SL1. When the composition of silicon and germanium in the first sacrificial layer SL3 is different from that of silicon and germanium in the first semiconductor layer SL1, the first sacrificial layer SL3 may have an etch selectivity with respect to the first semiconductor layer SL1. For example, an amount of germanium in the first semiconductor layer SL1 may be greater than that of germanium in the first sacrificial layer SL3. In this description, the term "amount" may be called an atomic concentration.

A first mask pattern MK1 and a second mask pattern MK2 may be formed on an uppermost second semiconductor layer SL2. The first mask pattern MK1 and the second mask pattern MK2 may be, for example, one of a photoresist layer, a silicon oxide layer, a silicon nitride layer, an amorphous carbon layer (ACL), or a spin-on-hardmask (SOH) layer. The first mask pattern MK1 and the second mask pattern MK2 may be formed on the first region NR1 and the second region PR1, respectively. The first and second mask patterns MK1 and MK2 may be spaced apart from each other in a first direction D1, and each may have a bar shape elongated in a second direction D2.

Figure 5A:
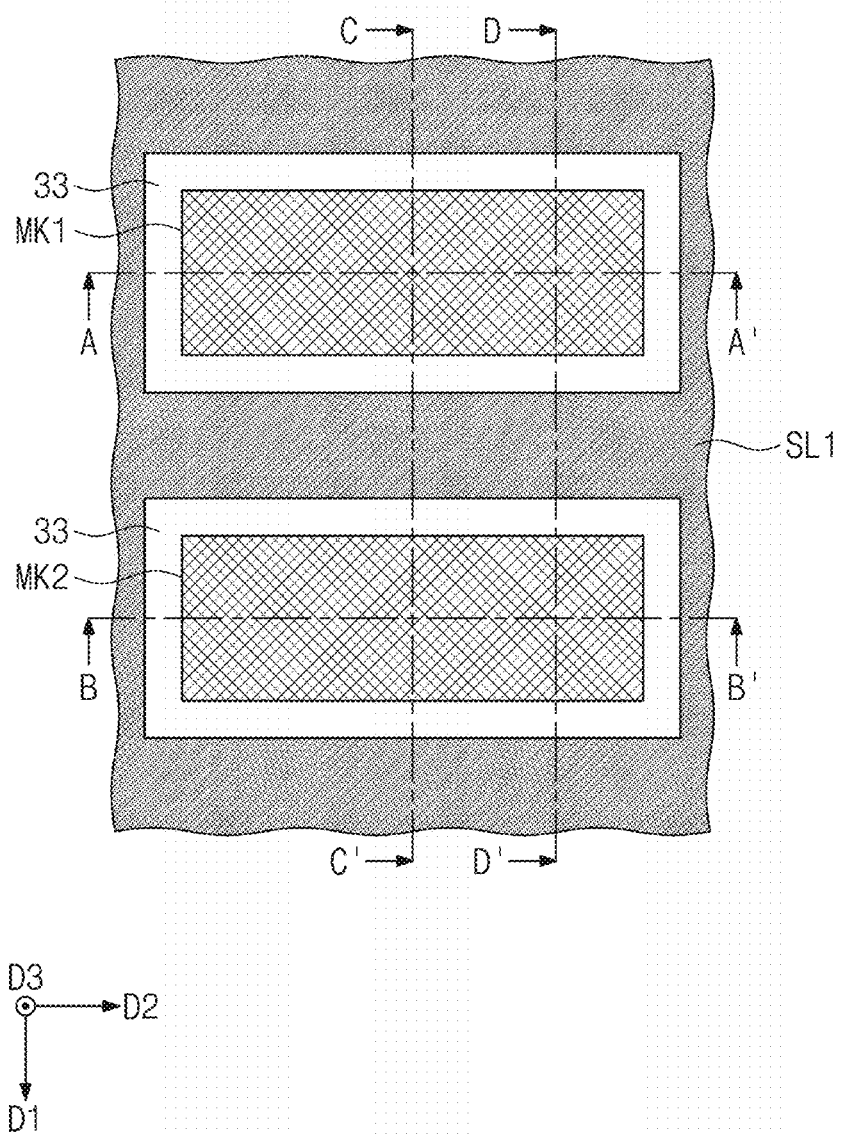
Figure 5B:
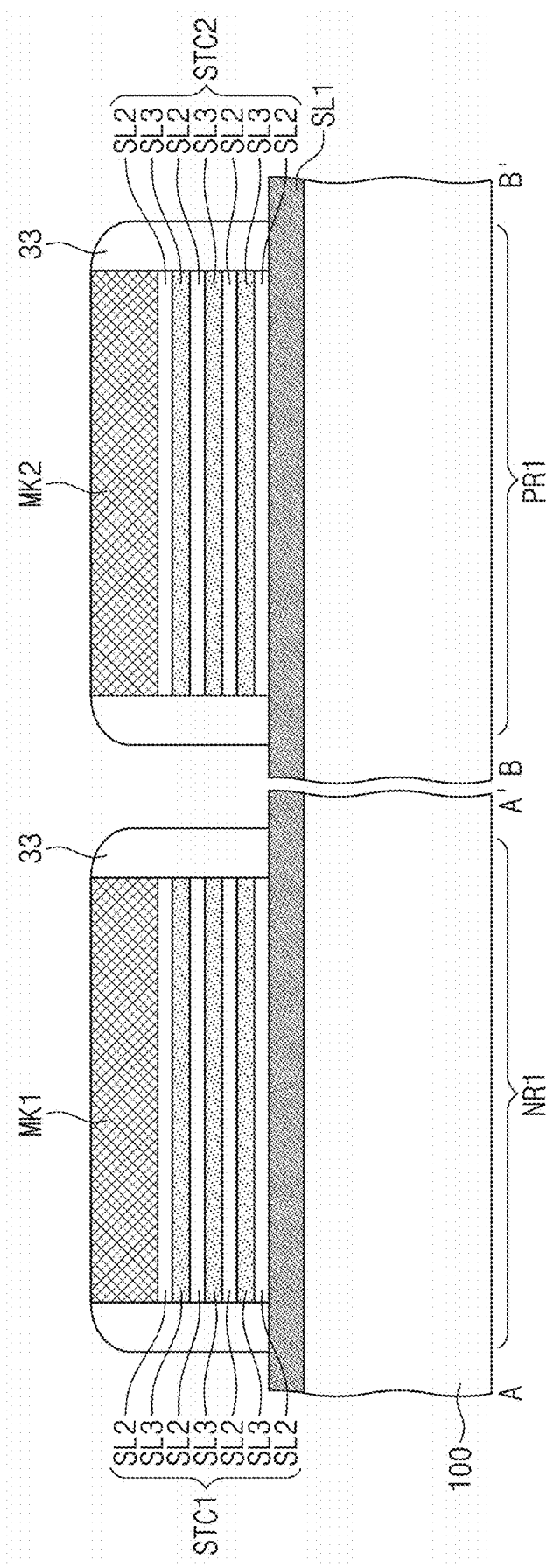
Figure 5C:
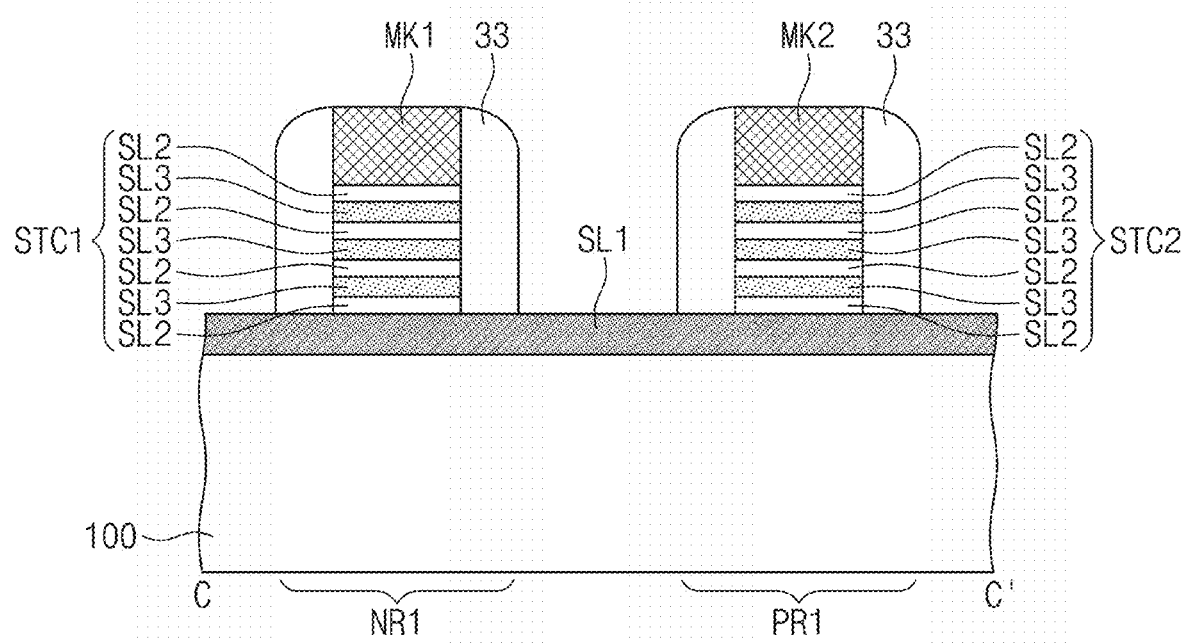

Referring to FIGS. 5A to 5C, the first and second mask patterns MK1 and MK2 may be used as an etching mask, such that the second semiconductor layers SL2 and the first sacrificial layers SL3 may be etched to expose the first semiconductor layer SL1 and simultaneously to form a first stack structure STC1 and a second stack structure STC2 on the first region NR1 and the second region PR1, respectively. In this step, the first semiconductor layer SL1 may serve as an etch stop layer. Each of the first and second stack structures STC1 and STC2 may include the second semiconductor layers SL2 and the first sacrificial layers SL3 that are alternately stacked. A cross-section taken along line C-C' of FIG. 5A may correspond to FIG. 5C.

A second sacrificial layer may be conformally stacked on an entire surface of the substrate 100, and then an anisotropic etching process may be performed to form sacrificial spacers 33 that cover lateral surfaces of each of the first and second stack structures STC1 and STC2. The sacrificial spacers 33 may include a material (e.g., silicon nitride, silicon oxide, silicon oxynitride, metal oxide, SiCN, or SiOC) having an etch selectivity with respect to the first semiconductor layer SL1, the second semiconductor layers SL2, and the first sacrificial layers SL3. The first semiconductor layer SL1 may be exposed between the sacrificial spacers 33. The sacrificial spacers 33 may surround each of the first stack structure STC1 and the second stack structure STC2.

Figure 6B:
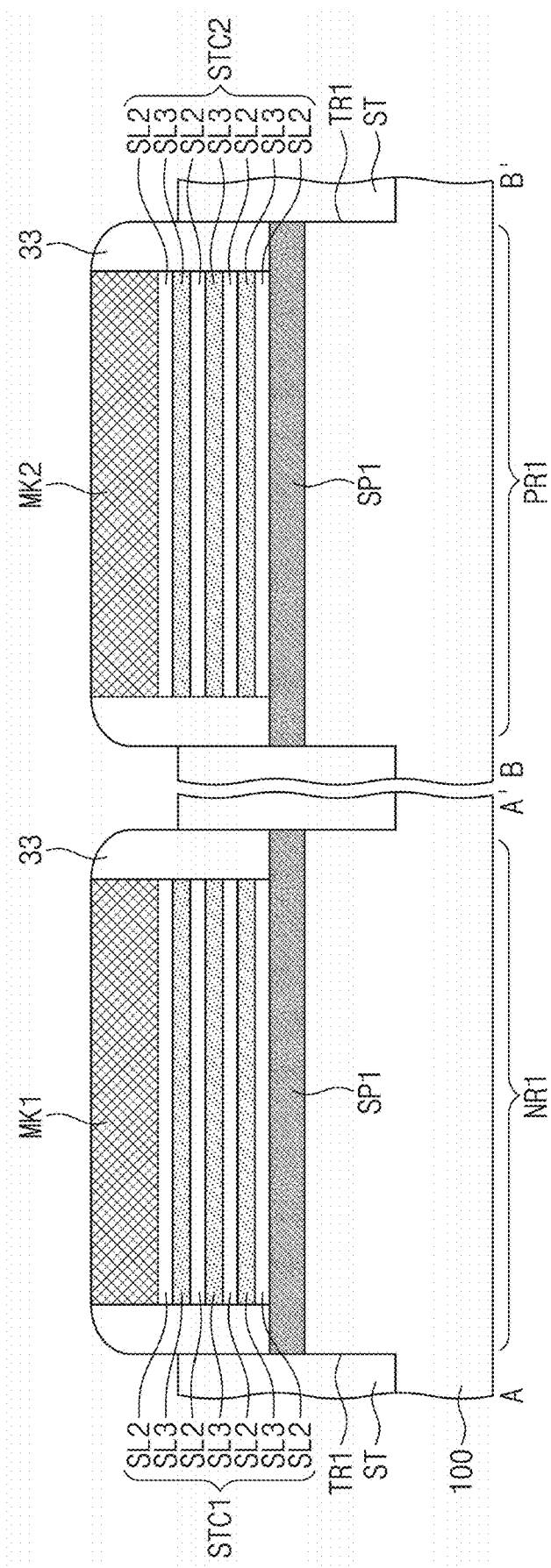
Figure 6C:
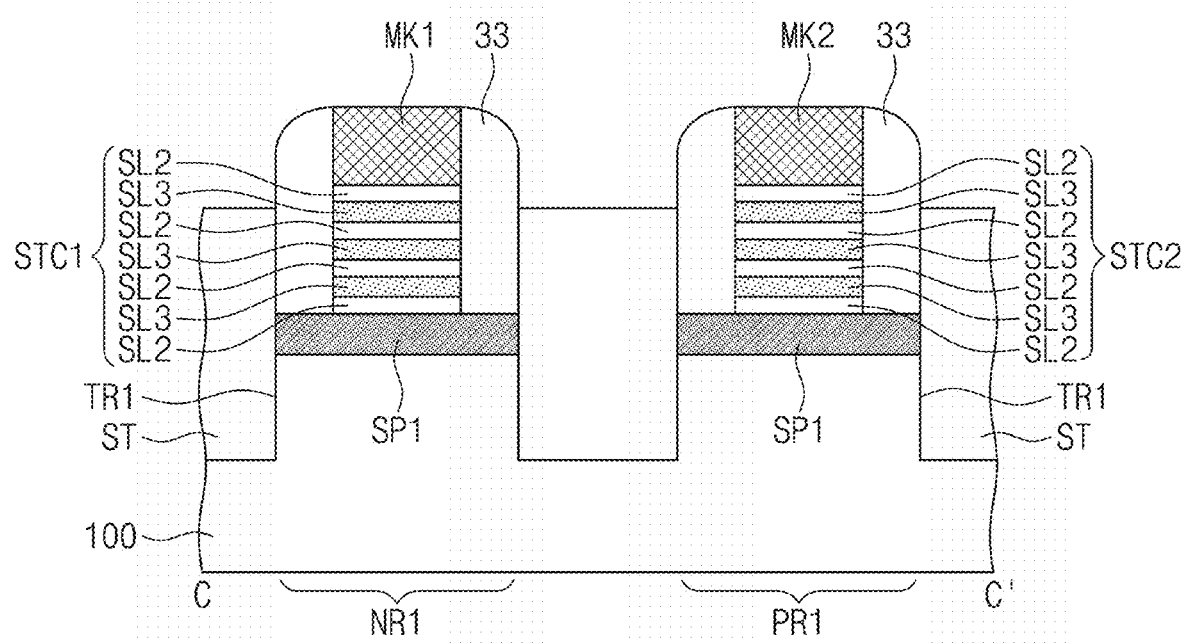

Referring to FIGS. 6A to 6C, the first mask pattern MK1, the second mask pattern MK2, and the sacrificial spacers 33 may be used as an etching mask, such that the first semiconductor layer SL1 and its underlying substrate 100 may be etched to form first trenches TR1. Therefore, first semiconductor patterns SP1 may be formed on the first region NR1 and the second region PR1, respectively. A device isolation layer may be stacked to fill the first trenches TR1, and may be etched-back to form device isolation patterns ST in the first trenches TR1. Therefore, the first and second regions NR1 and PR1 may be formed. A cross-section taken along line C-C' of FIG. 6A may correspond to FIG. 6C. The device isolation patterns ST may be formed to partially cover sidewalls of the sacrificial spacers 33. The device isolation patterns ST may be formed to have their top surfaces higher than those of the first semiconductor patterns SP1.

Figure 7B:
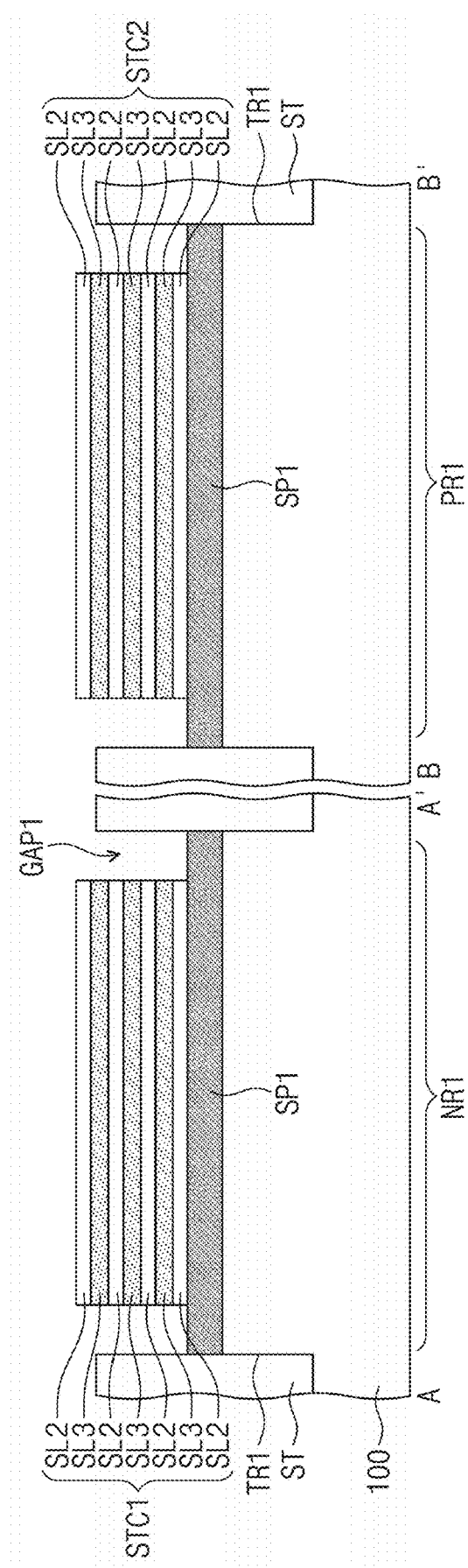
Figure 7C:
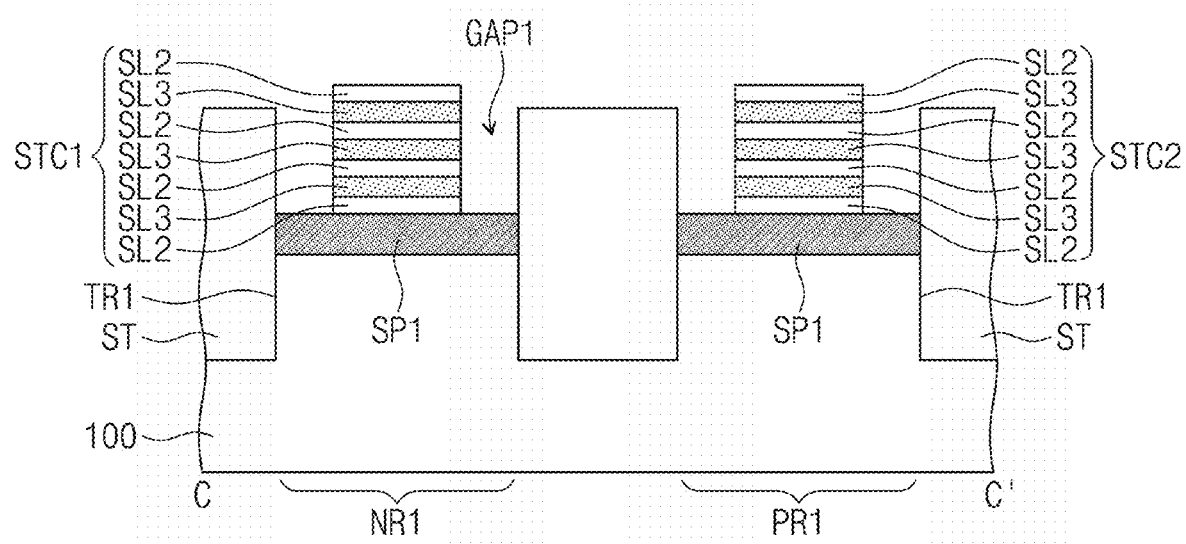

Referring to FIGS. 7A to 7C, the sacrificial spacers 33 may be removed to form first gaps GAP1 between the first stack structure STC1 and the device isolation patterns ST and between the second stack structure STC2 and the device isolation patterns ST. The first mask pattern MK1 and the second mask pattern MK2 may be removed to expose the first stack structure STC1 and the second stack structure STC2. FIG. 7C is a cross-section taken along line C-C' of FIG. 7A.

Figure 8B:
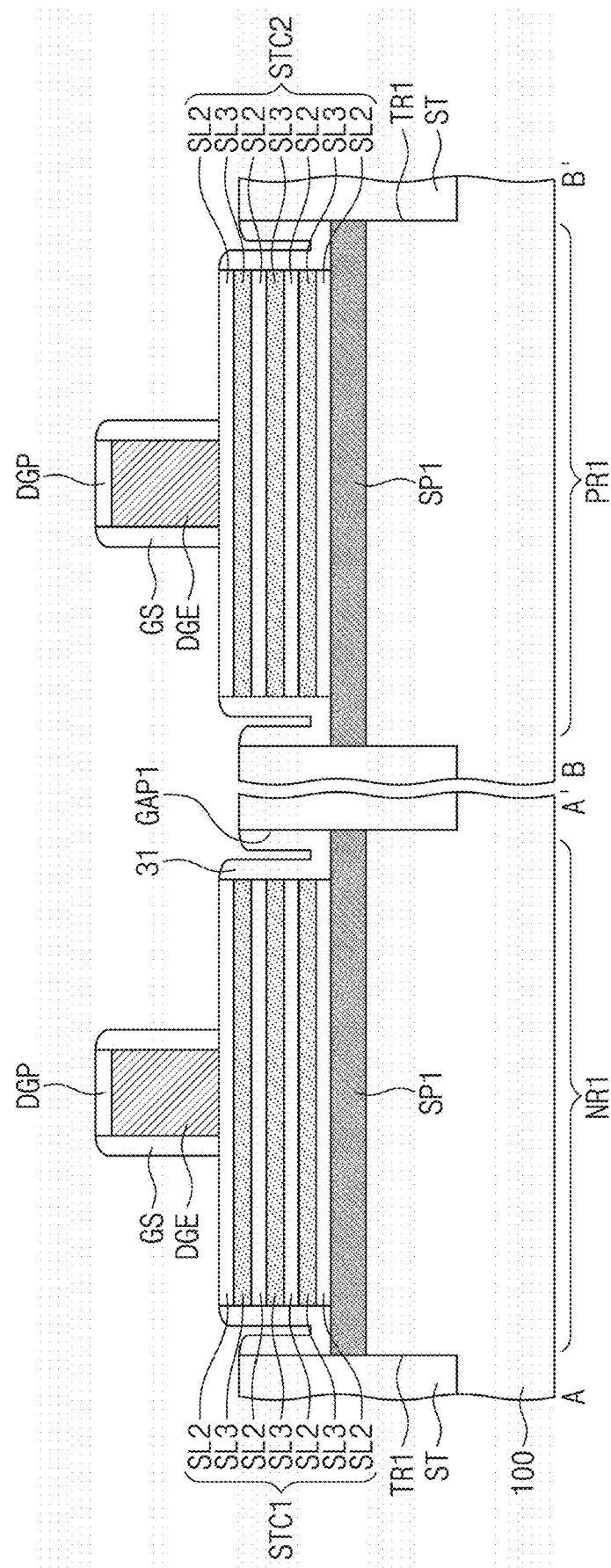
Figure 8C:
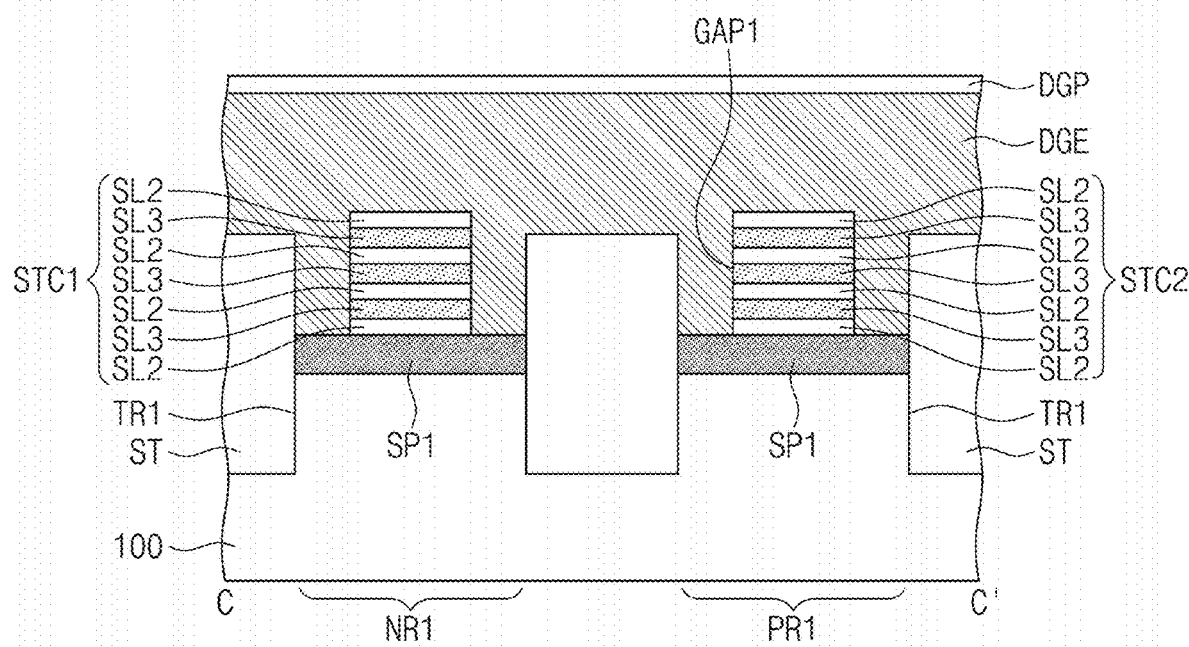
Figure 8D:
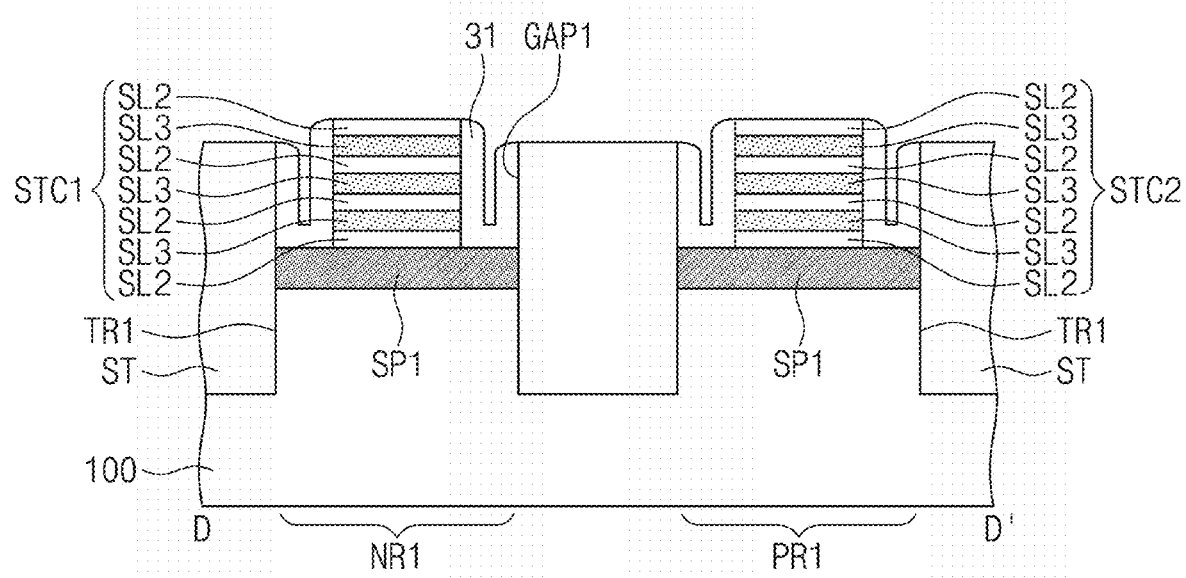
FIGS. 8D, 9C, 10C, 11D, 12C, 13B, 14D, 15C, and 16C illustrate cross-sectional views showing a method of fabricating a semiconductor device having the cross-sectional view of FIG. 2C, according to some example embodiments of the present inventive concepts.

Referring to FIGS. 8A to 8D, a dummy gate layer may be formed on the entire surface of the substrate 100, and a dummy gate capping pattern DGP may be formed on the dummy gate layer. The dummy gate capping pattern DGP may be used as an etching mask to etch the dummy gate layer to form a dummy gate electrode DGE. An extreme ultraviolet (EUV) lithograph process may be used to form a photoresist pattern, and the photoresist pattern may be used as an etching mask to form the dummy gate capping pattern DGP. The dummy gate electrode DGE may include, for example, polysilicon. Although not shown, before the formation of the dummy gate layer, a dummy gate dielectric layer may be formed on surfaces of the first and second stack structures STC1 and STC2. The dummy gate capping pattern DGP and the dummy gate electrode DGE may be formed to extend in the first direction D1 and to run across the first region NR1 and the second region PR1. As illustrated in FIG. 8C, the dummy gate electrode DGE may be inserted into the first gaps GAP1. A spacer layer may be conformally stacked on the entire surface of the substrate 100, and then may be anisotropically etched to form gate spacers GS that cover sidewalls of the dummy gate capping pattern DGP and sidewalls of the dummy gate electrode DGE. In this step, portions of the spacer layer remain in the first gaps GAP1 to form residual spacer patterns 31. The residual spacer patterns 31 may form hollow cup shapes without completely filling the first gaps GAP. FIG. 8C is a cross-section taken along line C-C' of FIG. 8A. FIG. 8D is a cross-section taken along line D-D' of FIG. 8A.

Figure 9A:
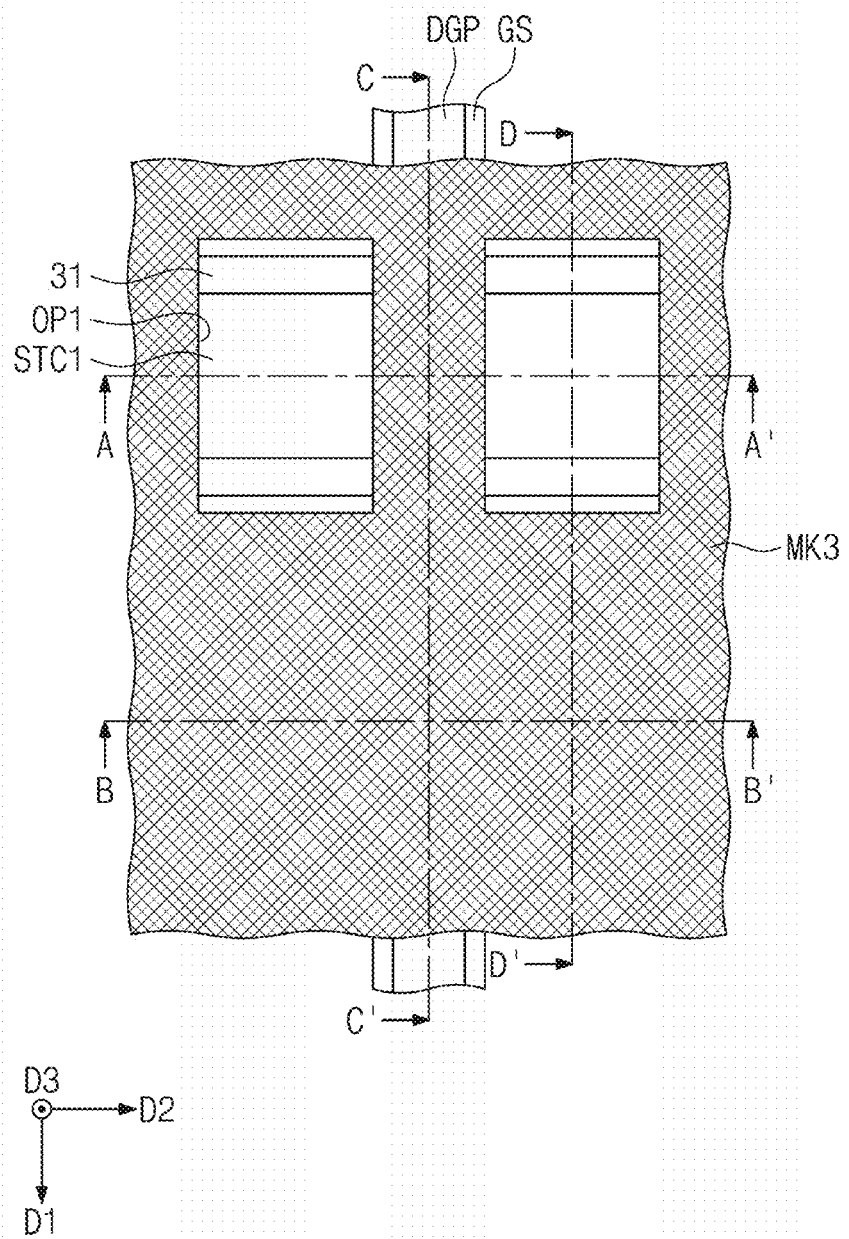
Figure 9B:
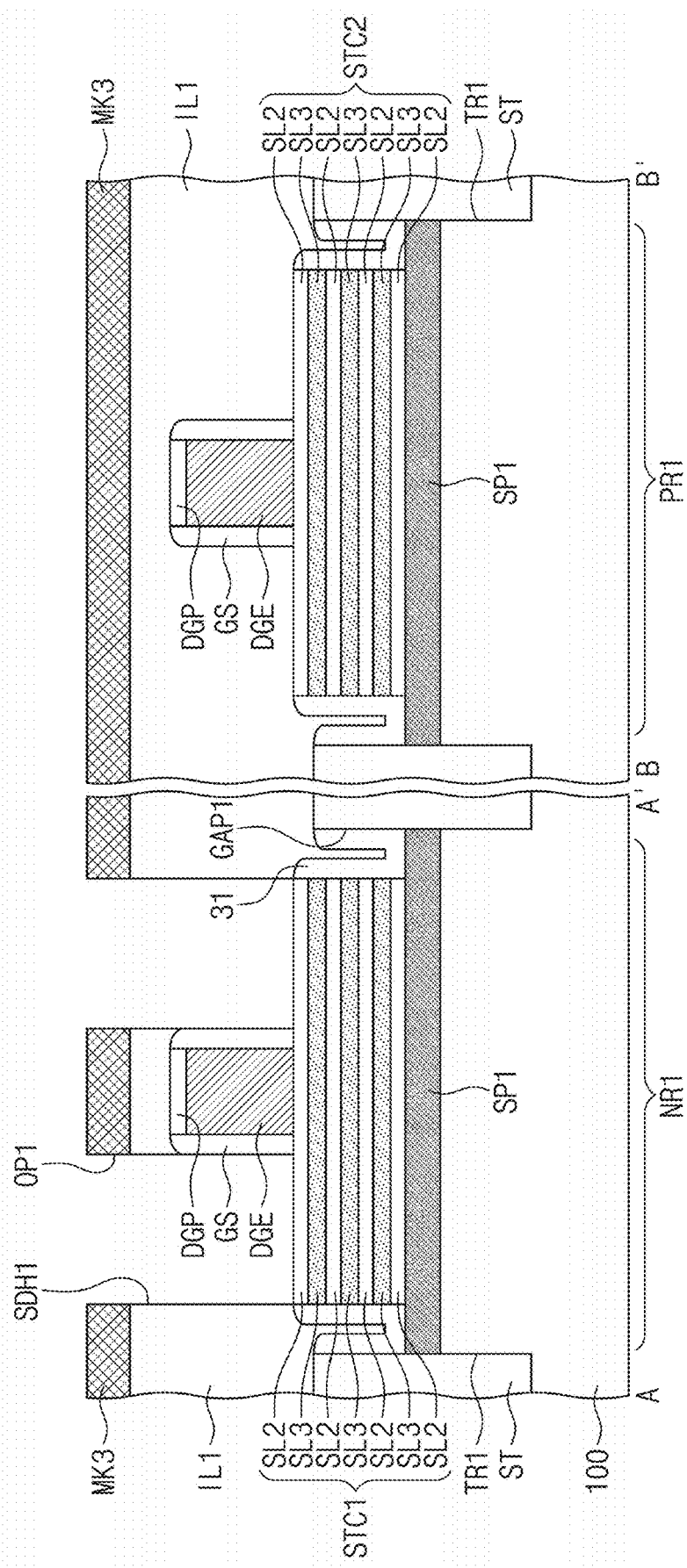
Figure 9C:
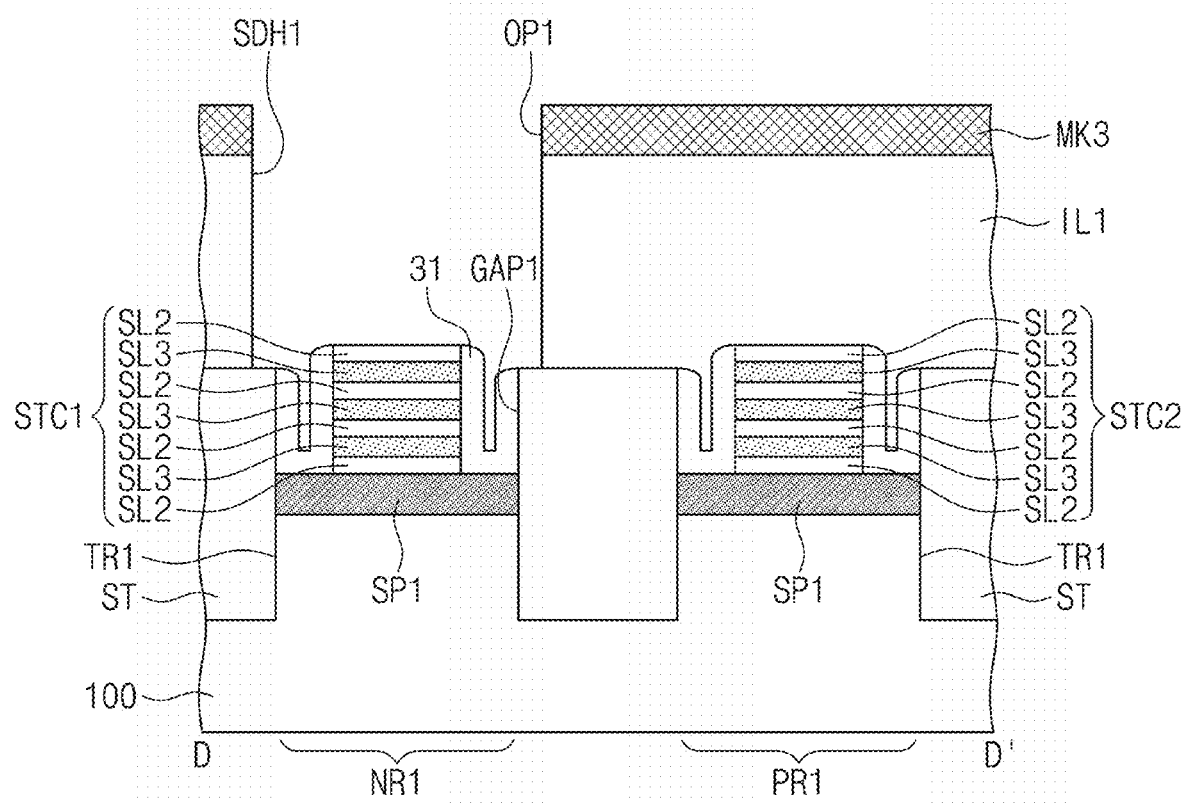

Referring to FIGS. 9A to 9C, a first interlayer dielectric layer IL1 may be stacked on the entire surface of the substrate 100. The first interlayer dielectric layer IL1 may fill an inside of the residual spacer pattern 31. A third mask pattern MK3 may be formed on the first interlayer dielectric layer IL1. The third mask pattern MK3 may be formed to have first openings OP1 that expose the first stack structure STC1 on opposite sides of the dummy gate electrode DGE on the first region NR1. The third mask pattern MK3 may be used as an etching mask to etch the first interlayer dielectric layer IL1 to form first source/drain holes SDH1 that expose the first stack structure STC1 on opposite sides of the dummy gate electrode DGE. FIG. 9B is a cross-section taken along line A-A' and B-B' of FIG. 9A. FIG. 9C is a cross-section taken along line C-C' of FIG. 9A. As illustrated in FIGS. 9B and 9C, the etching of the first interlayer dielectric layer IL1 may allow the residual spacer pattern 31 to have therein a first residual interlayer dielectric pattern IL1R that is a portion of the first interlayer dielectric layer IL1.

Referring to FIGS. 9A to 9C and 10A to 10C, the first stack structure STC1 exposed through the first source/drain holes SDH1 may be etched to expose the first semiconductor pattern SP1 and to form a first preliminary channel structure PST1 below the dummy gate electrode DGE on the first region NR1. The first preliminary channel structure PST1 may include second semiconductor patterns SP2 and first sacrificial patterns SP3 that are alternately stacked. The first source/drain holes SDH1 may expose a sidewall of the first preliminary channel structure PST1 and the top surface of the first semiconductor pattern SP1.

Figure 10B:
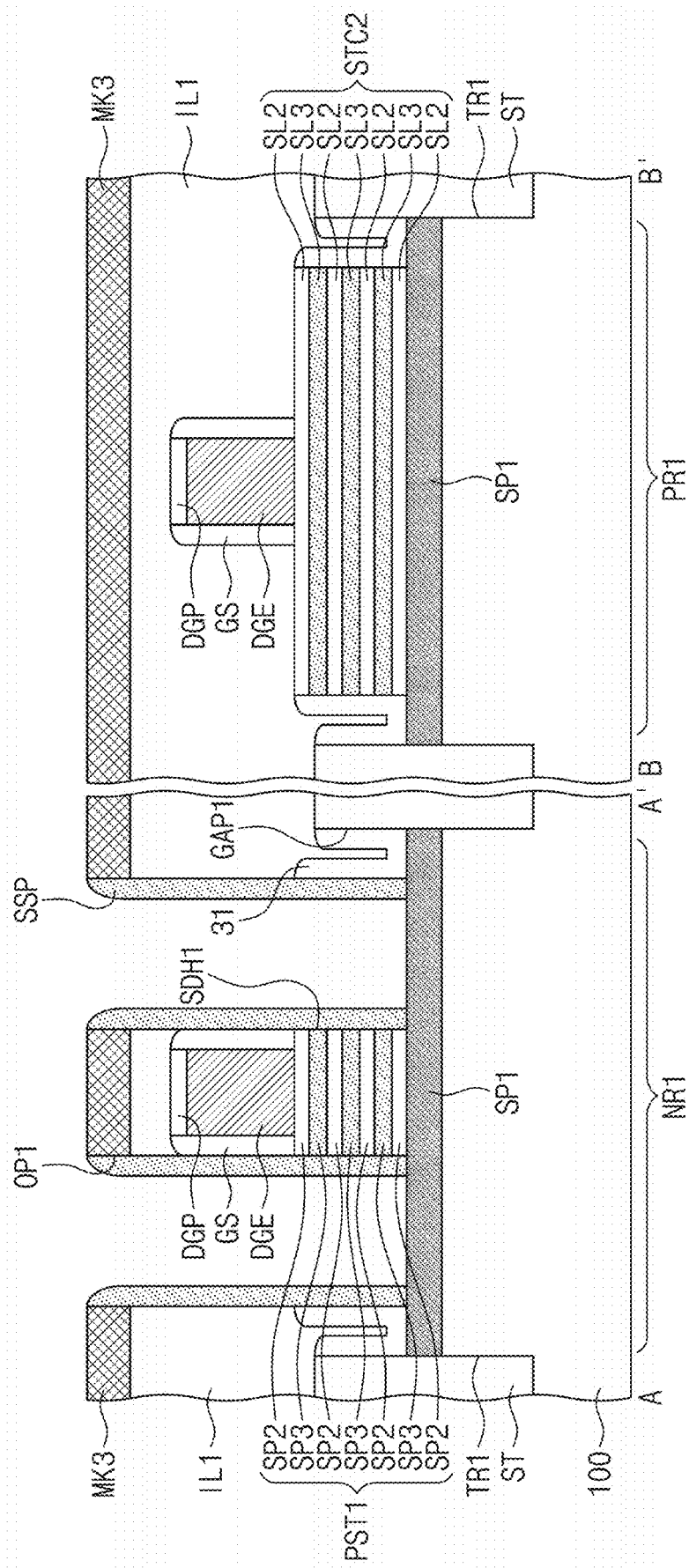
Figure 10C:
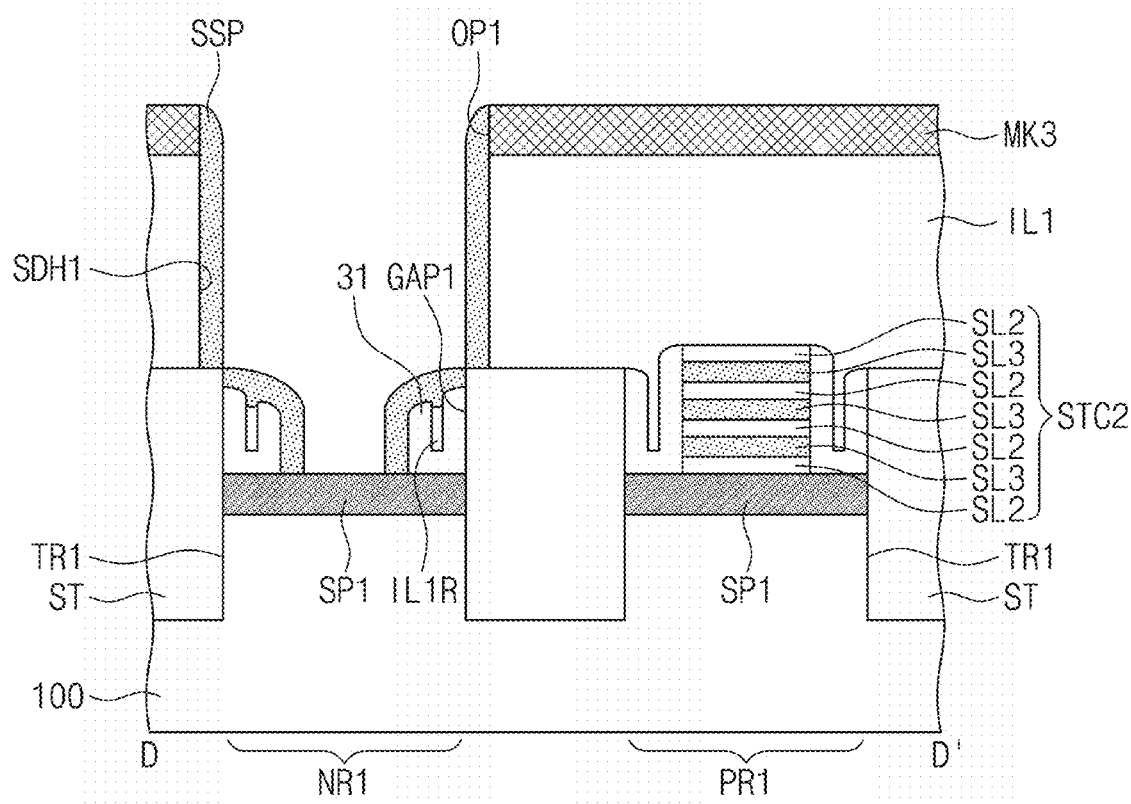

A protection layer may be conformally stacked on the entire surface of the substrate 100, and may then be anisotropically etched to form a protective spacer SSP that covers sidewalls of the first source/drain holes SDH1. The protective spacer SSP may be formed of a material having an etch selectivity with respect to the first interlayer dielectric layer IL1 and the first semiconductor pattern SP1. The protective spacer SSP may include, for example, silicon nitride, metal oxide, SiON, SiOC, SiCN, or polysilicon. FIG. 10C is a cross-section taken along line C-C' of FIG. 10A.

Referring to FIGS. 10A to 10C and 11A to 11D, on the first region NR1, the first semiconductor pattern SP1 exposed through the first source/drain holes SDH1 may be removed to expose the substrate 100 that underlies the first semiconductor pattern SP1. Therefore, a second gap GAP2 may be formed in an area from which the first semiconductor pattern SP1 is removed. The second gap GAP2 may expose a bottom surface of a lowermost one of the second semiconductor patterns SP2 included in the first preliminary channel structure PST1. The second gap GAP2 may expose a bottom surface of the protective spacer SSP and bottom surfaces of the residual spacer patterns 31. On the first region NR1, the second gap GAP2 may expose a lateral surface of the device isolation pattern ST and a top surface of the substrate 100. A first isotropic etching process may be performed to remove the first semiconductor pattern SP1. The first isotropic etching process may be executed in a dry or wet manner. In the first isotropic etching process, the device isolation pattern ST may prevent an etchant from being introduced into the second region PR1. For example, the device isolation pattern ST may serve as a dam that protects the second region PR1 in the first isotropic etching process. In the first isotropic etching process, the protective spacer SSP may mitigate or prevent damage to the first preliminary channel structure PST1.

Figure 12A:
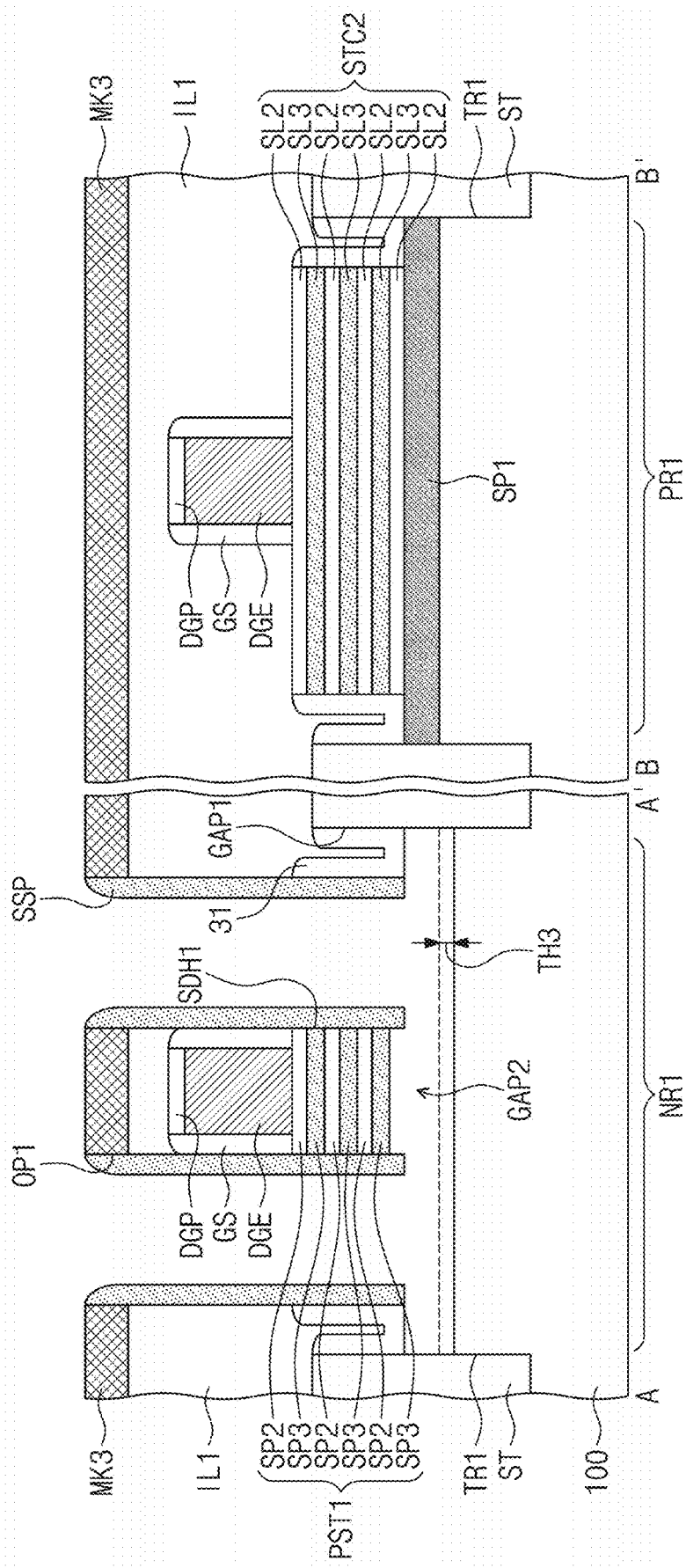
Figure 12B:
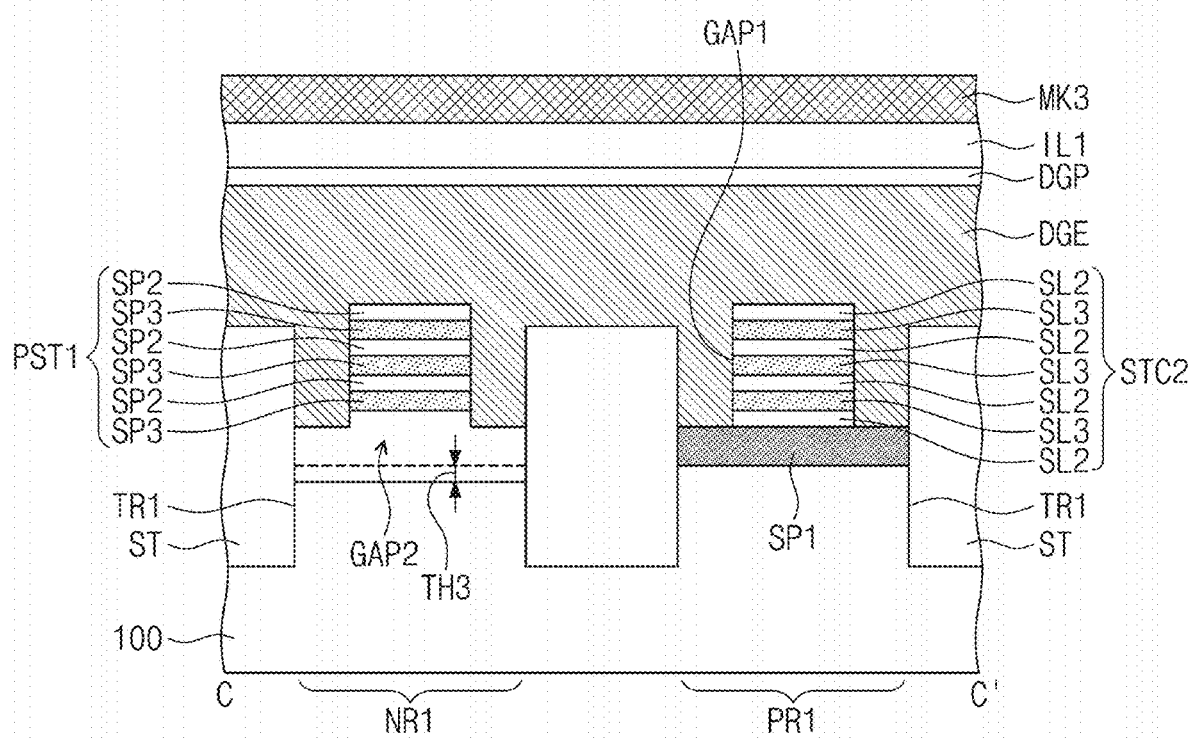
Figure 12C:
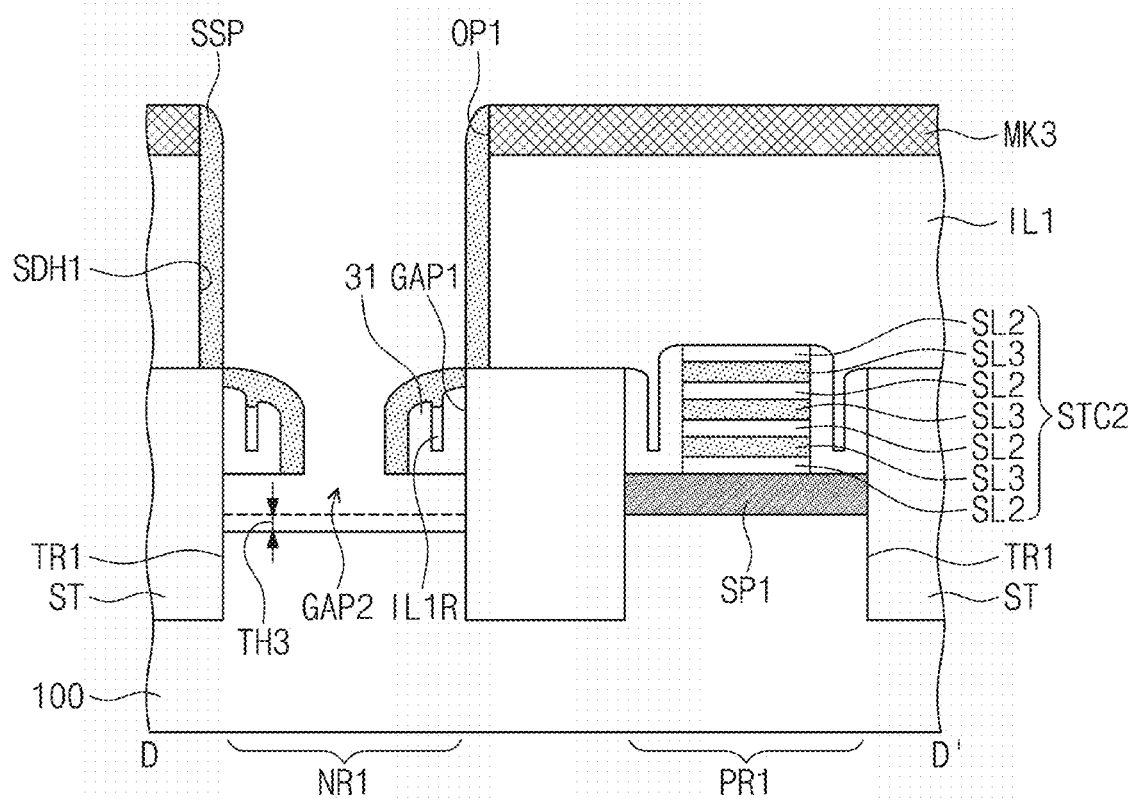

Referring to FIGS. 12A to 12C, a second isotropic etching process may be performed to remove the lowermost one of the second semiconductor patterns SP2 included in the first preliminary channel structure PST1. When the second semiconductor patterns SP2 are formed of silicon that is the same material as that of the substrate 100, the second isotropic etching process may remove a portion of the substrate 100 as much as a third thickness TH3. Therefore, the second gap GAP2 may become wide. The second gap GAP2 may expose a lowermost one of the first sacrificial patterns SP3 included in the first preliminary channel structure PST1. In the second isotropic etching process, the protective spacer SSP may block or prevent the etching of the second semiconductor patterns SP2 other than the lowermost one of the second semiconductor patterns SP2 included in the first preliminary channel structure PST1.

Figure 13A:
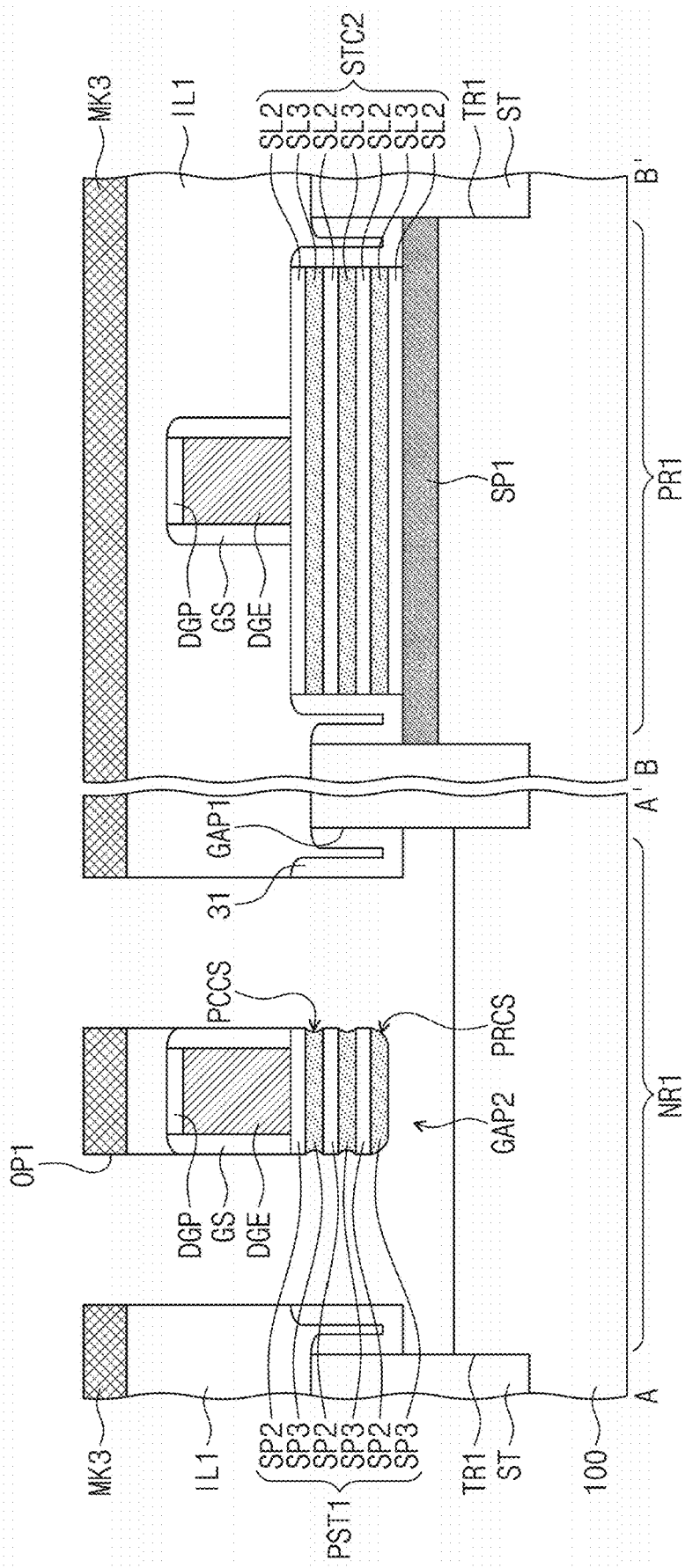
Figure 13B:
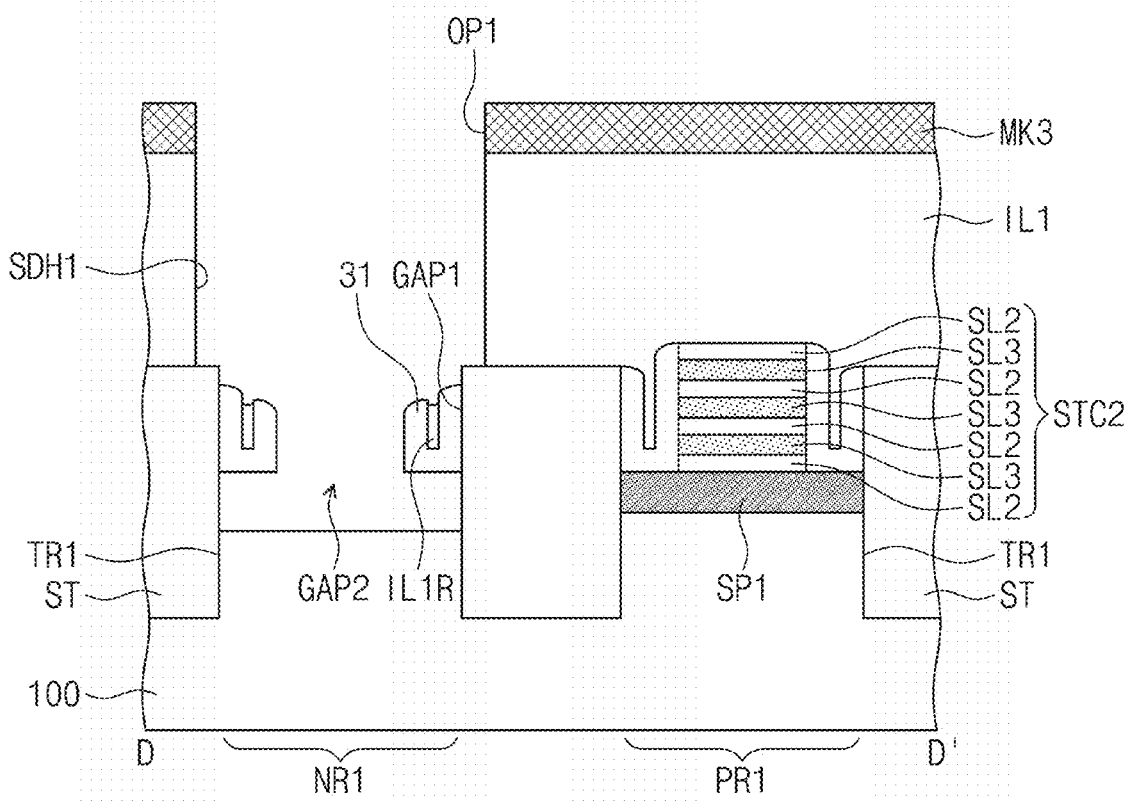
Figure 14A:
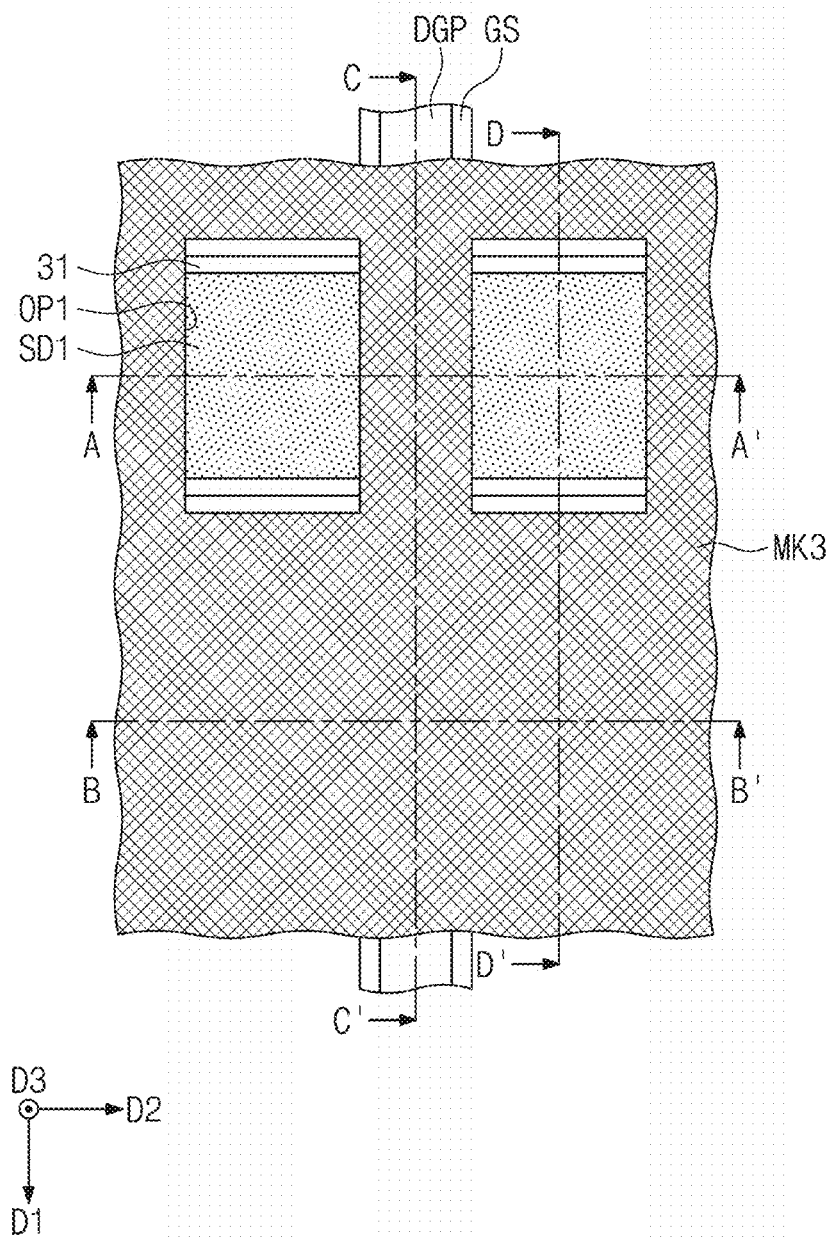
Figure 14B:
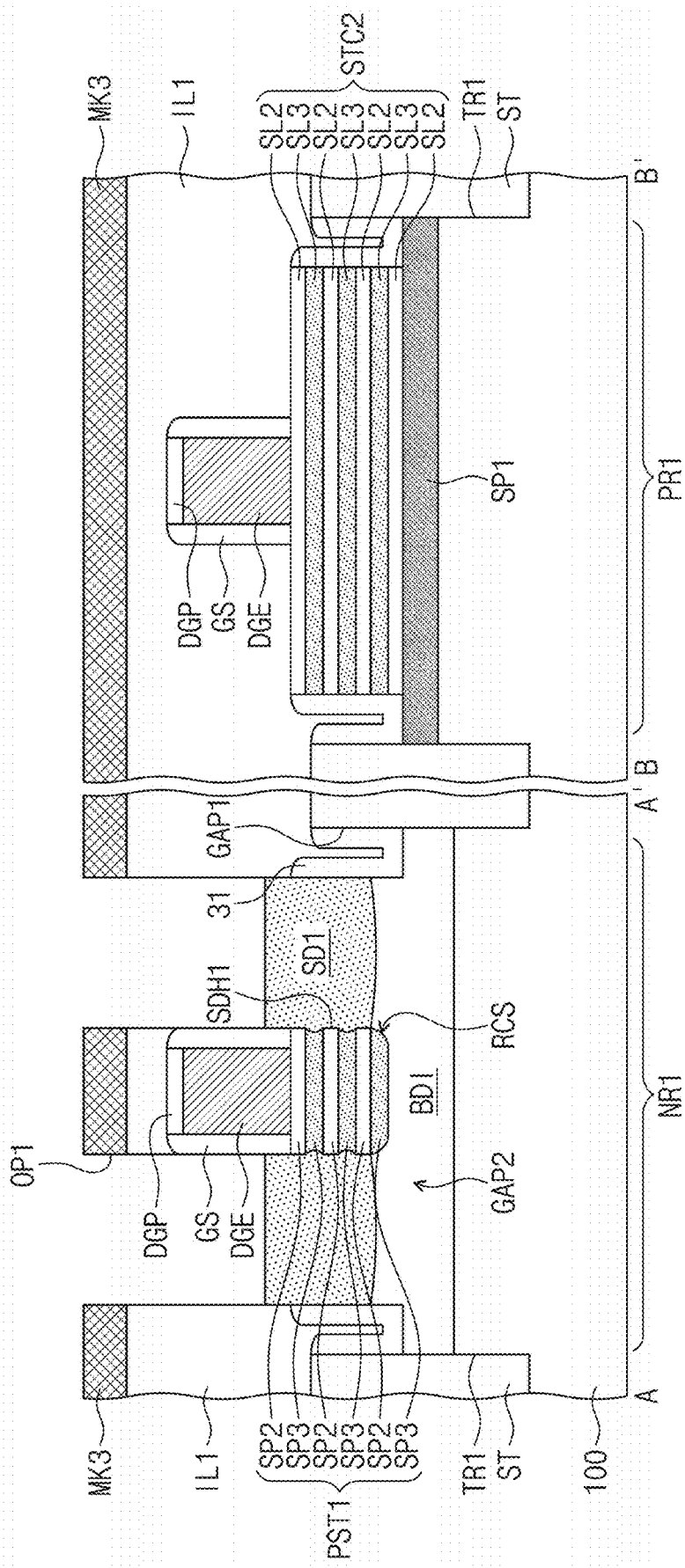
Figure 14C:
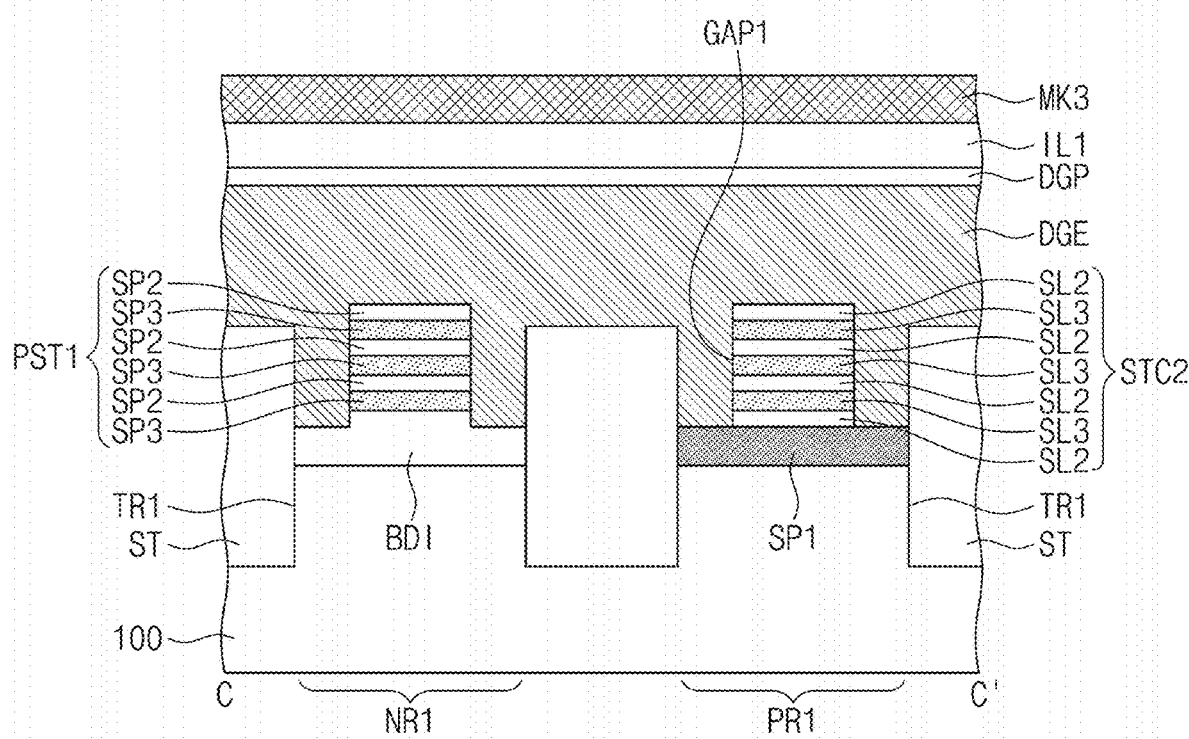
Figure 14D:
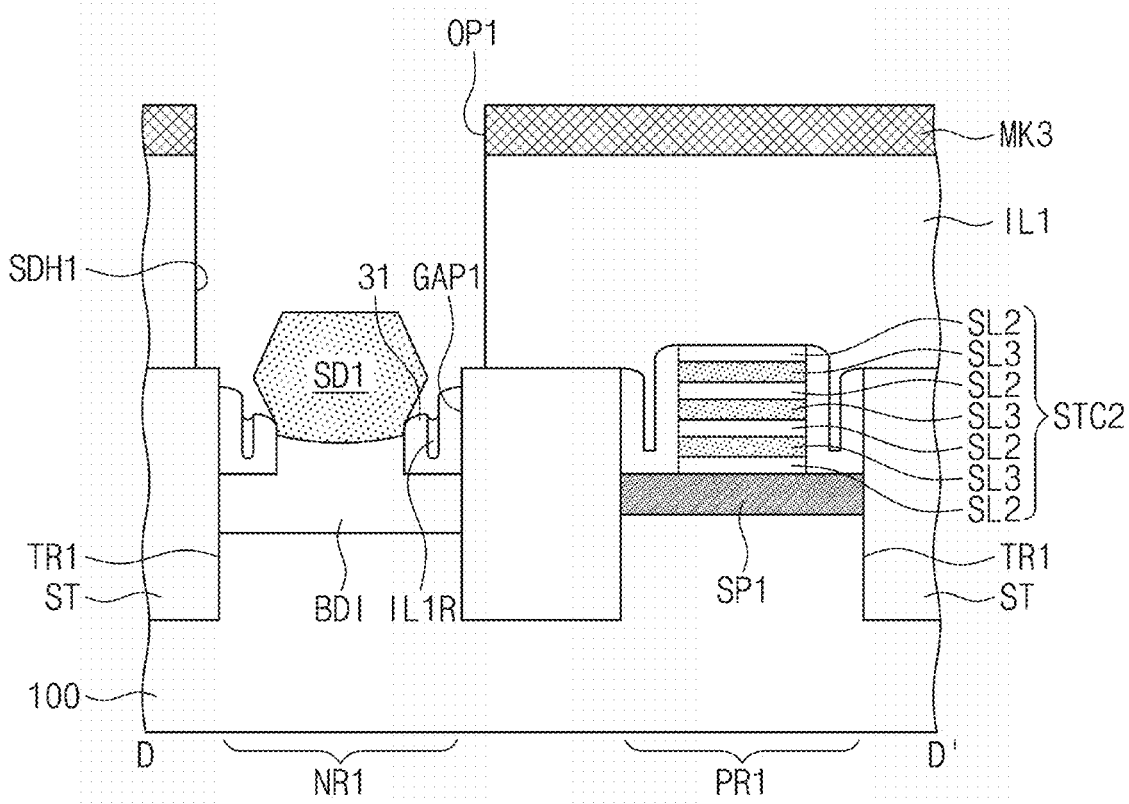

Referring to FIGS. 13A and 13B, the protective spacer SSP may be removed to expose the sidewall of the first preliminary channel structure PST1. A third isotropic etching process may be performed to remove the protective spacer SSP. The first sacrificial patterns SP3 may be partially etched during the third isotropic etching process. Therefore, the lowermost one of the first sacrificial patterns SP3 may be formed to have a rounded sidewall PRCS. In addition, the first sacrificial patterns SP3 positioned on the lowermost first sacrificial pattern SP3 may have their concave sidewalls PCCS.

The present example embodiment discloses the formation of the protective spacer SSP, but another example embodiment may omit the protective spacer SSP. When the protective spacer SSP is omitted, a composition of silicon and germanium in the first semiconductor pattern SP1 may be different from that of silicon and germanium in the first sacrificial pattern SP3. Therefore, the first semiconductor pattern SP1 may have an etch selectivity with respect to the first sacrificial pattern SP3. Accordingly, the first preliminary channel structure PST1 may not be damaged in the first isotropic etching process that removes the first semiconductor pattern SP1 on the first region NR1.

In another example embodiment, in the step of FIGS. 4A to 4C, the second semiconductor layer SL2 may not be formed directly on the first semiconductor layer SL1, but rather the first sacrificial layer SL3 may be formed immediately on the first semiconductor layer SL1. For example, the first semiconductor layer SL1 and the first sacrificial layer SL3 may be formed in contact with each other. When subsequent processes are performed in this case, in the step of FIGS. 10A to 10C, the lowermost first sacrificial pattern SP3 of the first preliminary channel structure PST1 may be in contact with the first semiconductor pattern SP1. When the first semiconductor pattern SP1 is removed without the protective spacer SSP as in FIGS. 10A to 10C, the third sacrificial patterns SP3 may be partially damaged to form a structure shown in FIGS. 13A and 13B.

Subsequently, referring to FIGS. 14A to 14D, a buried dielectric layer may be conformally stacked on the entire surface of the substrate 100, to fill the second gap GAP2 through the first source/drain holes SDH1, and an etch-back process may be performed to form a lower separation dielectric pattern BDI in the second gap GAP2. In this step, the degree of the etch-back process may be adjusted to allow the lower separation dielectric pattern BDI to contact a sidewall of the lowermost first sacrificial pattern SP3. The etch-back process may cause the lower separation dielectric pattern BDI to have a concave top surface.

A selective epitaxial growth (SEG) process may be performed to form first source/drain patterns SD1 in the first source/drain holes SDH1. The first source/drain patterns SD1 may be grown from seeds, or the second semiconductor patterns SP2 and the first sacrificial patterns SP3 included in the first preliminary channel structure PST1. The selective epitaxial growth (SEG) process may include a chemical vapor deposition (CVD) process or a molecular beam epitaxy (MBE) process. The first source/drain patterns SD1 may be formed in-situ doped with impurities having a first conductivity type.

According to the present example embodiment, in a method of fabricating a semiconductor device, the third mask pattern MK3 may be used to form all of the first source/drain holes SDH1, the lower separation dielectric pattern BDI, and the first source/drain patterns SD1. Therefore, a separate mask pattern may not be desired to form the lower separation dielectric pattern BDI or the first source/drain patterns SD1, and accordingly, fabrication processes may be simplified.

Figure 15A:
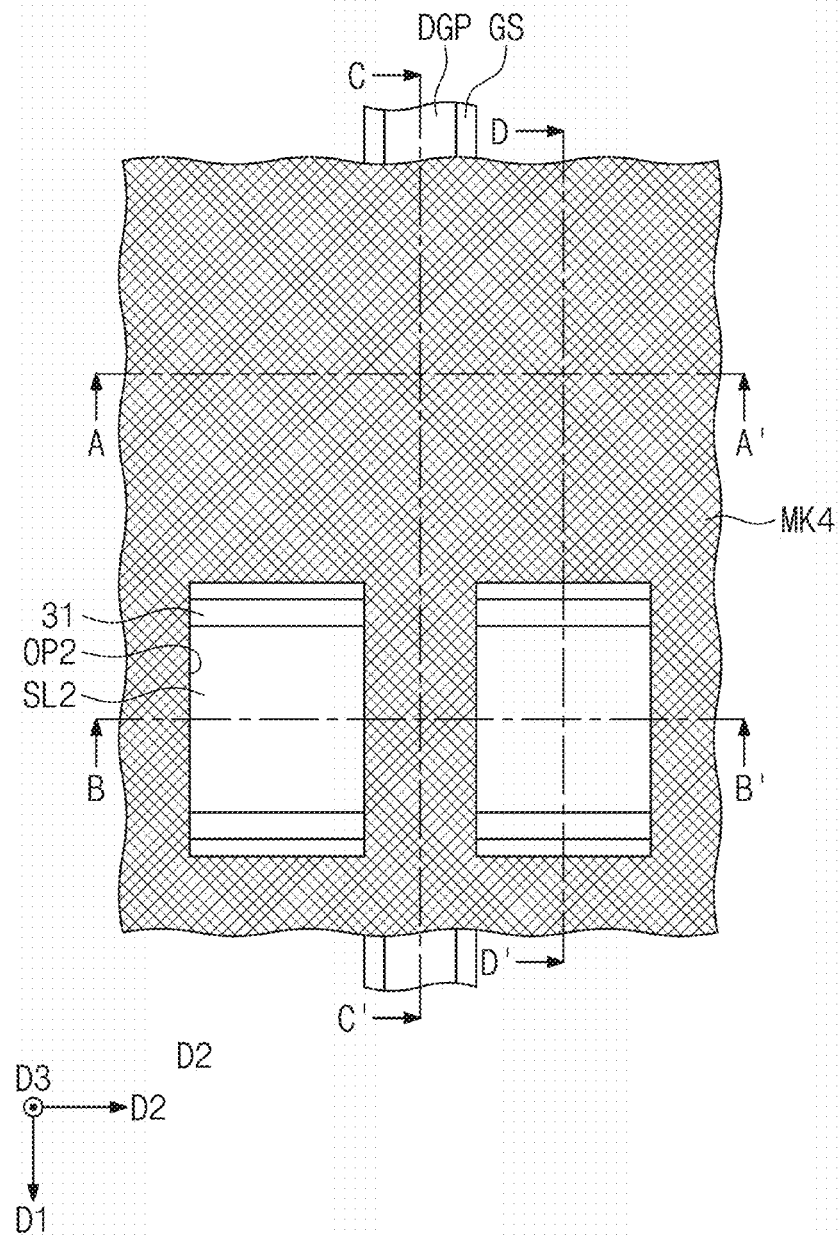
Figure 15B:
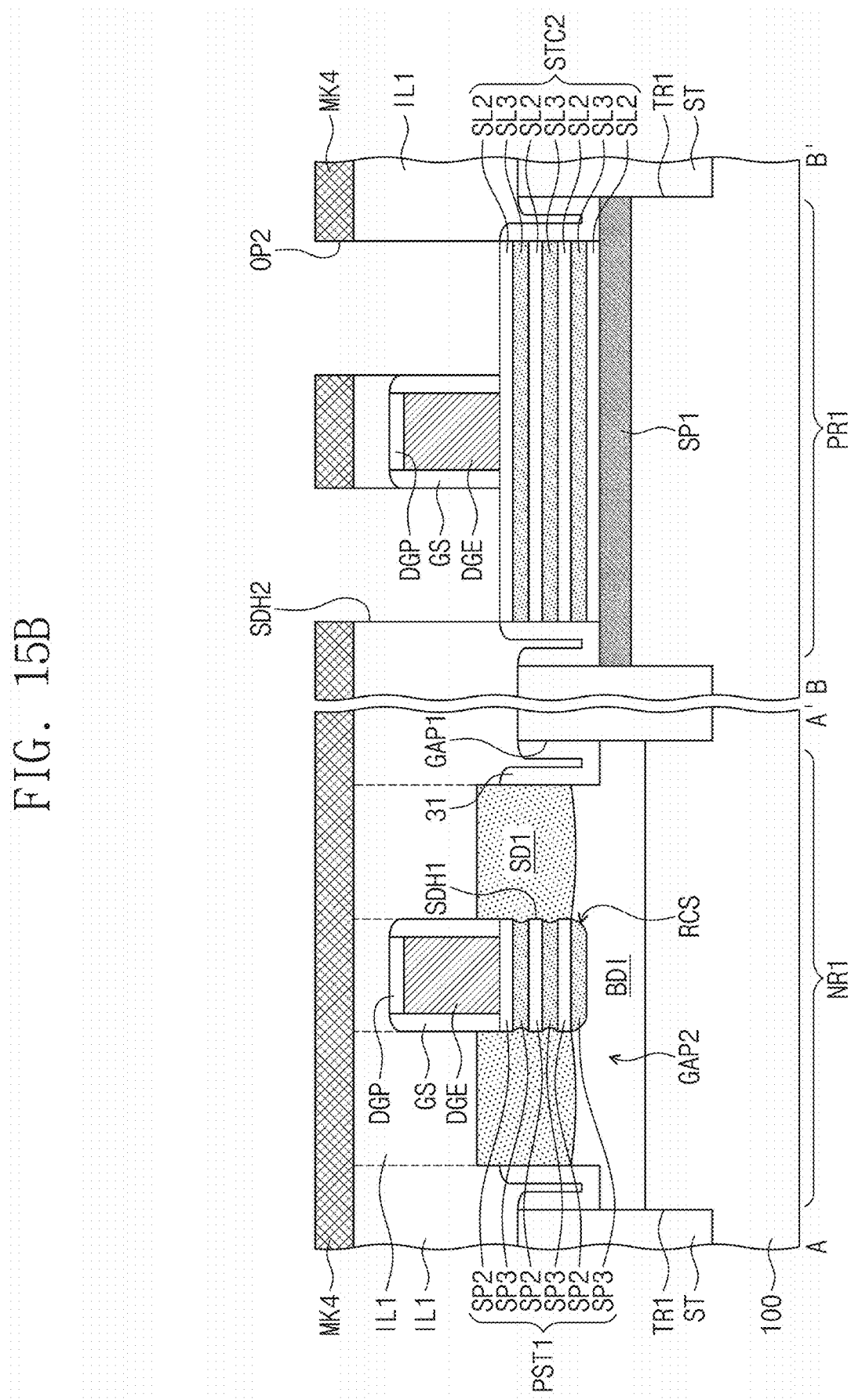
Figure 15C:
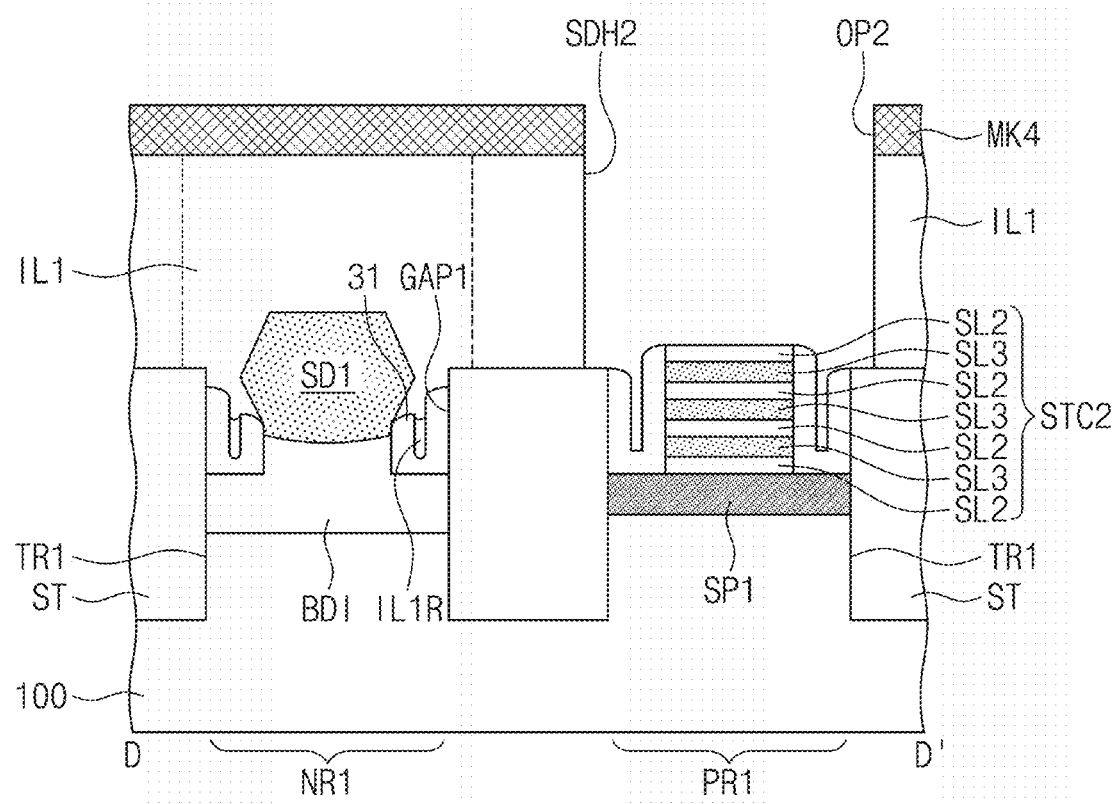

Referring to FIGS. 14A to 14D and 15A to 15C, a first interlayer dielectric layer IL1 may be stacked to fill the first source/drain holes SDH1. The third mask pattern MK3 may be removed to expose a top surface of the first interlayer dielectric layer IL1. A fourth mask pattern MK4 may be formed on the first interlayer dielectric layer IL1. The fourth mask pattern MK4 may be formed to have second openings OP2 that expose the second stack structure STC2 on opposite sides of the dummy gate electrode DGE on the second region PR1. The fourth mask pattern MK4 may be used as an etching mask to etch the first interlayer dielectric layer IL1 to form second source/drain holes SDH2 that expose the second stack structure STC2. FIG. 15C is a cross-section taken along line D-D' of FIG. 15A.

Figure 16A:
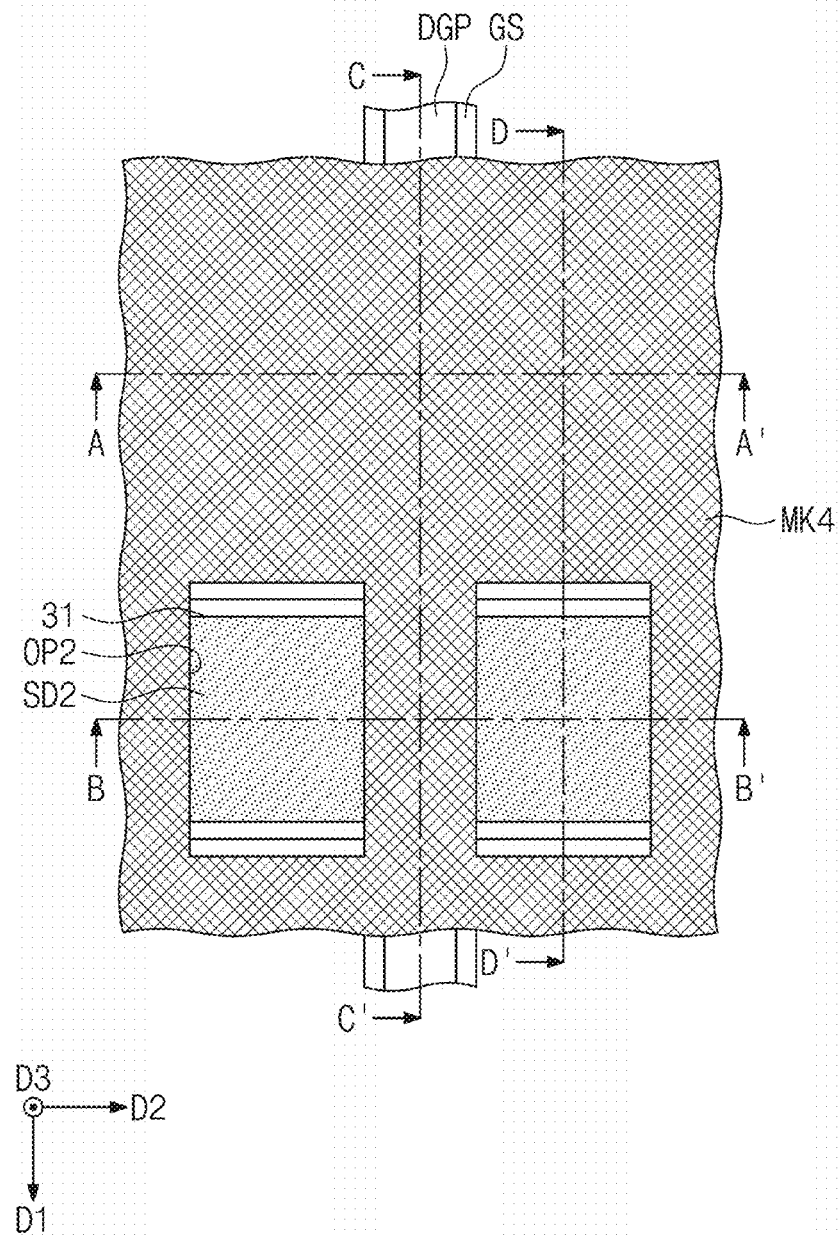
Figure 16B:
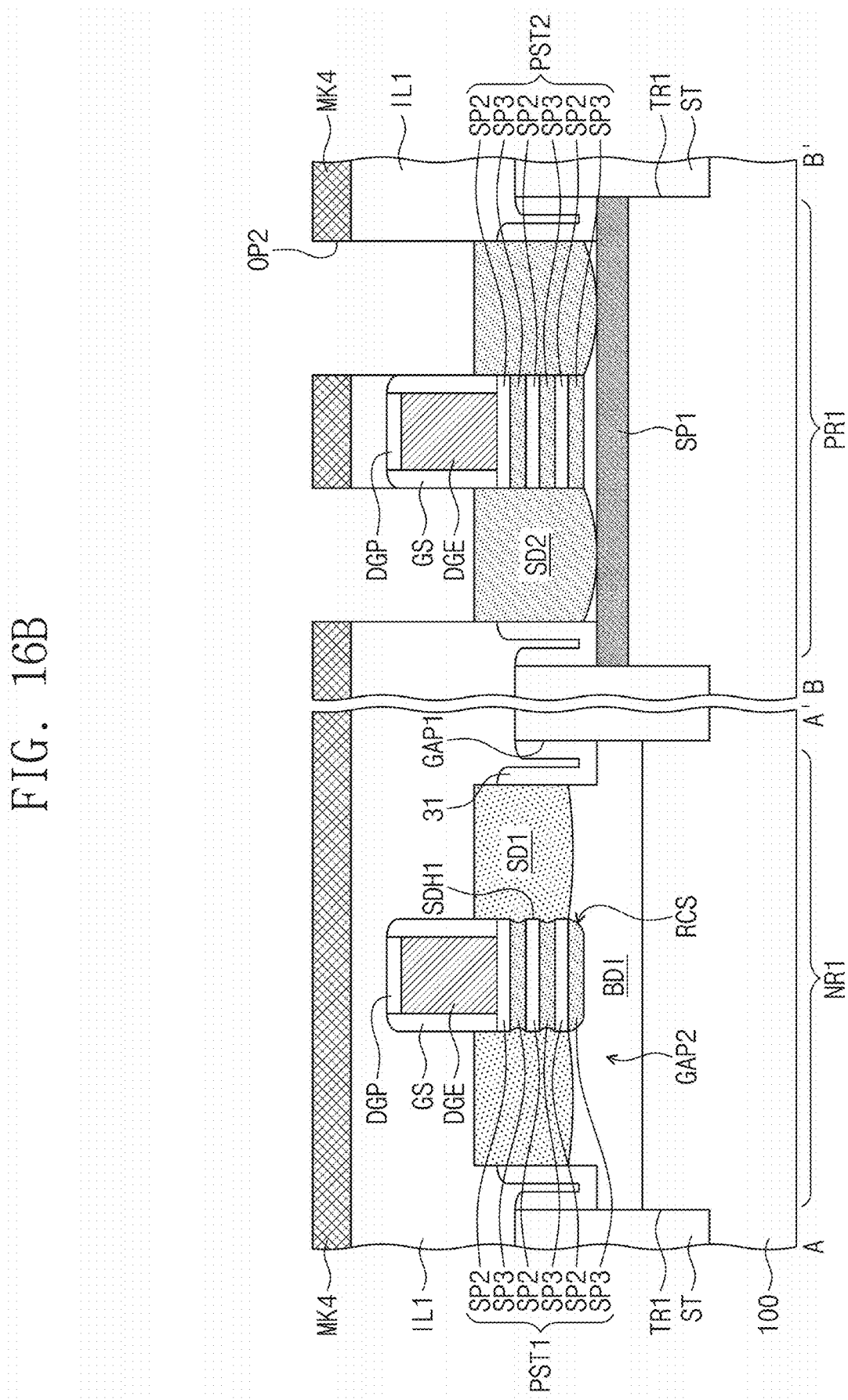
Figure 16C:
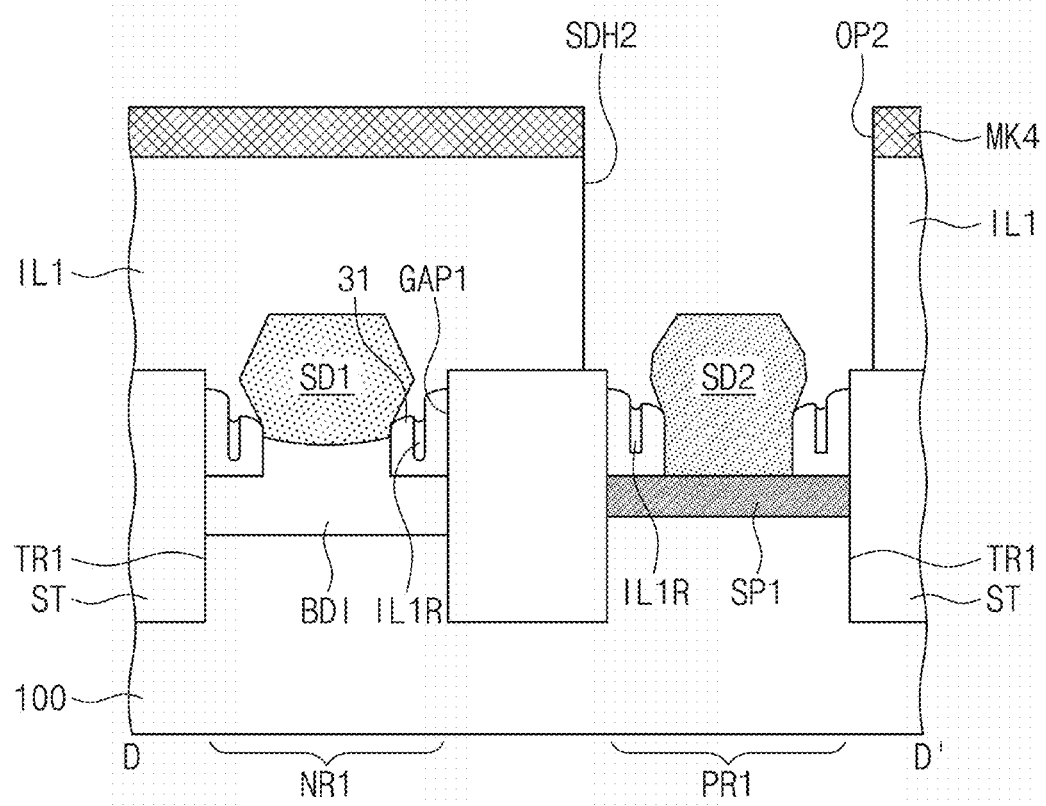
Figure 17A:
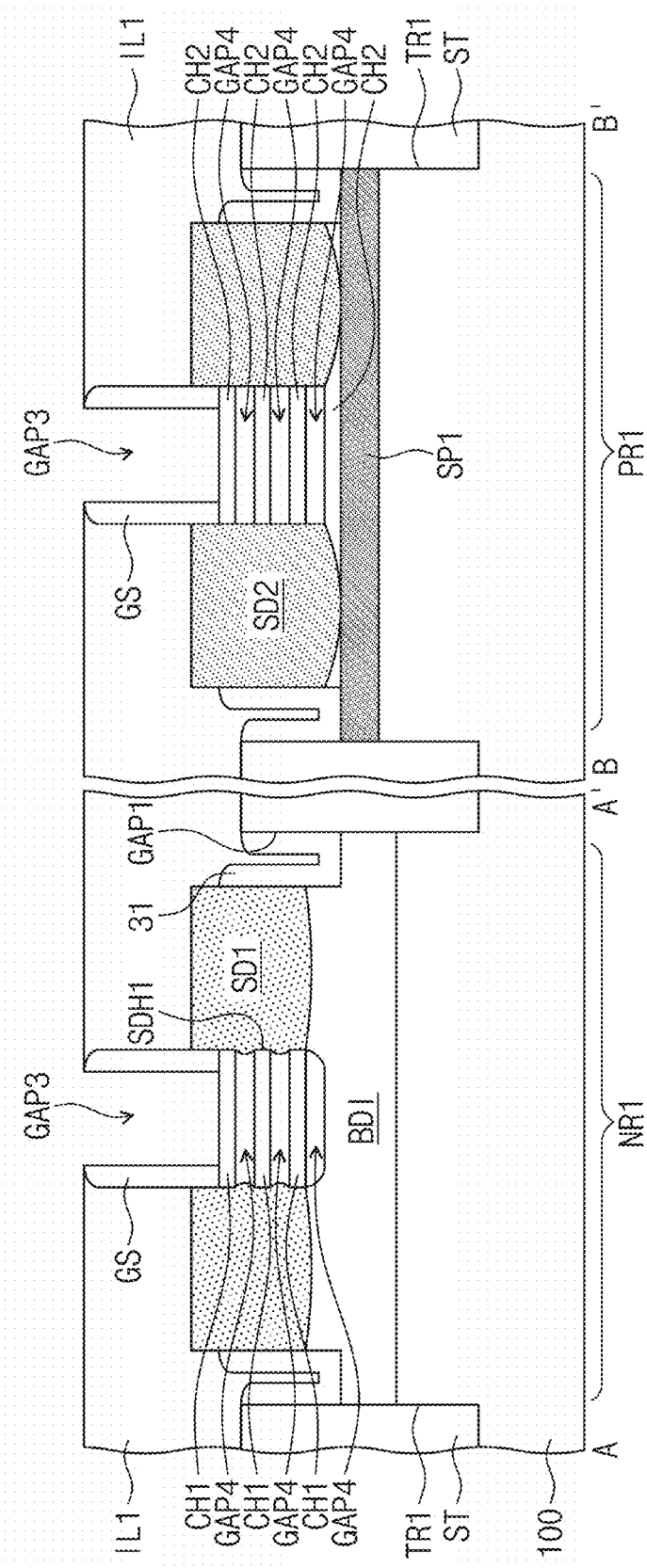
Figure 17B:
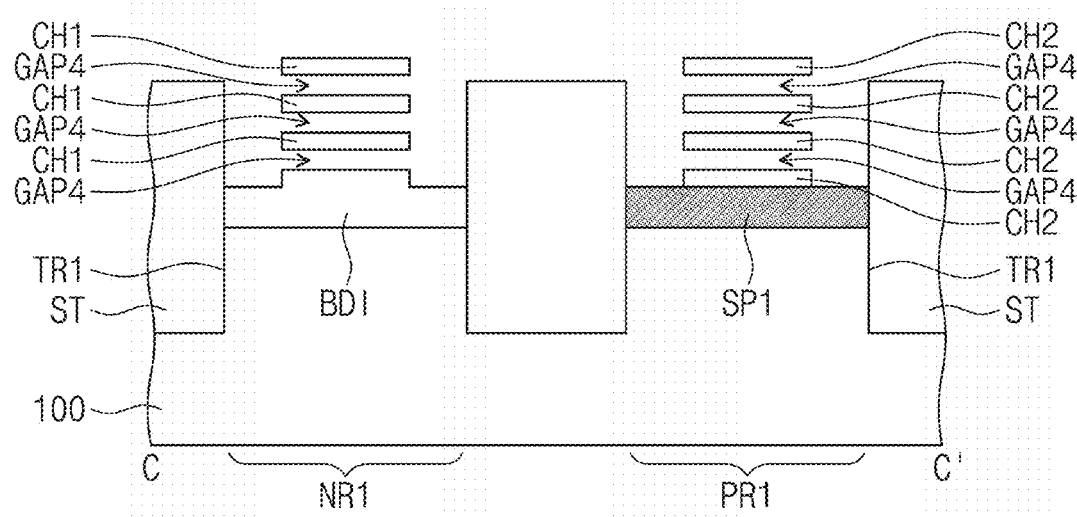

Referring to FIGS. 16A to 16C, the second stack structure STC2 exposed through the second source/drain holes SDH2 may be etched to expose the first semiconductor pattern SP1. Thus, on the second region PR1, a second preliminary channel structure PST2 may be formed below the dummy gate electrode DGE. The second preliminary channel structure PST2 may include the second semiconductor patterns SP2 and the first sacrificial patterns SP3 that are alternately stacked. FIG. 16C is a cross-section taken along line D-D' of FIG. 16A.

A selective epitaxial growth (SEG) process may be performed to form second source/drain patterns SD2 in the second source/drain holes SDH2. The second source/drain patterns SD2 may be grown from seeds, or the second semiconductor patterns SP2 and the first sacrificial patterns SP3 included in the second preliminary channel structure PST2 and also from the first semiconductor pattern SP1 that is used as a seed. When the second source/drain patterns SD2 are grown, the first semiconductor pattern SP1 may serve as a stress booster. The second source/drain patterns SD2 may be formed in-situ doped with impurities having a second conductivity type.

Referring to FIGS. 14A, 16A to 16C, 17A, and 17B, the second source/drain holes SDH2 may be filled with the first interlayer dielectric layer IL1. The fourth mask pattern MK4 may be removed to expose a top surface of the first interlayer dielectric layer IL1. The first interlayer dielectric layer IL1 may undergo an etch-back or polishing process to expose the dummy gate capping pattern DGP. The dummy gate capping pattern DGP and the dummy gate electrode DGE may be removed to form a third gap GAP3. Thus, sidewalls of the first and second preliminary channel structures PST1 and PST2 may be exposed in a direction the same as the cross-section of FIG. 14C. The first sacrificial patterns SP3 of the first and second preliminary channel structures PST1 and PST2 may be removed to form fourth gaps GAP4 between the second semiconductor patterns SP2. Subsequently, referring to FIGS. 1 and 2A to 2C, ordinary processes may be performed to form gate dielectric layers GI1 and GI2, gate electrodes GE1 and GE2, a gate capping pattern GP, and a gate separation dielectric pattern CT.

In a method of fabricating a semiconductor device according to some example embodiments of the present inventive concepts, the lower separation dielectric pattern BDI may be formed on the first region NR1, and thus a well region may not be desired. Therefore, fabrication processes may be simplified, and areas may be reduced, thereby increasing a manufacturing yield. In addition, when the second source/drain pattern SD2 is formed on the second region PR1, the first semiconductor pattern SP1 may be used as a stress booster. Thus, a PMOSFET may increase in performance.

Figure 18A:
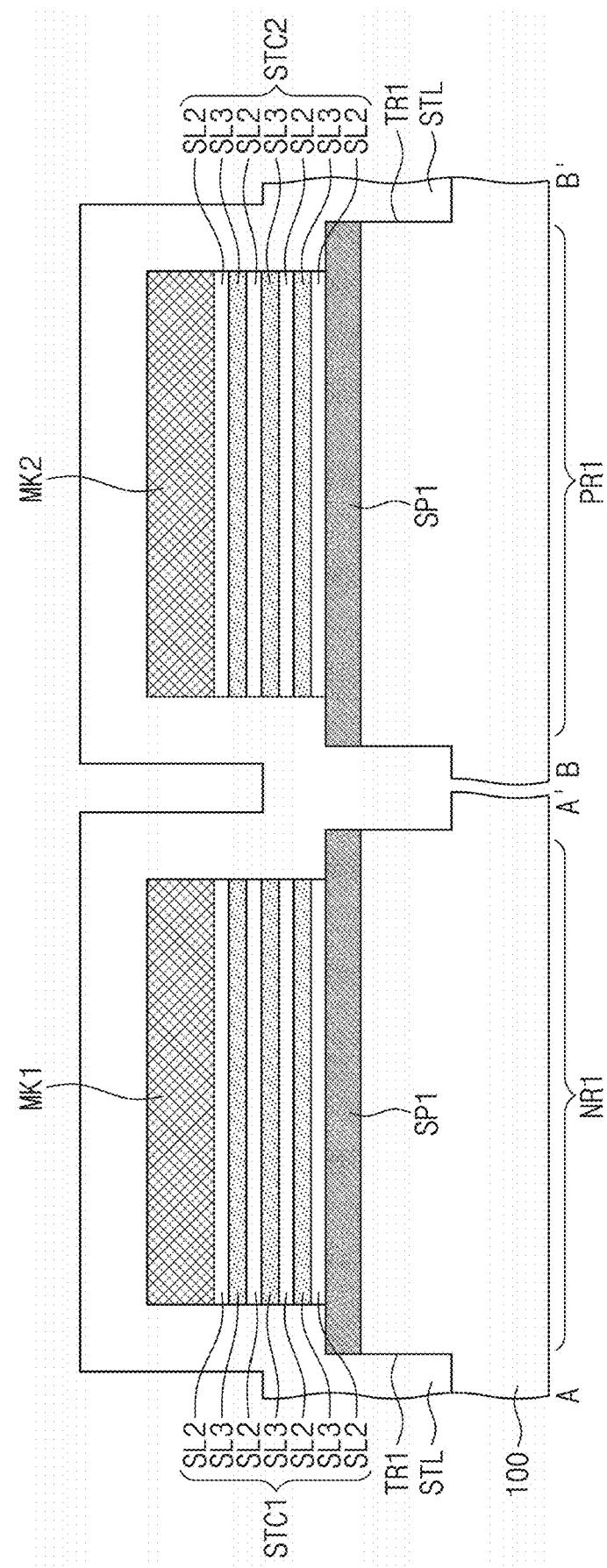
FIG. 18A illustrates a cross-sectional view showing a method of fabricating a semiconductor device having the cross-sectional view of FIG. 2A, according to some example embodiments of the present inventive concepts.
Figure 18B:
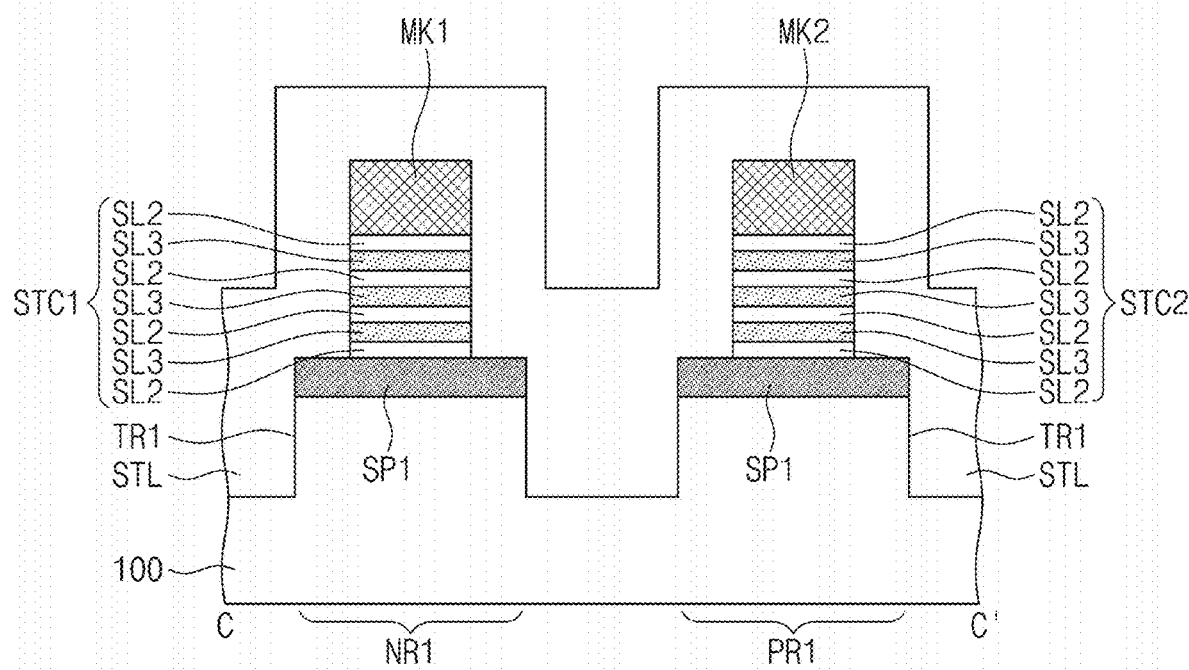
FIG. 18B illustrates a cross-sectional view showing a method of fabricating a semiconductor device having the cross-sectional view of FIG. 2B, according to some example embodiments of the present inventive concepts.

FIG. 18A illustrates a cross-sectional view showing a method of fabricating a semiconductor device that has the cross-sectional view of FIG. 2A, according to some example embodiments of the present inventive concepts. FIG. 18B illustrates a cross-sectional view showing a method of fabricating a semiconductor device that has the cross-sectional view of FIG. 2B, according to some example embodiments of the present inventive concepts.

Referring to FIGS. 18A and 18B, in a step of FIGS. 5A to 5C, the first and second mask patterns MK1 and MK2 and the sacrificial spacers 33 may be used such that the first semiconductor layer SL1 and the substrate 100 may be etched to form first trenches TR1 and simultaneously to form first semiconductor patterns SP1. The sacrificial spacers 33 may be removed to expose sidewalls of the first and second stack structures STC1 and STC2. A device isolation layer STL may be formed on the entire surface of the substrate 100 to fill the first trenches TR1. Subsequently, the device isolation layer STL may undergo an etch-back process to form a device isolation pattern ST of FIGS. 7A to 7C. Subsequently, there may be performed the processes discussed with reference to FIGS. 8A to 17B.

Figure 19A:
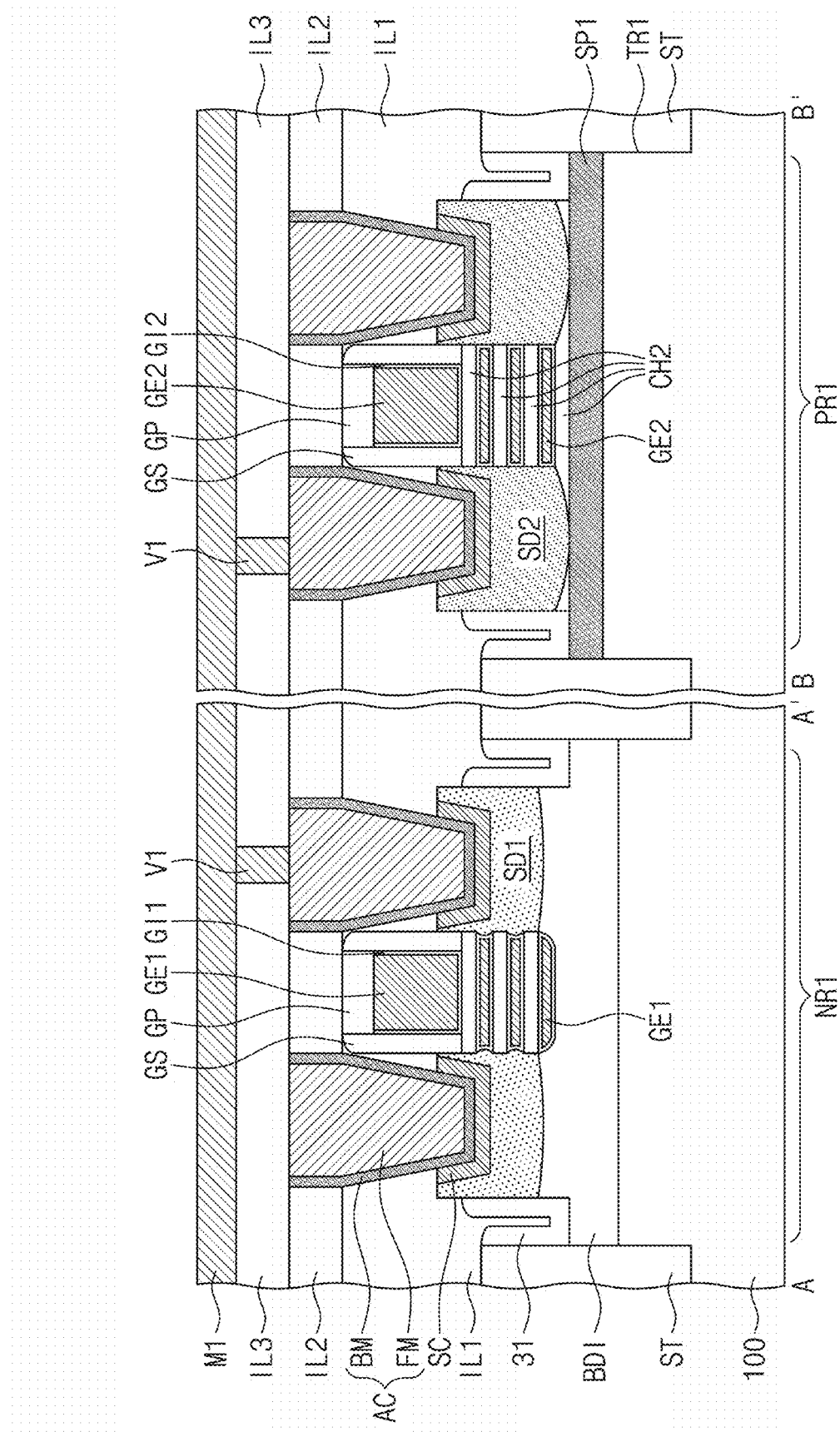
FIGS. 19A and 19B illustrate cross-sectional views taken along lines A-A' and B-B' of FIG. 1, according to some example embodiments of the present inventive concepts.
Figure 19B:
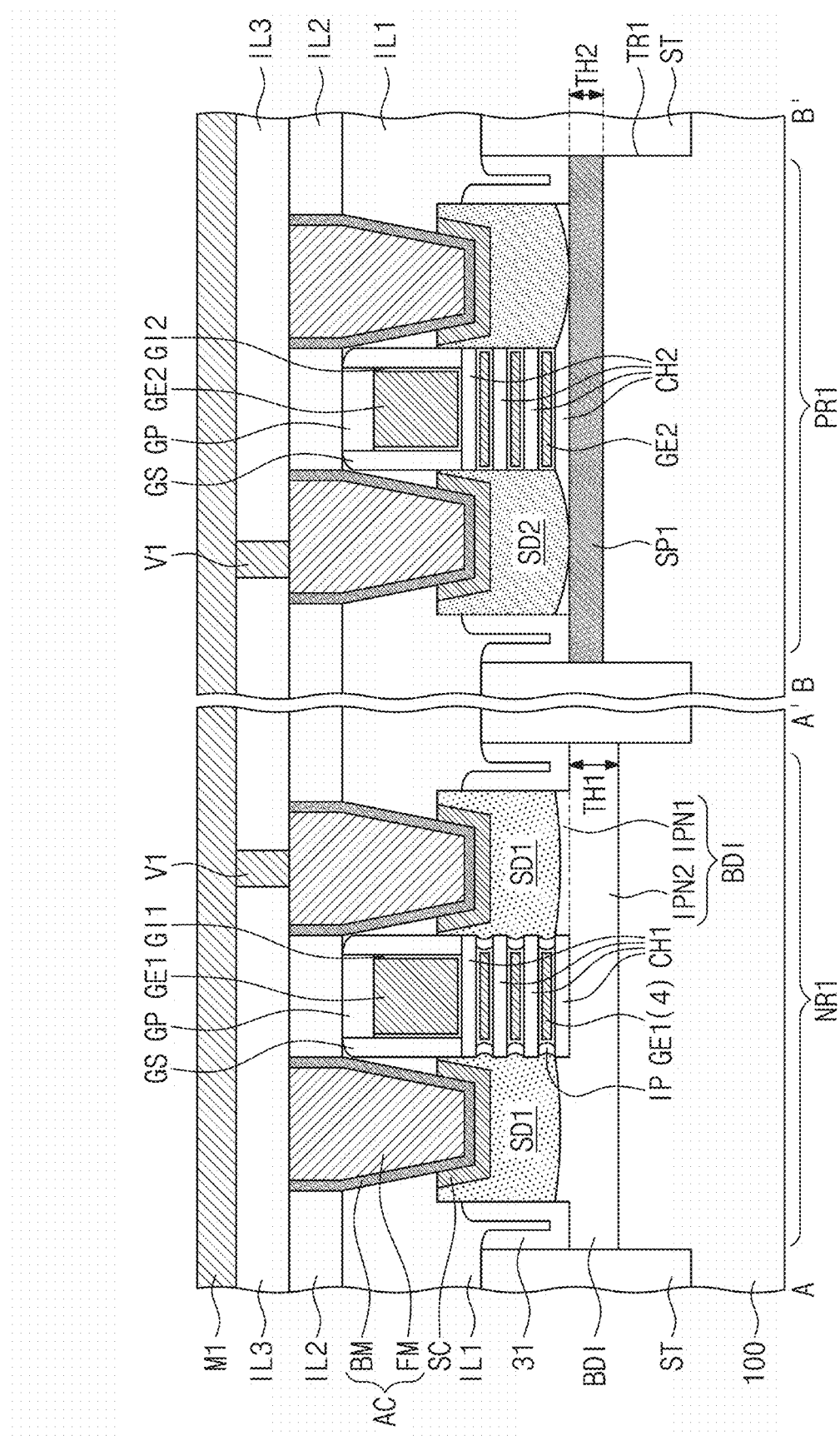

FIGS. 19A and 19B illustrate cross-sectional views taken along lines A-A' and B-B' of FIG. 1, according to some example embodiments of the present inventive concepts.

Referring to FIG. 19A, a semiconductor device according to the present example embodiment may be configured such that, on the first region NR1, the side dielectric patterns IP are absent between the first gate electrode GE1 and the first source/drain patterns SD1. Other configurations may be identical or similar to those discussed with reference to FIG. 2A.

Referring to FIG. 19B, a semiconductor device according to the present example embodiment may be configured such that the first channel pattern CH1 is additionally present below the lowermost first gate electrode part GE1(4) of the first gate electrode GE1 in a structure of FIG. 2A. Thus, the lowermost first channel pattern CH1 may be in contact with the lower separation dielectric pattern BDI. In some example embodiments, the lowermost first gate electrode part GE1(4) may have a concave sidewall. In this case, the second dielectric part IPN2 of the lower separation dielectric pattern BDI may have a first thickness TH1 which is the same as a second thickness TH2 of the first semiconductor pattern SP1. The lower separation dielectric pattern BDI may have a bottom surface located at the same level as that of a bottom surface of the first semiconductor pattern SP1.

Figure 11A:
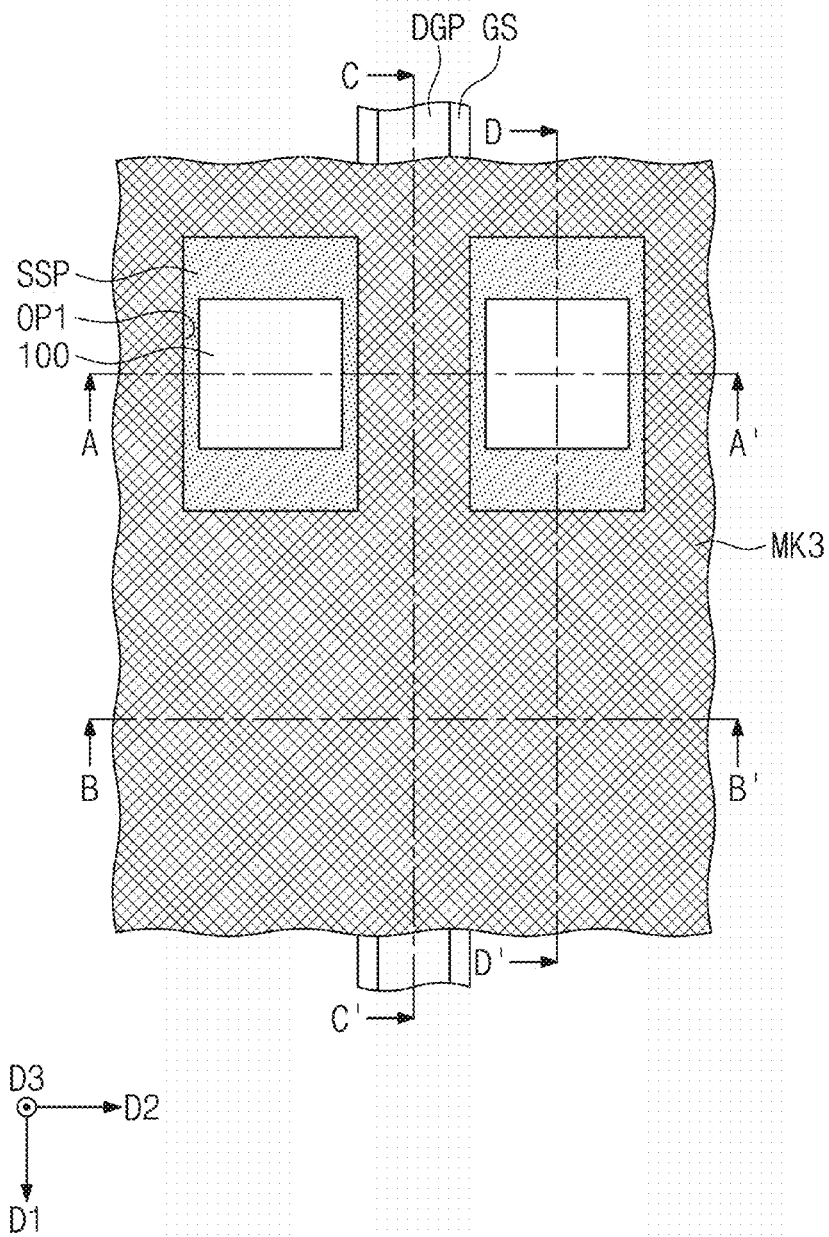
Figure 11B:
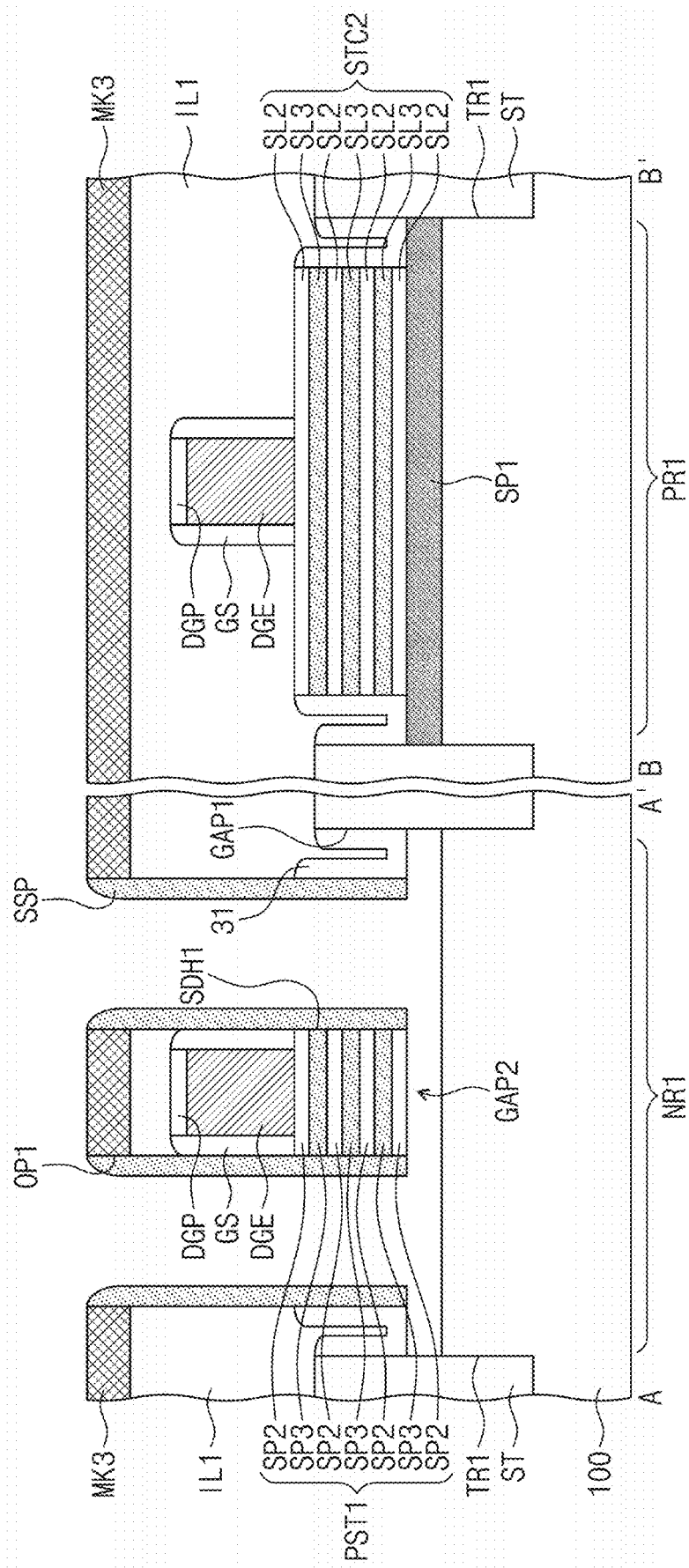
Figure 11C:
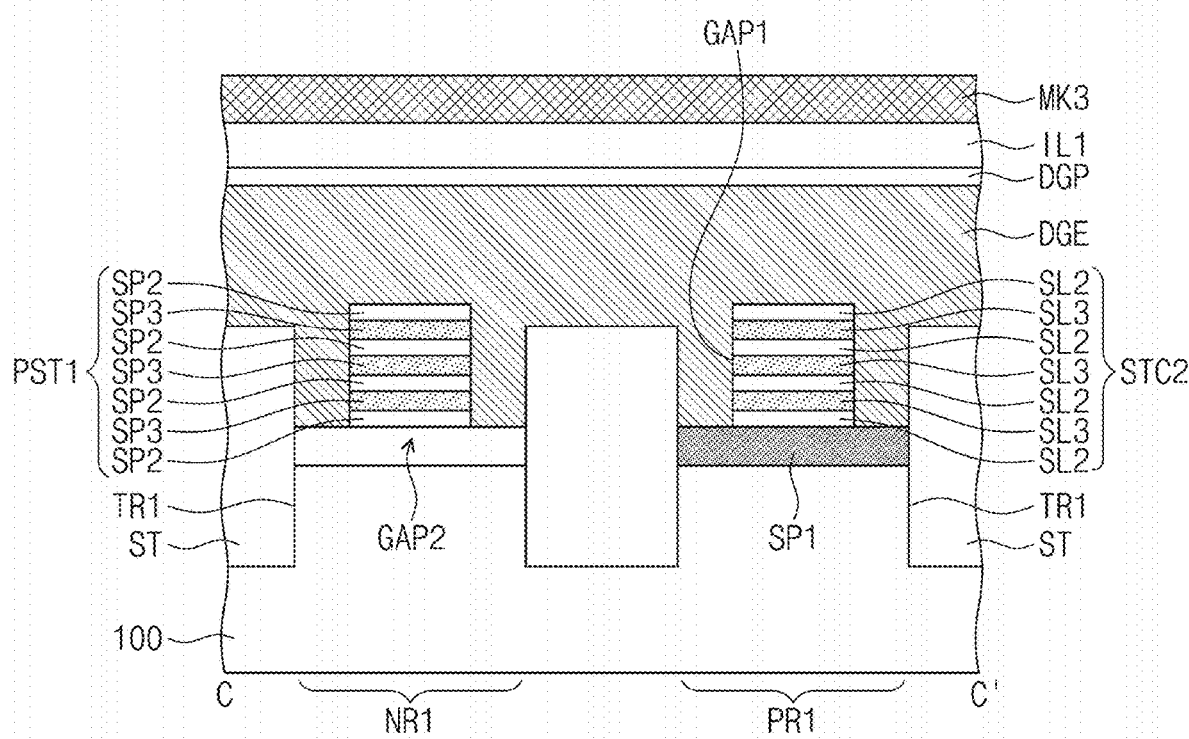
Figure 11D:
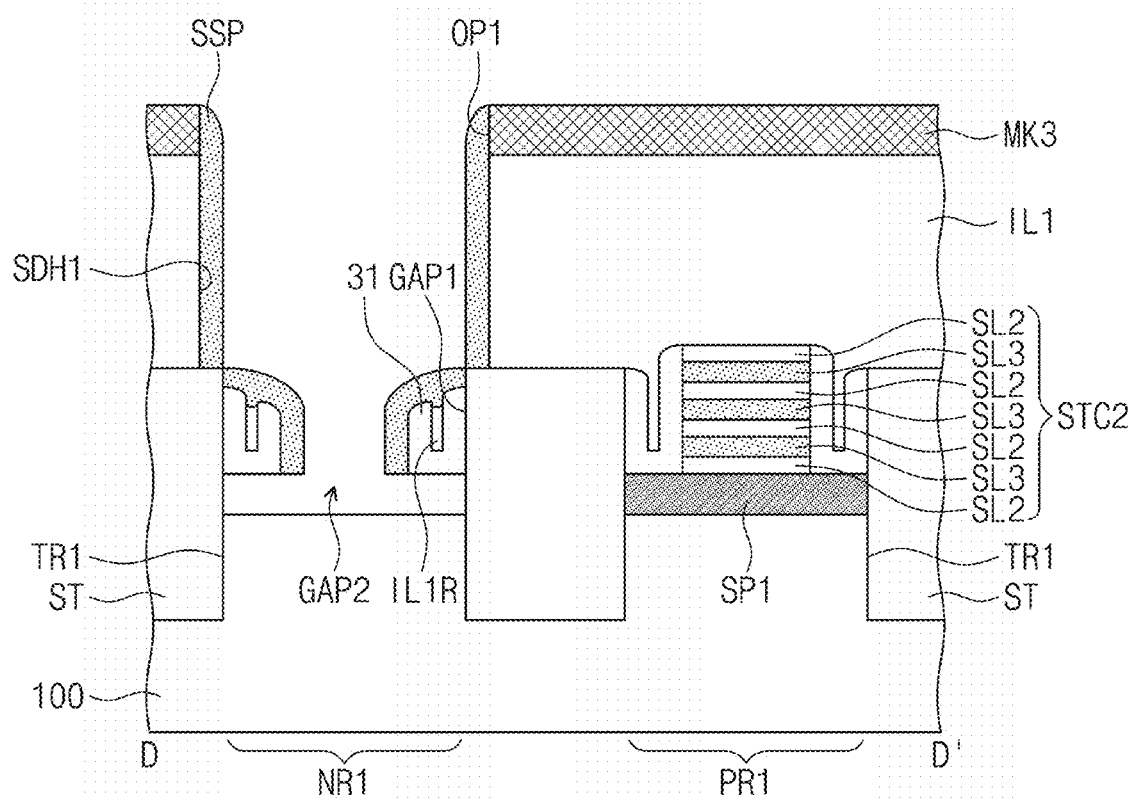

The semiconductor device of FIG. 19B may be fabricated by immediately removing the protective spacer SSP in a step of FIGS. 11A to 11C and forming the lower separation dielectric pattern BDI without performing partial removal of the lowermost first channel pattern CH1 and the substrate 100 as discussed with reference to FIGS. 12A to 12C.

Figure 20A:
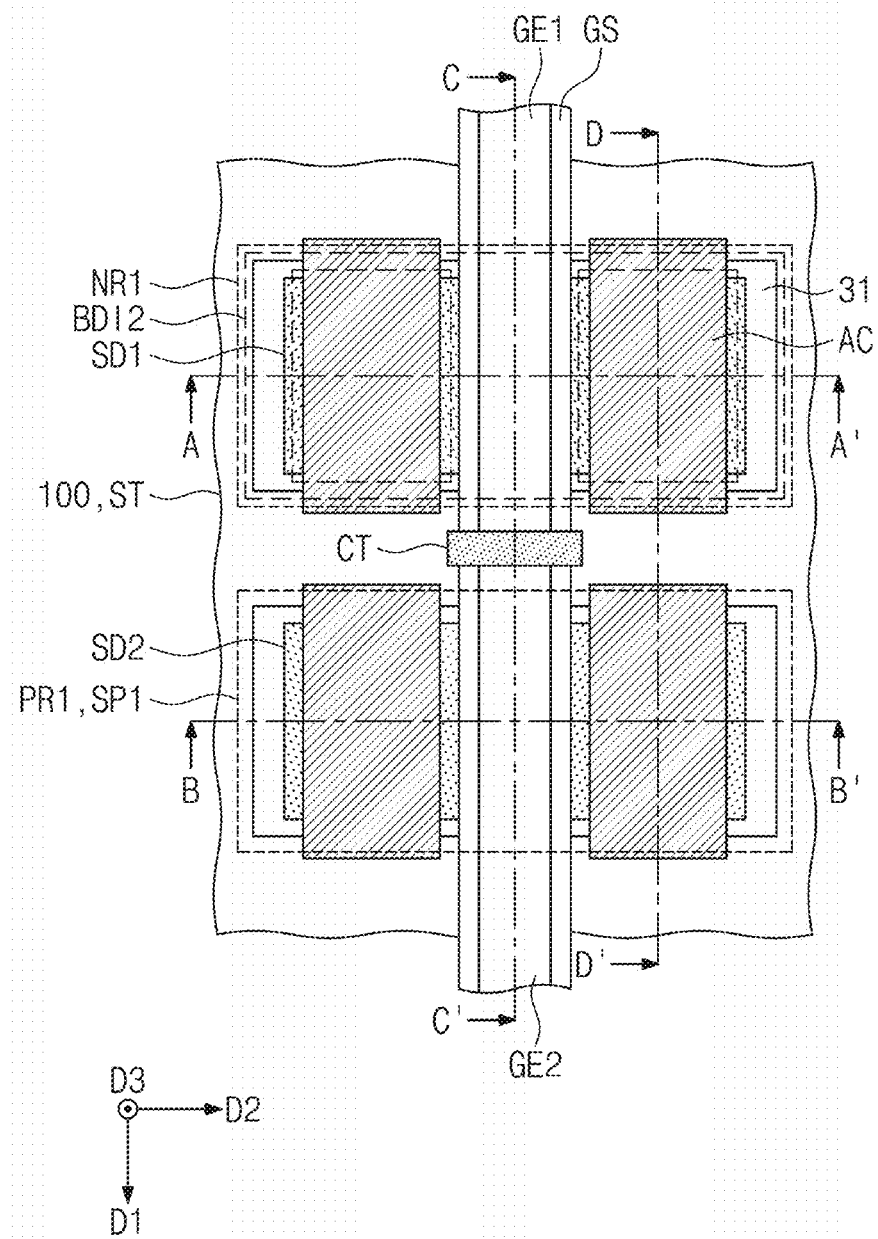
FIG. 20A illustrates a plan view showing a semiconductor device according to some example embodiments of the present inventive concepts.
Figure 20B:
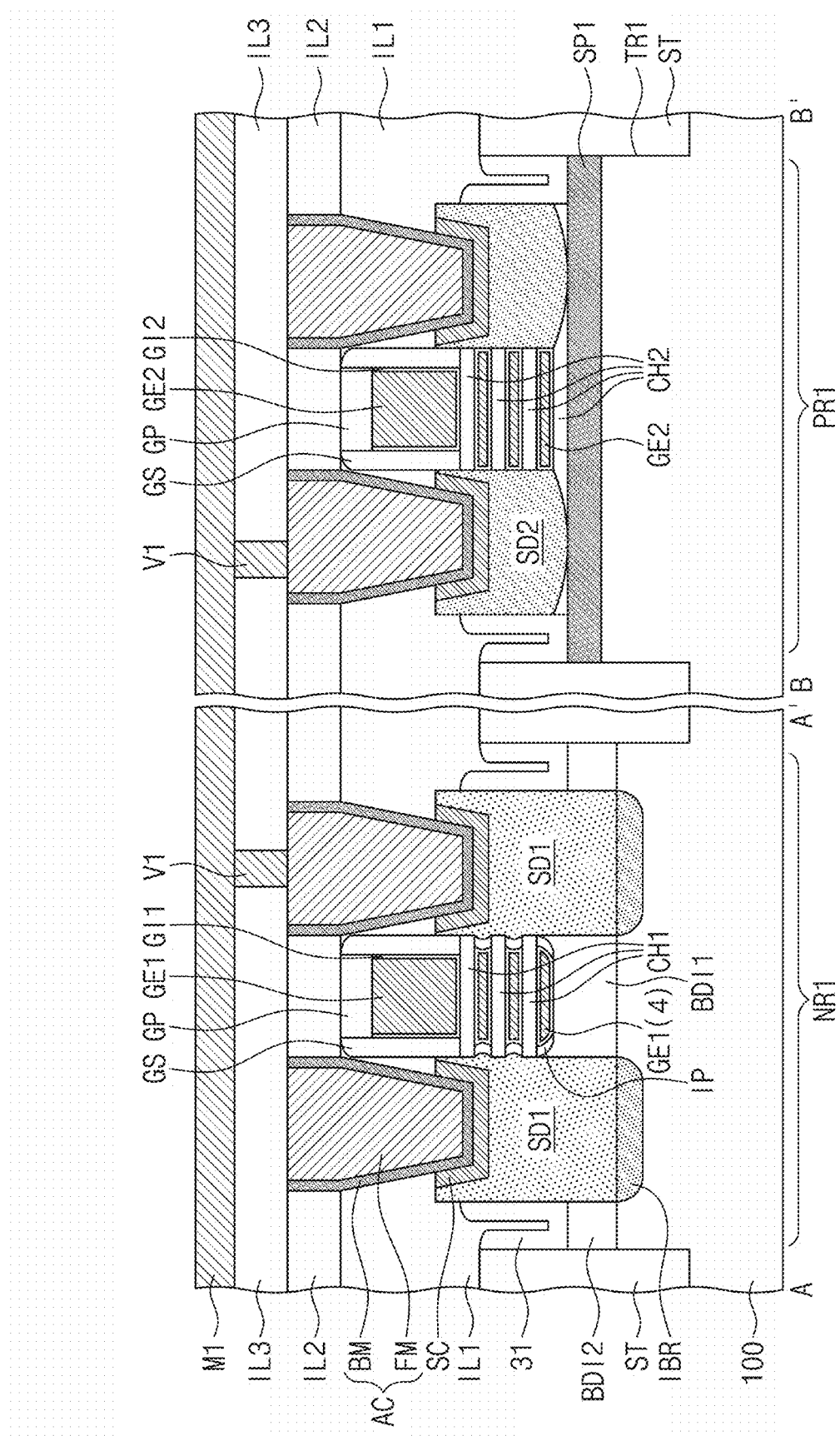
FIG. 20B illustrates a cross-sectional view taken along lines A-A' and B-B' of FIG. 20A, according to some example embodiments of the present inventive concepts.
Figure 20C:
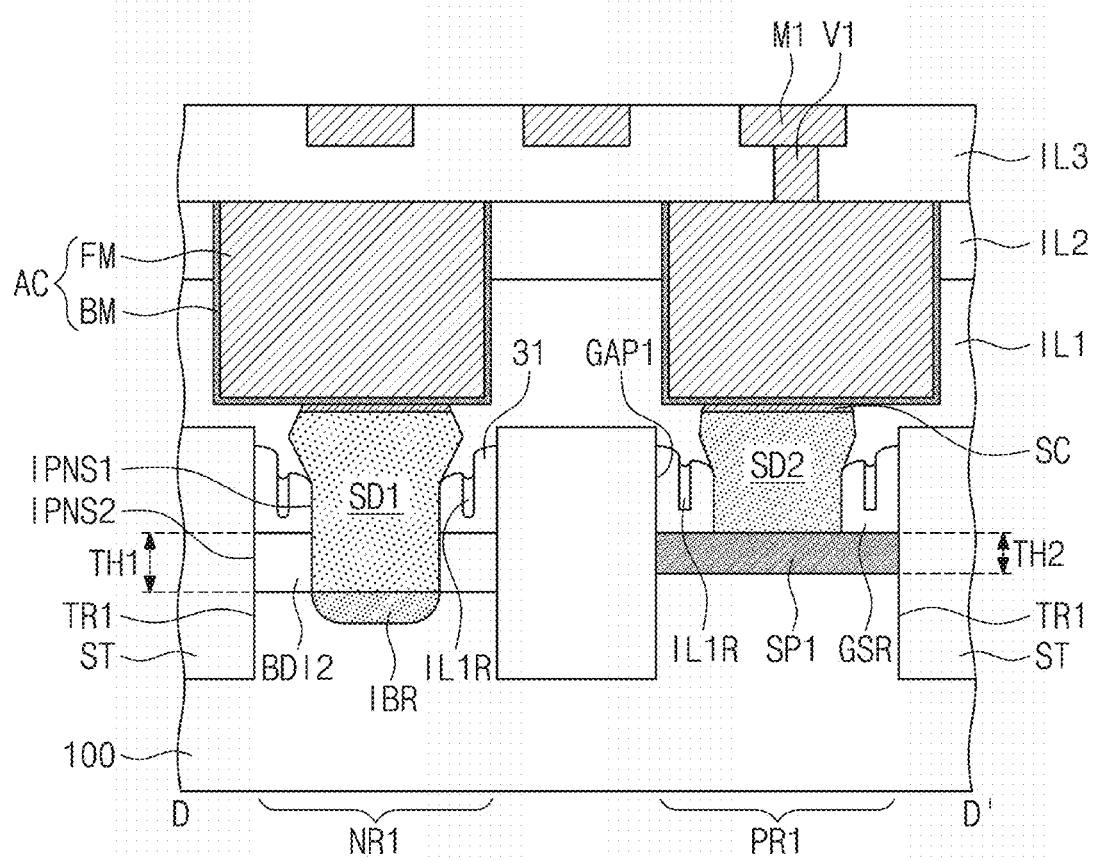
FIG. 20C illustrates a cross-sectional view taken along line D-D' of FIG. 20A, according to some example embodiments of the present inventive concepts.

FIG. 20A illustrates a plan view showing a semiconductor device according to some example embodiments of the present inventive concepts. FIG. 20B illustrates a cross-sectional view taken along lines A-A' and B-B' of FIG. 20A, according to some example embodiments of the present inventive concepts. FIG. 20C illustrates a cross-sectional view taken along line D-D' of FIG. 20A, according to some example embodiments of the present inventive concepts. A cross-section taken along line C-C' of FIG. 20A may be the same as FIG. 2B.

Referring to FIGS. 20A to 20C, a semiconductor device according to the present example embodiment may have a structure in which the first source/drain pattern SD1 penetrates the lower separation dielectric pattern BDI of the semiconductor device depicted in FIGS. 2A to 2C. In the present example embodiment, on the first region NR1, a first lower separation dielectric pattern BDI1 may be disposed below the first gate electrode GE1, and a second lower separation dielectric pattern BDI2 may be disposed below the residual spacer pattern 31. The first lower separation dielectric pattern BDI1 may cover a lateral surface of the lowermost first gate electrode part GE1(4). The first lower separation dielectric pattern BDI1 and the second lower separation dielectric pattern BDI2 may be connected when viewed in plan as shown in FIG. 20A.

The first source/drain pattern SD1 may have a bottom surface lower than that of the first semiconductor pattern SP1. The first and second lower separation dielectric patterns BDI1 and BDI2 may each have a first thickness TH1, and the first thickness TH1 may be the same as or greater than a second thickness TH2 of the first semiconductor pattern SP1. The first and second lower separation dielectric patterns BDI1 and BDI2 may have their bottom surfaces at a lower level than that of a bottom surface of the first semiconductor pattern SP1.

A barrier region IBR may be disposed below the first source/drain pattern SD1. The barrier region IBR may be doped with impurities having a first conductivity type which is the same as that of impurities doped into the first source/drain pattern SD1, and a concentration of the impurities in the barrier region IBR may be less than that of the impurities in the first source/drain pattern SD1. In some example embodiments, the barrier region IBR may be doped with impurities having a second conductivity type opposite to the first conductivity type. The barrier region IBR may mitigate or prevent a short-channel effect. The barrier region IBR may be disposed in the substrate 100. The barrier region IBR may have a bottom end lower than a bottom surface of the first lower separation dielectric pattern BDI1. Other configurations may be identical or similar to those discussed with reference to FIGS. 1 to 3.

Figure 21A:
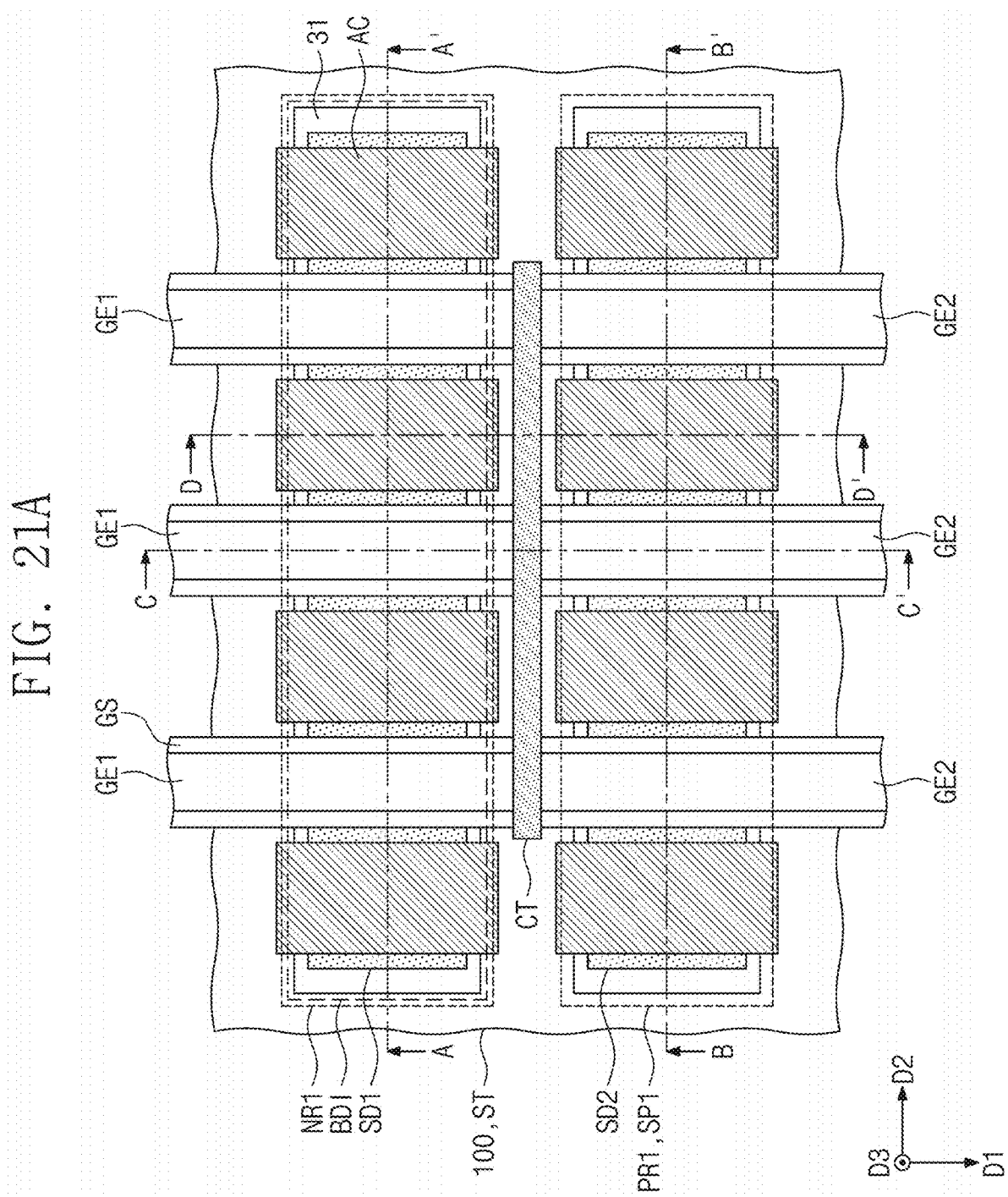
FIG. 21A illustrates a plan view showing a semiconductor device according to some example embodiments of the present inventive concepts.
Figure 21B:
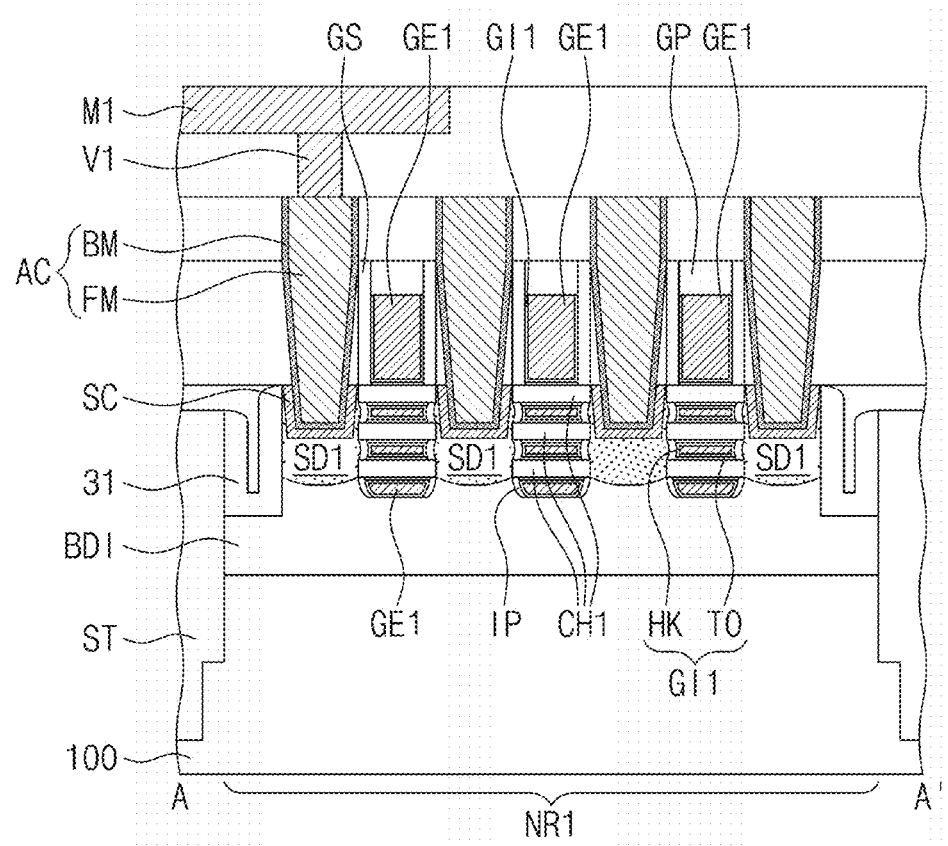
FIG. 21B illustrates a cross-sectional view taken along line A-A' of FIG. 21A, according to some example embodiments of the present inventive concepts.
Figure 21C:
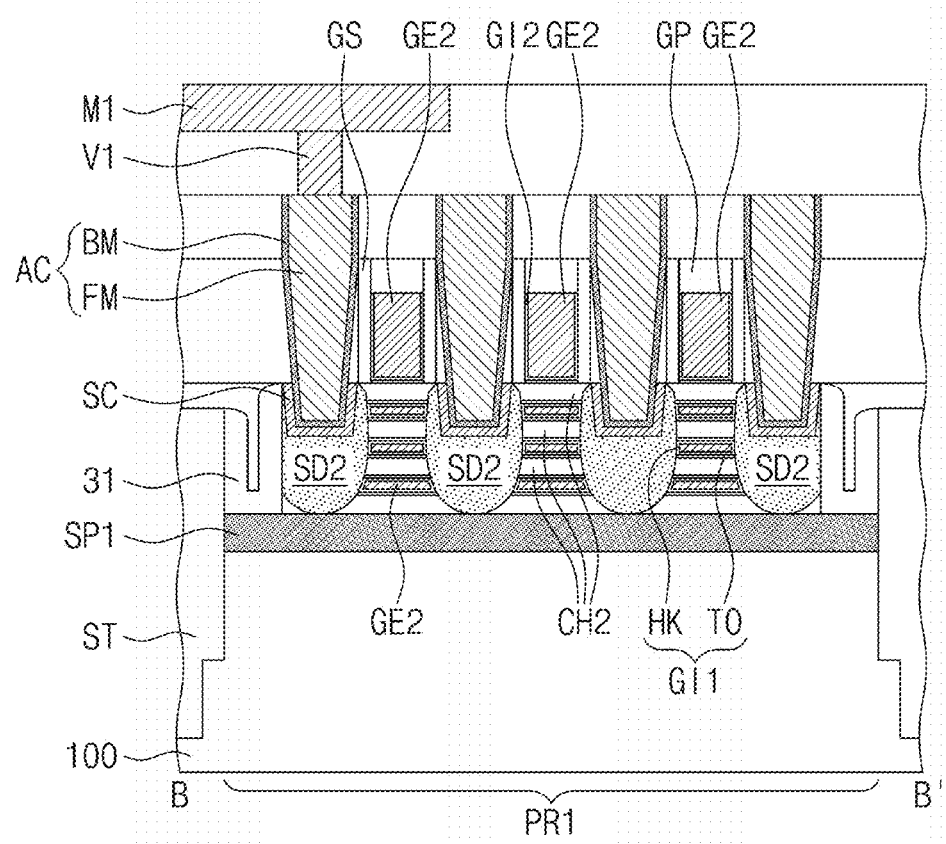
FIG. 21C illustrates a cross-sectional view taken along line B-B' of FIG. 21A, according to some example embodiments of the present inventive concepts.

FIG. 21A illustrates a plan view showing a semiconductor device according to some example embodiments of the present inventive concepts. FIG. 21B illustrates a cross-sectional view taken along line A-A' of FIG. 21A, according to some example embodiments of the present inventive concepts. FIG. 21C illustrates a cross-sectional view taken along line B-B' of FIG. 21A, according to some example embodiments of the present inventive concepts. A cross-section taken along line C-C' of FIG. 21A may be identical or similar to FIG. 2B. A cross-section taken along line D-D' of FIG. 21A may identical or similar to FIG. 2C.

Referring to FIGS. 21A to 21C, three first gate electrodes GE1 may run across the first region NR1. Three second gate electrodes GE2 may run across the second region PR1. The gate separation dielectric pattern CT may separate the first gate electrodes GE1 from the second gate electrodes GE2. The first source/drain patterns SD1 may be disposed on opposite sides of each of the first gate electrodes GE1. The lower separation dielectric pattern BDI may separate the first source/drain patterns SD1 from the substrate 100. The second source/drain patterns SD2 may be disposed on opposite sides of each of the second gate electrodes GE2. The second source/drain patterns SD2 may be in contact with the first semiconductor pattern SP1.

In a semiconductor device of FIGS. 21A to 21C, three NMOS field effect transistors may be disposed on the first region NR1 and three PMOS field effect transistors may be disposed on the second region PR1, and the NMOS and PMOS field effect transistors may be used to constitute a single gate (SG) device that is substitutable for an extra gate (EG) device or a high-voltage transistor operated at high voltage.

A semiconductor device according to the present example embodiment may be configured such that the first source/drain patterns SD1 on the first region NR1 are insulated through the lower separation dielectric pattern BDI from the substrate 100. For example, NMOSFETs disposed on the first region NR1 may not be connected to a well of the substrate 100, and thus no punch-through leakage may be present. Thus, because well isolation is not desired, an area for forming a well region may not be needed. Thus, a semiconductor chip size may be reduced and high integration may be achieved. In addition, because a process for forming the well region is not desired, an entire fabrication process may be simplified. The lower separation dielectric pattern BDI may be used to replace an extra gate (EG) device or a high-voltage transistor operated at high voltage may be replaced with a plurality of single gate (SG) devices or a plurality of low-voltage transistors. Other configurations may be identical or similar to those discussed with reference to FIGS. 1 to 3.

In a semiconductor device according to some example embodiments of the present inventive concepts, a lower separation dielectric pattern may be disposed on an NMOS region to mitigate or prevent short-channel effect and punch-through leakage and to increase on-current and performance of the semiconductor device. In addition, a lower separation dielectric pattern and a protruding device isolation pattern may reduce parasitic capacitance, and therefore an operating error may be mitigated or prevented, thereby increasing reliability of the semiconductor device.

In a semiconductor device according to some example embodiments of the present inventive concepts, a first semiconductor pattern formed of silicon-germanium may be disposed on a PMOS region, and the first semiconductor pattern may be used as a stress booster when second source/drain patterns are formed. A second channel pattern may thus be provided with compressive stress. Accordingly, a PMOSFET may have increased hole mobility and the device may increase in operating speed.

In a method of fabricating a semiconductor device according to some example embodiments of the present inventive concepts, one mask pattern may be used to form all of first source/drain holes, a lower separation dielectric pattern, and first source/drain patterns, and accordingly fabrication processes may be simplified. In addition, the lower separation dielectric pattern may be formed, and thus a well region may not be desired to be formed separately. Accordingly, an area for forming the well region may not be needed, and thus a size of the semiconductor device may be reduced. Further, fabrication processes may be simplified, and thus a manufacturing yield may be increased.

Although the present inventive concepts have been described in connection with some example embodiments illustrated in the accompanying drawings, it will be understood to those skilled in the art that various changes and modifications may be made without departing from the technical spirit and essential feature of the disclosed example embodiments. It will be apparent to those skilled in the art that various substitution, modifications, and changes may be thereto without departing from the scope and spirit of the present inventive concepts.

What is claimed is:

1. A semiconductor device, comprising:
    a substrate including a first region and a second region;
    a device isolation pattern in the substrate, the device isolation pattern defining the first region and the second region;
    a lower separation dielectric pattern on the first region of the substrate;
    a plurality of first channel patterns stacked on the lower separation dielectric pattern;
    a first gate electrode on the first channel patterns, the first gate electrode including a first gate part between the lower separation dielectric pattern and a lowermost one of the first channel patterns; and
    a plurality of first source/drain patterns on opposite sides of the first gate electrode and in contact with lateral surfaces of the first channel patterns,
    wherein a bottom surface of the lower separation dielectric pattern is at a level higher than or equal to a level of a bottom surface of the device isolation pattern, and
    wherein a top end of the lower separation dielectric pattern is at a level higher than a level of a bottom surface of the first gate part,
    wherein each of the plurality of first source/drain patterns are spaced apart from the device isolation pattern.

2. The semiconductor device of claim 1, further comprising:
    a first semiconductor pattern on the second region of the substrate, the first semiconductor pattern including a material different from a material of the substrate;
    a plurality of second channel patterns stacked on the first semiconductor pattern;
    a second gate electrode on the second channel patterns, a portion of the second gate electrode being between the second channel patterns; and
    a plurality of second source/drain patterns on opposite sides of the second gate electrode and in contact with lateral surfaces of the second channel patterns,
    wherein the level of the bottom surface of the lower separation dielectric pattern is lower than or equal to a level of a bottom surface of the first semiconductor pattern.

3. The semiconductor device of claim 2, wherein the substrate includes silicon, and the first semiconductor pattern includes silicon-germanium.

4. The semiconductor device of claim 2, wherein the first region is an NMOS region, and the second region is a PMOS region.

5. The semiconductor device of claim 2, wherein the lower separation dielectric pattern includes, a first dielectric part in contact with the device isolation pattern, and a second dielectric part on the first dielectric part and spaced apart from the device isolation pattern, and a thickness of the first dielectric part is same as or greater than a thickness of the first semiconductor pattern.

6. The semiconductor device of claim 1, wherein a lateral surface of the first gate part is rounded, and a width of the first gate part decreases in a downward direction.

7. The semiconductor device of claim 1, wherein the first gate electrode further includes a plurality of second gate parts between the first channel patterns, wherein lateral surfaces of the second gate parts are concave.

8. The semiconductor device of claim 1, wherein a lower sidewall of the lower separation dielectric pattern is in contact with the device isolation pattern, and an upper sidewall of the lower separation dielectric pattern is spaced apart from the device isolation pattern.

9. The semiconductor device of claim 8, further comprising:
- a residual spacer pattern between the device isolation pattern and the upper sidewall of the lower separation dielectric pattern; and
- a first gate spacer covering a sidewall of the first gate electrode,
- wherein the residual spacer pattern includes a material same as a material of the first gate spacer.

10. The semiconductor device of claim 9, further comprising:
- a first interlayer dielectric layer covering the sidewall of the first gate electrode,
- wherein the residual spacer pattern has a hollow cup-shaped cross section, and
- wherein a portion of the first interlayer dielectric layer fills a recess defined by the hollow cup-shaped cross section of the residual spacer pattern.

11. The semiconductor device of claim 1, wherein bottom surfaces of the first source/drain patterns are in contact with the lower separation dielectric pattern and are spaced apart from the substrate by the lower separation dielectric pattern.

12. The semiconductor device of claim 1, further comprising:
- a barrier region between the substrate and the first source/drain patterns,
- wherein the first source/drain patterns are in contact with a lateral surface of the lower separation dielectric pattern,
- wherein the first source/drain patterns are doped with first impurities of a first conductivity type with a first concentration, and
- wherein the barrier region is doped with either the first impurities with a second concentration less than the first concentration or second impurities of a second conductivity type opposite to the first conductivity type.

13. The semiconductor device of claim 1, wherein outer sidewalls of the first source/drain patterns are aligned with an upper sidewall of the lower separation dielectric pattern.

14. The semiconductor device of claim 1, further comprising: a side dielectric pattern between the first gate part and the lower separation dielectric pattern.

15. A semiconductor device, comprising:
- a substrate including a first region and a second region;
- a device isolation pattern in the substrate, the device isolation pattern defining the first region and the second region;
- a lower separation dielectric pattern on the first region of the substrate and in contact with the device isolation pattern;
- a first semiconductor pattern on the second region of the substrate and in contact with the device isolation pattern, the first semiconductor pattern including a material different from a material of the substrate;
- a plurality of first channel patterns stacked on the lower separation dielectric pattern;
- a plurality of second channel patterns stacked on the first semiconductor pattern;
- a first gate electrode on the first channel patterns, a portion of the first gate electrode being between the first channel patterns;
- a second gate electrode on the second channel patterns, a portion of the second gate electrode being between the second channel patterns;
- a plurality of first source/drain patterns on opposite sides of the first gate electrode and in contact with lateral surfaces of the first channel patterns; and
- a plurality of second source/drain patterns on opposite sides of the second gate electrode and in contact with lateral surfaces of the second channel patterns,
- wherein a bottom surface of the lower separation dielectric pattern is at a same level same as or higher than a level of a bottom surface of the device isolation pattern, and same as or lower than a level of a bottom surface of the first semiconductor pattern,
- wherein the first gate electrode includes a first gate part between the lower separation dielectric pattern and a lowermost one of the first channel patterns, and a top end of the lower separation dielectric pattern is at a level higher than a level of a bottom surface of the first gate part.

16. The semiconductor device of claim 15, wherein a lateral surface of the first gate part is rounded, and a width of the first gate part decreases in a downward direction.

17. A semiconductor device, comprising:
- a substrate including an NMOS region and a PMOS region;
- a device isolation pattern in the substrate, the device isolation pattern defining the NMOS region and the PMOS region;
- a lower separation dielectric pattern on the NMOS region of the substrate and in contact with the device isolation pattern;
- a silicon-germanium pattern on the PMOS region of the substrate and in contact with the device isolation pattern, the silicon-germanium pattern including a material different from a material of the substrate;
- a plurality of first channel patterns stacked on the lower separation dielectric pattern;
- a plurality of second channel patterns stacked on the silicon-germanium pattern;
- a first gate electrode on the first channel patterns, a portion of the first gate electrode being between the first channel patterns;
- a second gate electrode on the second channel patterns, a portion of the second gate electrode being between the second channel patterns;
- a plurality of first source/drain patterns on opposite sides of the first gate electrode and in contact with lateral surfaces of the first channel patterns; and
- a plurality of second source/drain patterns on opposite sides of the second gate electrode and in contact with lateral surfaces of the second channel patterns,
- wherein the first source/drain patterns are spaced apart from the substrate by the lower separation dielectric pattern,
- wherein the lower separation dielectric pattern includes,
  - a first dielectric part in contact with the device isolation pattern, and
  - a second dielectric part on the first dielectric part and spaced apart from the device isolation pattern, and
  - wherein a thickness of the first dielectric part is same as or greater than a thickness of the silicon-germanium pattern.

18. The semiconductor device of claim 17, further comprising:
- a residual spacer pattern between the second dielectric part and the device isolation pattern; and
- a first gate spacer covering a sidewall of the first gate electrode,
- wherein the residual spacer pattern includes a material same as a material of the first gate spacer.

* * * * *